(12) United States Patent
Bertin et al.

(10) Patent No.: US 7,394,687 B2
(45) Date of Patent: Jul. 1, 2008

(54) NON-VOLATILE-SHADOW LATCH USING A NANOTUBE SWITCH

(75) Inventors: Claude L. Bertin, South Burlington, VT (US); Frank Guo, Danville, CA (US); Thomas Ruckes, Rockport, MA (US); Steven L. Konsek, Boston, MA (US); Mitchell Meinhold, Arlington, MA (US); Max Strasburg, Gresham, OR (US); Ramesh Sivarajan, Medford, MA (US); X. M. H. Huang, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 11/280,599

(22) Filed: Nov. 15, 2005

(65) Prior Publication Data

US 2006/0250843 A1 Nov. 9, 2006

Related U.S. Application Data

(60) Provisional application No. 60/679,029, filed on May 9, 2005, provisional application No. 60/692,891, filed on Jun. 22, 2005, provisional application No. 60/692,918, filed on Jun. 22, 2005, provisional application No. 60/692,765, filed on Jun. 22, 2005.

(51) Int. Cl.
*G11C 11/34* (2006.01)
(52) U.S. Cl. .................. 365/185.08; 365/151; 365/164; 977/943
(58) Field of Classification Search ............ 365/185.07, 365/185.08, 154, 151, 164; 977/742, 932, 977/936, 937, 938, 940, 943
See application file for complete search history.

(56) References Cited

U.S. PATENT DOCUMENTS

| 3,448,302 | A | | 6/1969 | Shanefield |
| 4,809,225 | A | * | 2/1989 | Dimmler et al. ............ 365/149 |
| 4,845,533 | A | | 7/1989 | Pryor et al. |
| 4,853,893 | A | | 8/1989 | Eaton, Jr. et al. |
| 4,876,667 | A | | 10/1989 | Ross et al. |
| 4,888,630 | A | | 12/1989 | Paterson |
| 4,979,149 | A | * | 12/1990 | Popovic et al. ............... 365/244 |

(Continued)

FOREIGN PATENT DOCUMENTS

GB 2 364 933 2/2002

(Continued)

OTHER PUBLICATIONS

Ami, S., et al., "Logic gates and memory cells based on single C60 electromechanical transistors,"*Nanotechnolgy*, 2001, vol. 12, pp. 44-52.

(Continued)

*Primary Examiner*—Richard T. Elms
*Assistant Examiner*—Alexander Sofocleous
(74) *Attorney, Agent, or Firm*—Wilmer Cutler Pickering Hale and Dorr LLP

(57) ABSTRACT

A non-volatile memory cell includes a volatile storage device that stores a corresponding logic state in response to electrical stimulus; and a shadow memory device coupled to the volatile storage device. The shadow memory device receives and stores the corresponding logic state in response to electrical stimulus. The shadow memory device includes a non-volatile nanotube switch that stores the corresponding state of the shadow device.

24 Claims, 28 Drawing Sheets

U.S. PATENT DOCUMENTS

| | | | |
|---|---|---|---|
| 5,096,849 A | 3/1992 | Beilstein, Jr. et al. | |
| 5,198,994 A | 3/1993 | Natori | |
| 5,414,654 A | 5/1995 | Kubota et al. | |
| 5,434,811 A * | 7/1995 | Evans et al. | 365/145 |
| 5,682,345 A * | 10/1997 | Roohparvar et al. | 365/185.04 |
| 5,818,748 A * | 10/1998 | Bertin et al. | 365/51 |
| 5,903,010 A | 5/1999 | Flory et al. | |
| 5,986,962 A | 11/1999 | Bertin et al. | |
| 6,020,747 A | 2/2000 | Bahns et al. | |
| 6,044,008 A | 3/2000 | Choi et al. | |
| 6,097,241 A * | 8/2000 | Bertin et al. | 327/534 |
| 6,097,243 A * | 8/2000 | Bertin et al. | 327/544 |
| 6,128,214 A | 10/2000 | Kuekes et al. | |
| 6,159,620 A | 12/2000 | Heath et al. | |
| 6,198,655 B1 | 3/2001 | Heath et al. | |
| 6,256,767 B1 | 7/2001 | Kuekes et al. | |
| 6,314,019 B1 | 11/2001 | Kuekes et al. | |
| 6,345,362 B1 * | 2/2002 | Bertin et al. | 713/300 |
| 6,346,846 B1 * | 2/2002 | Bertin et al. | 327/525 |
| 6,348,700 B1 | 2/2002 | Ellenbogen et al. | |
| 6,353,552 B2 * | 3/2002 | Sample et al. | 365/154 |
| 6,373,771 B1 | 4/2002 | Fifield et al. | |
| 6,422,450 B1 | 7/2002 | Zhou et al. | |
| 6,423,583 B1 | 7/2002 | Avouris et al. | |
| 6,426,687 B1 | 7/2002 | Osborn | |
| 6,434,362 B1 | 8/2002 | Schier et al. | |
| 6,445,006 B1 | 9/2002 | Brandes et al. | |
| 6,518,156 B1 | 2/2003 | Chen et al. | |
| 6,528,020 B1 | 3/2003 | Dai et al. | |
| 6,548,841 B2 | 4/2003 | Frazier et al. | |
| 6,559,468 B1 | 5/2003 | Kuekes et al. | |
| 6,574,130 B2 * | 6/2003 | Segal et al. | 365/129 |
| 6,625,047 B2 | 9/2003 | Coleman, Jr. | |
| 6,625,740 B1 * | 9/2003 | Datar et al. | 713/324 |
| 6,636,433 B2 * | 10/2003 | Tanikawa | 365/36 |
| 6,643,165 B2 * | 11/2003 | Segal et al. | 365/151 |
| 6,658,634 B1 * | 12/2003 | Goodnow et al. | 716/6 |
| 6,661,270 B2 | 12/2003 | Nagata | |
| 6,673,424 B1 | 1/2004 | Lindsay et al. | |
| 6,706,402 B2 * | 3/2004 | Rueckes et al. | 428/408 |
| 6,707,098 B2 | 3/2004 | Hofmann et al. | |
| 6,750,471 B2 | 6/2004 | Bethune et al. | |
| 6,759,693 B2 | 7/2004 | Vogeli et al. | |
| 6,760,245 B2 | 7/2004 | Eaton, Jr. et al. | |
| 6,774,052 B2 | 8/2004 | Vogeli et al. | |
| 6,781,166 B2 | 8/2004 | Lieber et al. | |
| 6,784,028 B2 * | 8/2004 | Rueckes et al. | 438/128 |
| 6,794,914 B2 | 9/2004 | Sani et al. | |
| 6,803,840 B2 | 10/2004 | Hunt et al. | |
| 6,808,746 B1 | 10/2004 | Dai et al. | |
| 6,809,465 B2 | 10/2004 | Jin | |
| 6,835,591 B2 * | 12/2004 | Rueckes et al. | 438/99 |
| 6,836,424 B2 | 12/2004 | Segal et al. | |
| 6,862,226 B2 * | 3/2005 | Toyoda et al. | 365/154 |
| 6,899,945 B2 | 5/2005 | Smalley et al. | |
| 6,911,682 B2 * | 6/2005 | Rueckes et al. | 257/202 |
| 6,918,284 B2 | 7/2005 | Snow et al. | |
| 6,919,592 B2 * | 7/2005 | Segal et al. | 257/209 |
| 6,919,740 B2 | 7/2005 | Snider | |
| 6,921,575 B2 | 7/2005 | Horiuchi et al. | |
| 6,924,538 B2 * | 8/2005 | Jaiprakash et al. | 257/415 |
| 6,944,054 B2 | 9/2005 | Rueckes et al. | |
| 6,955,937 B1 | 10/2005 | Burke et al. | |
| 6,968,486 B2 | 11/2005 | Matsushima | |
| 6,969,651 B1 | 11/2005 | Lu et al. | |
| 6,986,962 B2 * | 1/2006 | Oyanagi et al. | 429/40 |
| 6,990,009 B2 * | 1/2006 | Bertin et al. | 365/151 |
| 7,015,500 B2 * | 3/2006 | Choi et al. | 257/40 |
| 7,054,194 B2 * | 5/2006 | Liaw et al. | 365/185.08 |
| 7,075,141 B2 | 7/2006 | Rueckes et al. | |
| 7,102,908 B2 * | 9/2006 | Thomas et al. | 365/145 |
| 7,115,901 B2 | 10/2006 | Bertin et al. | |
| 7,115,960 B2 | 10/2006 | Bertin et al. | |
| 7,161,403 B2 | 1/2007 | Bertin | |
| 7,206,217 B2 * | 4/2007 | Ohtsuka et al. | 365/154 |
| 7,245,520 B2 * | 7/2007 | Bertin et al. | 365/151 |
| 2001/0023986 A1 | 9/2001 | Mancevski | |
| 2002/0130353 A1 | 9/2002 | Lieber | |
| 2002/0163079 A1 | 11/2002 | Awano | |
| 2002/0173083 A1 | 11/2002 | Avouris et al. | |
| 2002/0175390 A1 | 11/2002 | Goldstein et al. | |
| 2003/0021141 A1 | 1/2003 | Segal et al. | |
| 2003/0021966 A1 | 1/2003 | Segal et al. | |
| 2003/0022428 A1 | 1/2003 | Segal et al. | |
| 2003/0124325 A1 | 7/2003 | Rueckes et al. | |
| 2003/0124837 A1 | 7/2003 | Rueckes et al. | |
| 2003/0132823 A1 | 7/2003 | Hyman et al. | |
| 2003/0165074 A1 | 9/2003 | Segal et al. | |
| 2003/0170930 A1 | 9/2003 | Choi et al. | |
| 2003/0177450 A1 * | 9/2003 | Nugent | 716/1 |
| 2003/0198812 A1 | 10/2003 | Rueckes et al. | |
| 2003/0199172 A1 | 10/2003 | Rueckes et al. | |
| 2003/0200521 A1 | 10/2003 | DeHon et al. | |
| 2003/0206436 A1 | 11/2003 | Eaton et al. | |
| 2003/0234407 A1 | 12/2003 | Vogeli et al. | |
| 2003/0236000 A1 | 12/2003 | Vogeli et al. | |
| 2004/0001373 A1 | 1/2004 | Liaw et al. | |
| 2004/0023514 A1 | 2/2004 | Monya et al. | |
| 2004/0075125 A1 | 4/2004 | Vogeli | |
| 2004/0075159 A1 | 4/2004 | Vogeli | |
| 2004/0077107 A1 | 4/2004 | Vogeli | |
| 2004/0085805 A1 | 5/2004 | Segal et al. | |
| 2004/0087162 A1 | 5/2004 | Vogeli | |
| 2004/0159833 A1 | 8/2004 | Rueckes et al. | |
| 2004/0164289 A1 | 8/2004 | Rueckes et al. | |
| 2004/0175856 A1 | 9/2004 | Jaiprakash et al. | |
| 2004/0181630 A1 * | 9/2004 | Jaiprakash et al. | 711/127 |
| 2004/0191978 A1 | 9/2004 | Rueckes et al. | |
| 2004/0214366 A1 | 10/2004 | Segal et al. | |
| 2004/0214367 A1 | 10/2004 | Segal et al. | |
| 2004/0238907 A1 | 12/2004 | Pinkerton et al. | |
| 2004/0266106 A1 | 12/2004 | Lee | |
| 2005/0035344 A1 | 2/2005 | Bertin et al. | |
| 2005/0035367 A1 * | 2/2005 | Bertin et al. | 257/107 |
| 2005/0035786 A1 | 2/2005 | Bertin et al. | |
| 2005/0035787 A1 | 2/2005 | Bertin et al. | |
| 2005/0036365 A1 * | 2/2005 | Bertin et al. | 365/163 |
| 2005/0037547 A1 | 2/2005 | Bertin et al. | |
| 2005/0041465 A1 | 2/2005 | Rueckes et al. | |
| 2005/0041466 A1 | 2/2005 | Rueckes et al. | |
| 2005/0047244 A1 | 3/2005 | Rueckes et al. | |
| 2005/0052894 A1 | 3/2005 | Segal et al. | |
| 2005/0053525 A1 | 3/2005 | Segal et al. | |
| 2005/0056825 A1 | 3/2005 | Bertin et al. | |
| 2005/0056866 A1 | 3/2005 | Bertin et al. | |
| 2005/0056877 A1 | 3/2005 | Rueckes et al. | |
| 2005/0058590 A1 | 3/2005 | Sen et al. | |
| 2005/0058797 A1 | 3/2005 | Sen et al. | |
| 2005/0058834 A1 | 3/2005 | Rueckes et al. | |
| 2005/0059176 A1 | 3/2005 | Rueckes et al. | |
| 2005/0059210 A1 | 3/2005 | Rueckes et al. | |
| 2005/0062035 A1 * | 3/2005 | Bertin et al. | 257/20 |
| 2005/0062062 A1 | 3/2005 | Bertin et al. | |
| 2005/0062070 A1 | 3/2005 | Bertin et al. | |
| 2005/0063210 A1 | 3/2005 | Segal et al. | |
| 2005/0063244 A1 | 3/2005 | Bertin et al. | |
| 2005/0065741 A1 | 3/2005 | Segal et al. | |
| 2005/0068128 A1 | 3/2005 | Yip | |
| 2005/0074926 A1 | 4/2005 | Bertin et al. | |
| 2005/0101112 A1 | 5/2005 | Rueckes et al. | |
| 2005/0128788 A1 | 6/2005 | Ward et al. | |
| 2005/0139902 A1 * | 6/2005 | Jung | 257/324 |
| 2005/0141266 A1 * | 6/2005 | Jung | 365/154 |
| 2005/0141272 A1 * | 6/2005 | Jung | 365/185.08 |

| | | | |
|---|---|---|---|
| 2005/0162896 A1* | 7/2005 | Jung ........................ 365/154 | |
| 2005/0174842 A1 | 8/2005 | Bertin et al. | |
| 2005/0179029 A1 | 8/2005 | Furukawa et al. | |
| 2005/0191495 A1 | 9/2005 | Rueckes et al. | |
| 2005/0237781 A1 | 10/2005 | Bertin et al. | |
| 2005/0269553 A1 | 12/2005 | Sen et al. | |
| 2005/0269554 A1 | 12/2005 | Sen et al. | |
| 2005/0270824 A1 | 12/2005 | Bertin et al. | |
| 2005/0279988 A1 | 12/2005 | Bertin | |
| 2005/0280436 A1 | 12/2005 | Bertin | |
| 2005/0281084 A1 | 12/2005 | Rueckes et al. | |
| 2005/0282515 A1 | 12/2005 | Bertin | |
| 2005/0282516 A1 | 12/2005 | Bertin | |
| 2006/0044035 A1 | 3/2006 | Bertin | |
| 2006/0054922 A1 | 3/2006 | Pettit | |
| 2006/0061389 A1 | 3/2006 | Bertin | |
| 2006/0125033 A1 | 6/2006 | Segal et al. | |
| 2006/0128049 A1 | 6/2006 | Jaiprakash et al. | |
| 2006/0183278 A1 | 8/2006 | Bertin et al. | |
| 2006/0193093 A1 | 8/2006 | Bertin et al. | |
| 2006/0204427 A1 | 9/2006 | Ghenciu et al. | |
| 2006/0231865 A1 | 10/2006 | Bertin et al. | |
| 2006/0237805 A1 | 10/2006 | Bertin et al. | |
| 2006/0250843 A1 | 11/2006 | Bertin et al. | |
| 2006/0250856 A1 | 11/2006 | Bertin et al. | |
| 2006/0255834 A1 | 11/2006 | Ward et al. | |
| 2006/0258122 A1 | 11/2006 | Whitefield et al. | |
| 2006/0264053 A1 | 11/2006 | Yates | |
| 2006/0276056 A1 | 12/2006 | Ward et al. | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2007/0015303 A1 | 1/2007 | Bertin et al. | |

FOREIGN PATENT DOCUMENTS

| | | |
|---|---|---|
| WO | WO-00/48195 | 8/2000 |
| WO | WO-01/03208 A1 | 1/2001 |
| WO | WO-01/44796 A1 | 6/2001 |
| WO | WO-03/091486 | 11/2003 |
| WO | WO-2004/065655 | 8/2004 |
| WO | WO-2004/065657 | 8/2004 |
| WO | WO-2004/065671 | 8/2004 |

OTHER PUBLICATIONS

Avouris, P., et al., "Carbon Nanotube Electronics," *Chemical Physics*, 2002, vol. 284, pp. 429-445.
Bachtold, A. et al., "Logic Circuits with Carbon Nanotube Transistors", *Science*, Nov. 9, 2001, vol. 294, pp. 1317-1320.
Bakoglu, Circuits Interconnections and Packaging for VLSI, Addison-Weslely Publishing Company, Inc., pp. 152, 412-416, 1990.
Bakoglu, Chapter 8, "Clocking of High-Speed Systems", Circuits Interconnections and Packaging for VLSI, Addison-Wesley Publishing Company, Inc., pp. 338-355, 1990.
Bardel, et al, "Built-In Test for VLSI: Pseudorandum Techniques", John Wiley & Sons, New York, NY 1987, pp. 38-43.
Batchtold, A., et al., "Logic circuits cased on carbon nanotubes," *Physica E*, 2003, vol. 16, pp. 42-46.
Bernholc et al., "Mechanical and electrical properties of nanotubes", *Ann. Rev. Mater. Res.*, vol. 32, p. 347, 2002.
Bradley, K. et al., "Flexible Nanotube Electronics", *Nano Letters*, vol. 3, No. 10, pp. 1353-1355. 2003.
Collier, C.P., et al., "Electronically Confiurable Molecular-Based Logic Gates," *Science*, Jul. 16, 1999, vol. 285, pp. 391-394.
Dally, Bill, Low-Powered Architecture, Standford University, Stream Processors, Inc., 2002.
Dally, William J., Computer Architecture is all about interconect, HPCA Panel, pp. 1-11, Feb. 4, 2002.
Dehon, A., "Array-Based Architecture for FET-Based, Nanoscale Electronics," *IEEE Transactinos on Nanotechnology*, 2003, vol. 2, No. 1, pp. 23-32.

Dequesnes, M. et al., "Calculation of pull-in voltages for carbon-nanotube-based nanoelectromechanical switches," *Nanotechnology*, Jan. 22, 2002, vol. 13, pp. 383-386.
Dequesnes, M. et al., "Simulation of carbon nanotube-based nanoelectromechanical switches", *Computational Nanoscience and Nanotechnology*, 2002, ISBN 0-9708275-6-3, pp. 383-386.
Derycke, V., et al., "Carbon Nanotube Inter- and Intramolecular Logic Gates," *Nano Letters*, Sep. 2001, vol. 1, No. 9, pp. 453-456.
Franklin, N.R., et al., "Integration of suspended carbon nanotube arrays into electronic devices and electromechanical systems," *Appl. Phys. Lett.*, Jul. 29, 2002, vol. 81, No. 5, pp. 913-915.
Fuhrer, M.S., et al., "High-Mobility Nanotube Transistor Memory," *Nano Letters*, 2002, vol. 2, No. 7, pp. 755-759.
Fujiwara, "Logic Design and Design for Testability", MIT Press, Cambridge, Massachusetts, 1985, pp. 238, 256-259.
Hoenlein, W., et al., "Carbon nanotubes for microelectronics: status and future prospects," *Materials Science Engineering*, 2003, vol. 23, pp. 663-669.
Huang, Y., et al., "Logic Gates and Computation from Assembled Nanowire Building Blocks," *Science*, Nov. 9, 2001, vol. 294, pp. 1313-1316.
Javey, A., et al., "Carbon Nanotube Transistor Arrays for Multistage Complementary Logic and Ring Oscillators," *Nano Letters*, 2002, vol. 2, No. 9, pp. 929-932.
Johnson, R. Colin, "IBM fellow unrolls blueprint for nano", *EETimes*, Mar. 6, 2006, 3 pages, http://www.eetimes.com/showArticle.jhtml?articleID=181500304.
Kinaret, J. M. et al,, "A Carbon-nanotube-based nanorelay," *Applied Physics Letters*, Feb. 24, 2003, vol. 82, No. 8, pp. 1287-1289.
Lin, Y. M., et al, "Ambipolar-to-Unipolar Conversion of Carbon Nanotube Transistors by Gate Structure Engineering," *Nano Lett.*, 2004, vol. 4, No. 5, pp. 947-950.
Martel, R., et al, "Carbon Nanotube Field-Effect Transistors and Logic Circuits," *DAC 2002*, Jun. 10-12, 2002, vol. 7.4, pp. 94-98.
Onoa et al., "Bulk Production of singly dispersed carbon nanotubes with prescribed lengths", *Nanotechnology*, vol. 16, pp. 2799-2803, 2005.
Rueckes, T., et al., "Carbon Nantotube-Based Nonvolatile Random Access Memory for Molecular Computing," *Science*, Jul. 7, 2000, vol. 289, pp. 94-97.
Srivastava, et al, "A Comparative Scaling Analysis of Metallic and Carbon Nanotubes Interconnections for Nanometer Scale VLSI Technologies," *Proceedings of the 21st International VLSI Multilevel Interconnect Conference (VMIC)*, Sep. 29-Oct. 3, 2004, pp. 393-398.
Stadermann, M. et al., "Nanoscale study of conduction through carbon nanotube networks", *Phys. Rev. B 69*, 201402(R), 2004.
Tans, S.J., et al, "Room-temperature transistor based on a single carbon nanotube", *Nature*, May 1998, vol. 393, pp. 49-52.
Wang, D., "Revisiting the FO4 Metric," Real World Technologies, copyright 1996-2001, Updated Aug. 15, 2002, 9 pages.
Zhan, W. et al., "Microelectrochemical Logic Circuits", *J. Am. Chem. Soc.*, Jun. 12, 2003, vol. 125, pp. 9934-9935.
Peigney, A. et al., J. Phys. Chem. B.,vol. 105 (2001) pp. 9699-9710.
United States Patent and Trademark Office, International Search Report of PCT/US06/017853 mailed Feb. 26, 2007, pp. 1-4.
United States Patent and Trademark Office, International Search Report of PCT/US06/018043 mailed Mar. 7, 2007, pp. 1-3.
Wolf & Tauber, "Silicon Processing for the VLSI ERA", vol. 1, Lattice Press, Sunset Beach (1986), Chapters 15-16.
U.S. Appl. No. 11/835,583, filed Aug. 8, 2007, Bertin.
U.S. Appl. No. 11/835,613, filed Aug. 8, 2007, Bertin.
U.S. Appl. No. 11/835,651, filed Aug. 8, 2007, Bertin.
U.S. Appl. No. 11/280,786, filed Nov. 15, 2005, Bertin.
Chen, J. et al., "Self-aligned carbon nanotube transistors with charge transfer doping" *Applied Physics Letters*, vol. 86, pp. 123108-1-123108-3, 2005.
Chen, J. et al., "Self-aligned Carbon Nanotube Transistors with Novel Chemical Doping", *IEDM*, pp. 29.4.1-29.4.4, 2004.
Collins, P. G. et al., "Engineering Carbon Nanotubes and Nanotube Circuits Using Electrical Breakdown", *Science*, vol. 292, pp. 706-709, Apr. 27, 2001.

Derycke, V. et al., "Controlling doping and carrier injection in carbon nanotube transistors", *Applied Physics Letters*, vol. 80, No. 15, pp. 2773-2775, Apr. 15, 2002.

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistsors", *Physical Review Letters*, vol. 89, No. 10, pp. 16801-1-106801-4, 2002.

Hone, J., "Phonons and Thermal Properties of Carbon Nanotubes", *Carbon Nanotubes, Topics Appl. Phys.*, vol. 80, pp. 273-286, 2001.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", *Nature Materials*, vol. 1, pp. 241-246, Dec. 2002.

Kong, J. et al., "Quantum Interference and Ballistic Transmission in Nanotube Electron Waveguides", *The American Physical Society*, vol. 87, No. 10, pp. 106801-1-106801-4, Sep. 3, 2001.

Lin, Y.M. et al., "Novel Carbon Nanotube FET Design with Tunable Polarity", *IEDM*, pp. 29.2.1-29.2.4, 2004.

Radosavljevic, M. et al., "Nonvolatile Molecular Memory Elements Based on Ambipolar Nanotube Field Effect Transistors", *Nano Letters*, vol. 2, No.7, pp. 761-764, 2002.

Wind, S. J. et al., "Fabrication and Electrical Characterization of Top Gate Single-Wall Carbon Nanotube Field-Effect Transistors", 14 pages, Journal of Vacuum Science & Technology B: Microelectronics and Nanometer Structures, vol. 20, Issue 6, pp. 2798-2801. Nov. 2002.

Wind, S. J. et al., "Vertical scaling of carbon nanotube field-effect transistors using top gate electrodes", *Applied Physics Letters*, vol. 80, No. 20, pp. 3817-3819, May 20, 2002.

* cited by examiner

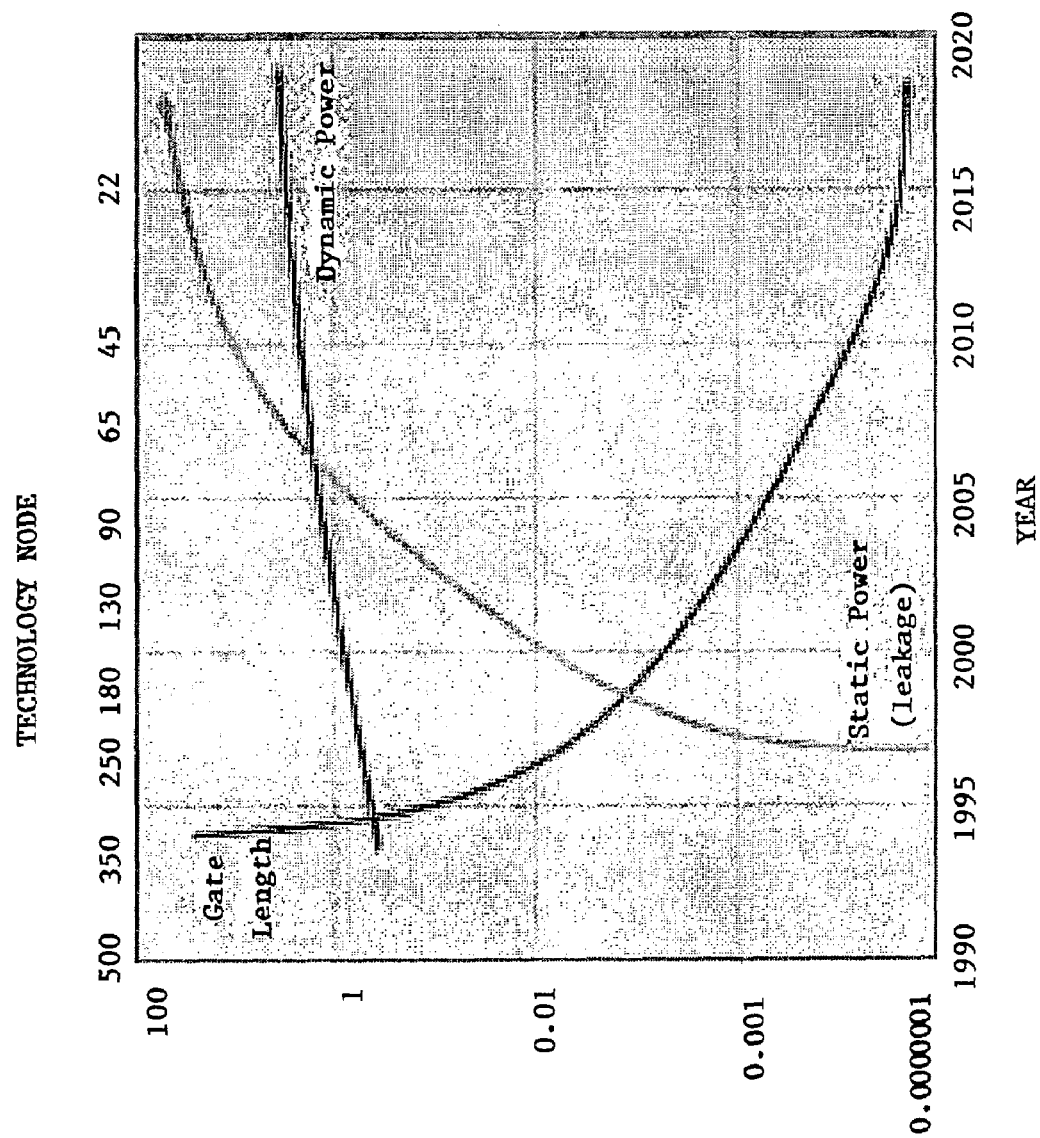
Figure 1: PRIOR ART

Processors Today are Inefficient

| Processor (90nm) | Energy/Operation (pJ) (32-bit Op) |
|---|---|
| ASIC | 2 |
| DSP | 60 |
| RISC | 200 |
| PC/Workstation | 2,000 |

Figure 2: PRIOR ART

| Operation | Energy (0.13 um) |
|---|---|
| 32 Bit ALU Operation | 5 pJ |
| 32 Bit Register Read | 10 pJ |
| Read 32 Bits from 8KB RAM | 50 pJ |
| Transfer 32 Bits Across Chip (10 mm) | 100 pJ |
| OCD Transfer 32 Bits Off Chip | 1.9 pJ |

Figure 3: PRIOR ART

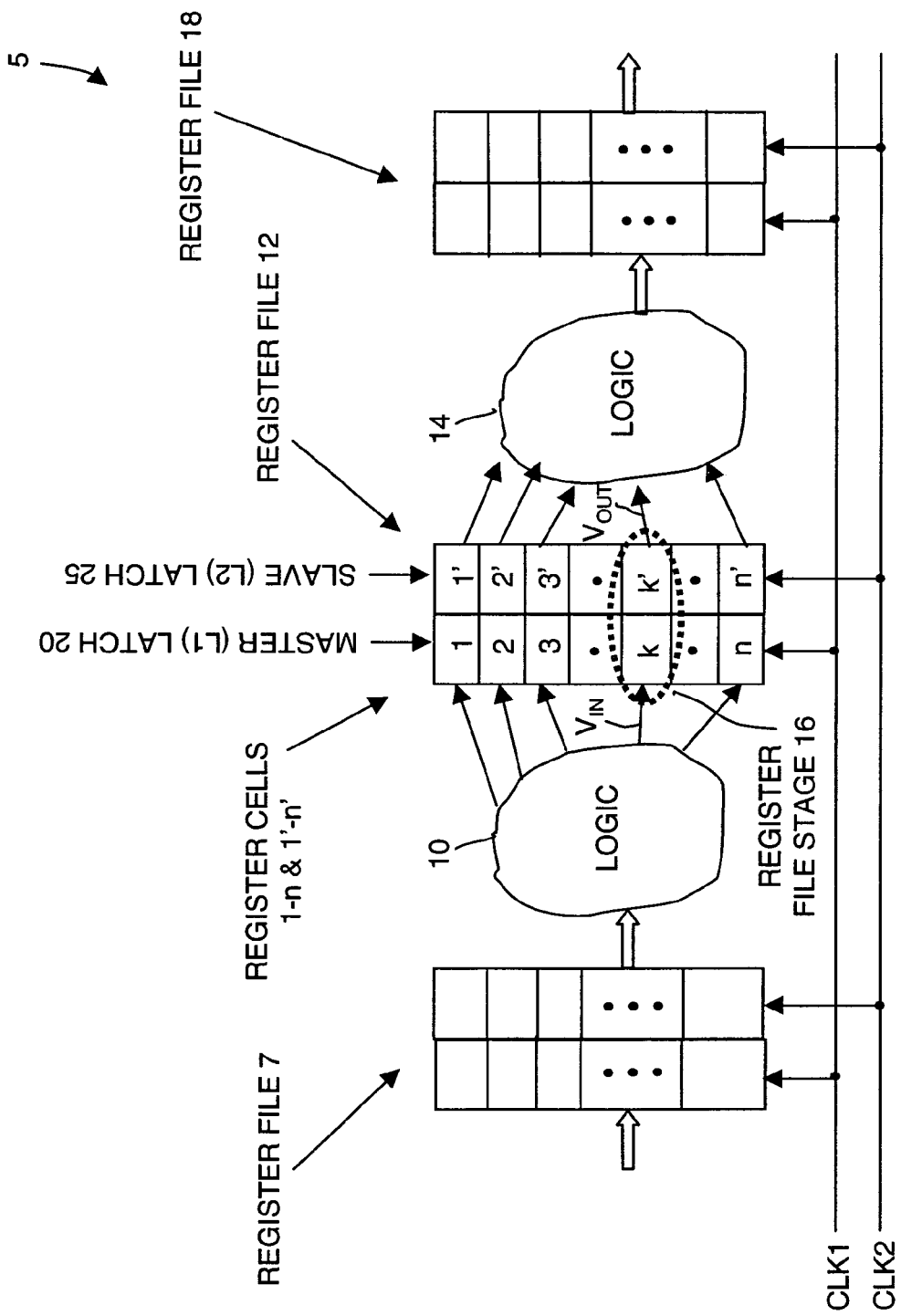
Figure 4A: PRIOR ART

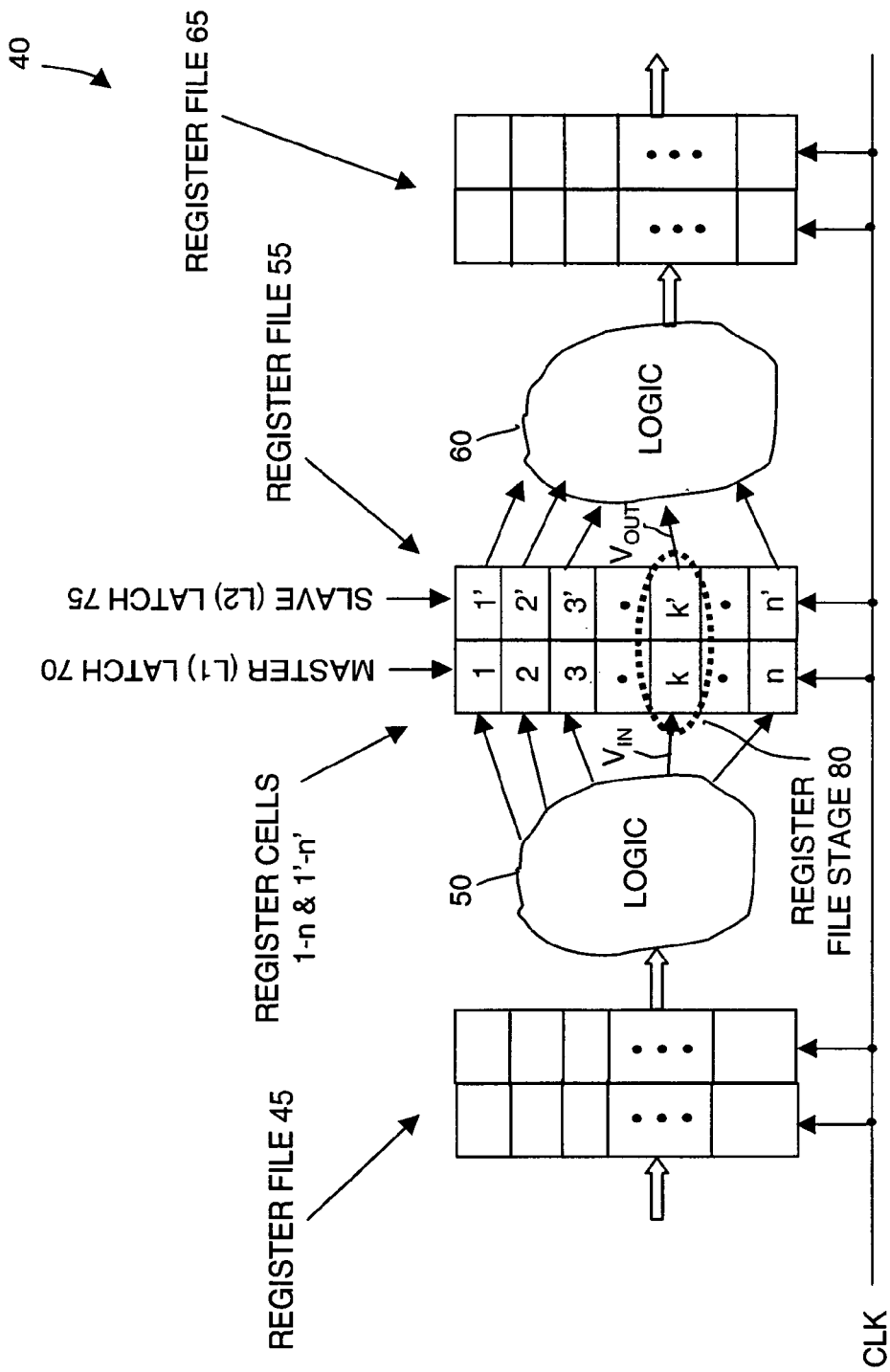
Figure 4B: PRIOR ART

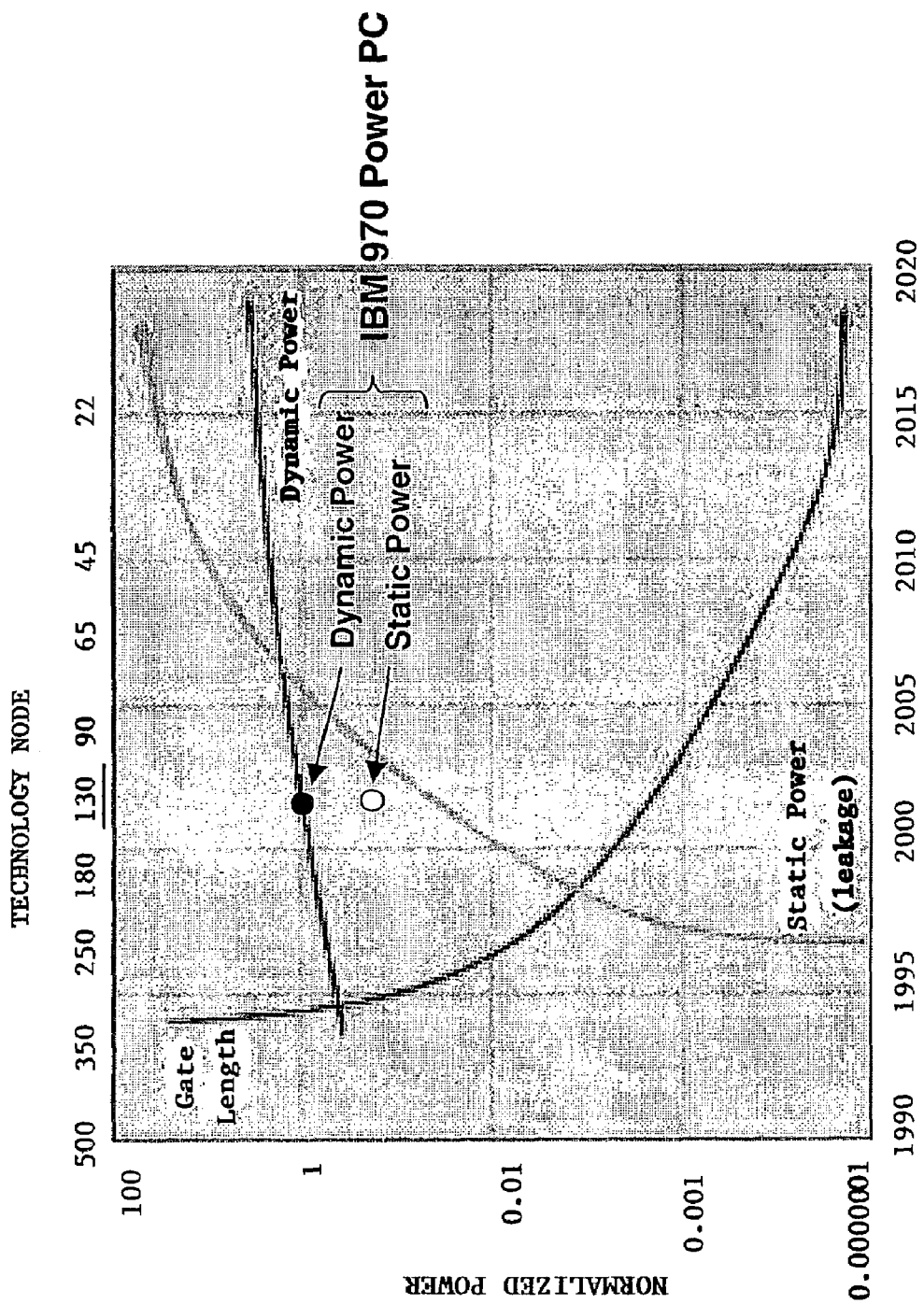
Figure 5: PRIOR ART

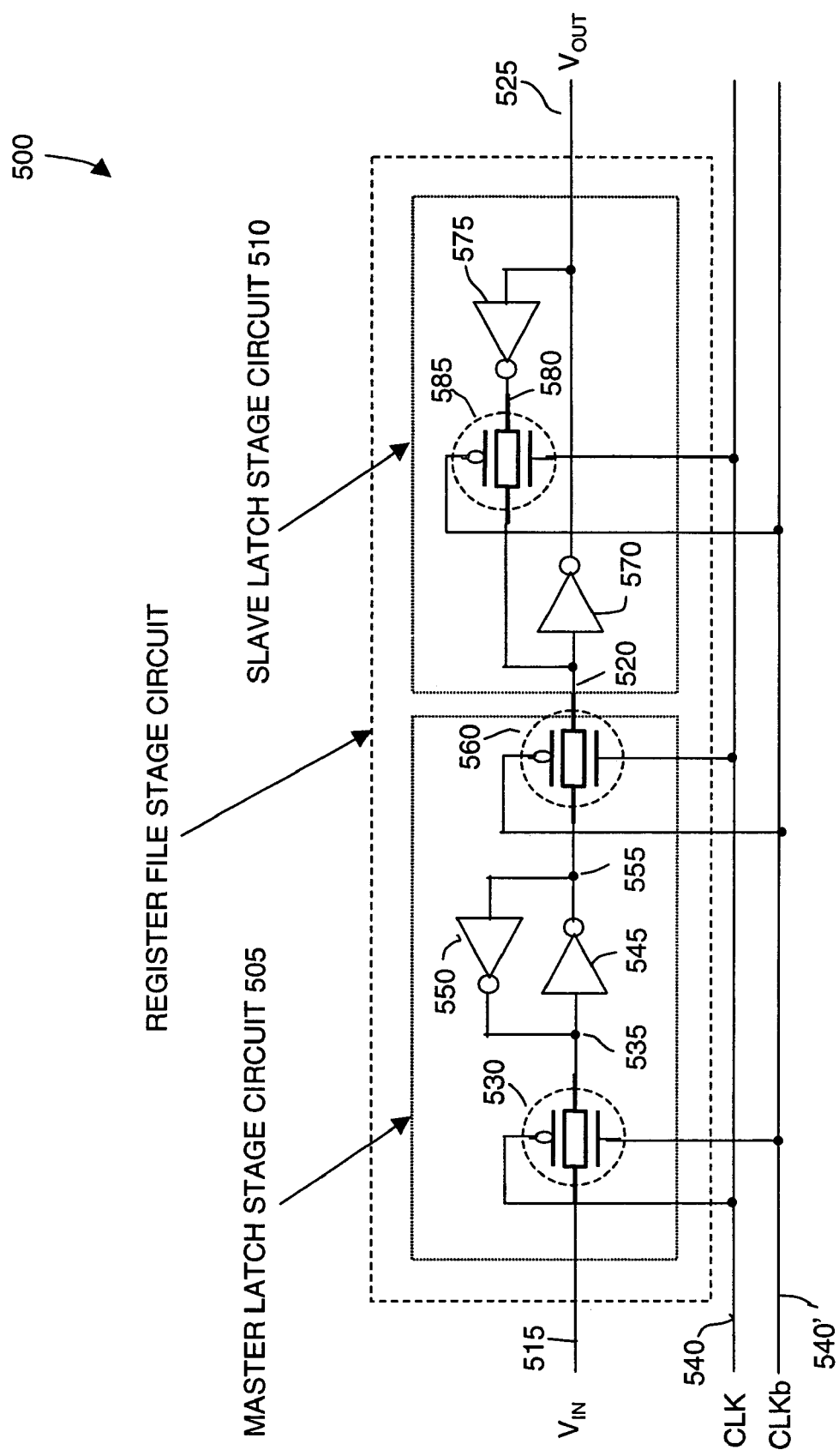
Figure 6: PRIOR ART

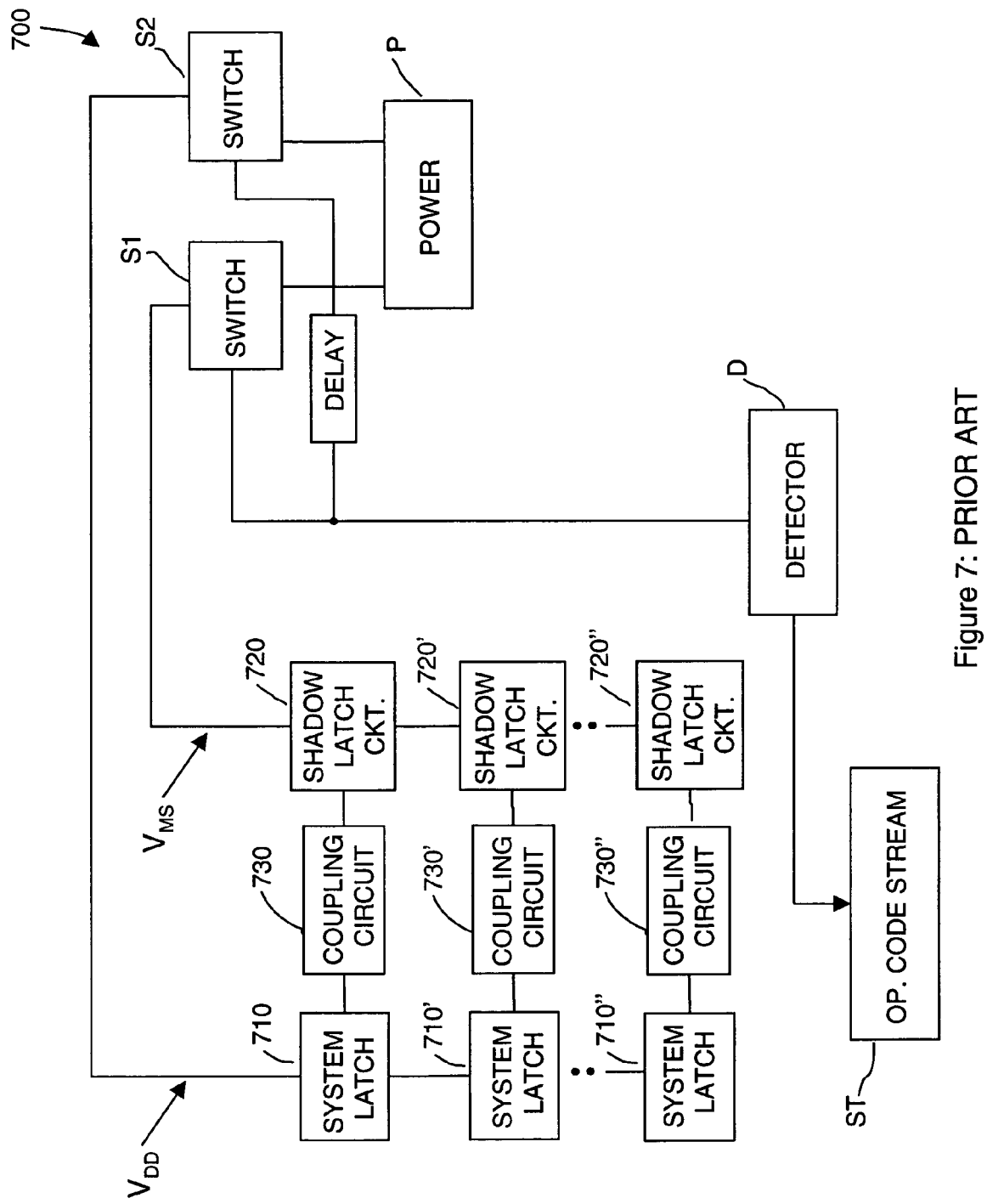
Figure 7: PRIOR ART

NON-VOLATILE-SHADOW LATCH USING A NANOTUBE SWITCH

CROSS-REFERENCE TO RELATED APPLICATIONS

This application claims priority under 35 U.S.C. § 119(e) to the following applications, the contents of which are incorporated herein in their entirety by reference:

U.S. Provisional Patent Application No. 60/679,029, filed on May 9, 2005, entitled Reversible Nanoswitch;

U.S. Provisional Patent Application No. 60/692,891, filed on Jun. 22, 2005, entitled Reversible Nanoswitch;

U.S. Provisional Patent Application No. 60/692,918, filed on Jun. 22, 2005, entitled NRAM Nonsuspended Reversible Nanoswitch Nanotube Array; and U.S. Provisional Patent Application No. 60/692,765, filed on Jun. 22, 2005, entitled Embedded CNT Switch Applications For Logic.

This application is related to the following applications, the contents of which are incorporated herein in their entirety by reference:

U.S. patent application Ser. No. 11/280,786, filed on Nov. 15, 2005, entitled Two-Terminal Nanotube Devices And Systems And Methods Of Making Same; and U.S. patent application Ser. No. 11/274,967, filed on Nov. 15, 2005, entitled Memory Arrays Using Nanotube Articles With Reprogrammable Resistance.

This application is also related to U.S. patent application Ser. No. 11/032,983, filed on Jan. 10, 2005, entitled Storage Elements Using Nanotube Switching Elements; and U.S. patent application Ser. No. 11/231,213, filed on Sep. 20, 2005, entitled Random Access Memory Including Nanotube Switching Elements.

BACKGROUND

1. Technical Field

The present application is generally related to the field of latches for storing logic states and, more specifically, to non-volatile shadow latches that use two-terminal nanotube switches.

2. Discussion of Related Art

Volatile circuits have been and continue to be the norm in digital circuits. In the initial development phase, bipolar circuits were universally used for analog and digital circuits. Denser and more easily integrated but slower FET-based circuits soon followed, and were introduced for low cost and low power applications such as calculators, for example, while bipolar circuits were used for high speed applications. In order to eliminate static power dissipation present with bipolar, NMOS-only, or PMOS only chips, circuits based on complementary CMOS (combined NMOS and PMOS) devices were introduced and static power dissipation was virtually eliminated because power dissipation occurred only when circuits were switching. FET device scaling was introduced and used successfully to approximately double the number of circuits every two years, while increasing device and circuit performance, all at lower on-chip voltages to contain power dissipation to acceptable levels.

As the number of circuits grew into the millions, bipolar power dissipation became so high that CMOS was used to replace bipolar circuits, and CMOS became the technology of choice for the semiconductor industry for logic, memory, and analog products. Because of a common CMOS technology platform for a wide variety of electronic functions (memory, digital and analog circuits), system-on-chip (SoC) integrating hundreds of millions of circuits and billions of bits became possible. Migration to new denser technology generations enables more function per chip and is done for economic as well as performance reasons. New generations of technology (new technology nodes) result in transistor density improvements with increased current drive of device width and denser interconnect wiring. However, for sub-150 nm technologies, device threshold voltage scaling is increasingly difficult, resulting in high FET device OFF-state leakage currents and correspondingly high static power dissipation. Using conventional dimensional and voltage scaling is no longer sufficient for fast dense chips, SoCs for example, so that power dissipation is setting limits on the combination of speed and function per chip. At the 90 nm technology node, 25 to 50% of the total power (dynamic and static power) is due to leakage current-induced static power dissipation. Projections show that for products at the 65 nm technology node, static power dissipation will exceed dynamic (operating) power dissipation. New generations of technology are limited by power dissipation, especially static power dissipation due to poor scaling and associated high device OFF-state leakage currents. Because many applications such as PCs, cell phones, games, and others are portable and require battery operation, controlling power dissipation while enabling high speed operation is a requirement. Since power dissipation is setting limits on the combination of logic circuit size and operating speed, new chip architecture and circuit design solutions are needed in order to enable continued increases in high performance function.

One approach to power reduction by architecture and design described in U.S. Pat. No. 6,097,243, to Bertin et al., suggests an adjusting mechanism for reducing clock speeds when circuits have been inactive for a predetermined period of time to reduce dynamic power. Static power is also reduced by adjusting source-to-body voltage to increase threshold voltage and reduce associated leakage current. While this approach can reduce power dissipation for some circuits, both dynamic and static power dissipation still remains relatively high. Actually, threshold voltage modulation to reduce power dissipation may only be used in bulk CMOS technologies where body-regions can be modulated. SOI CMOS technology with isolated individual device body-regions cannot be modulated as described in U.S. Pat. No. 6,097,243.

In a related approach to power reduction by architecture and design described in Bertin et al. U.S. Pat. No. 6,097,241, where activity detection circuits monitor input circuit activity at the first logic stage and increase the speed of circuits in subsequent stages in order to enable high speed operation. Modulating device threshold voltage is required as well, with the associated limitations described further above with respect to U.S. Pat. No. 6,097,243.

In still another related approach to power reduction by architecture and design is described in U.S. Pat. No. 6,345,362, to Bertin et al., where plural on-chip functional units at different power levels are matched to instructions requiring various speeds using an on-chip control processor unit and on-chip power management unit to optimize chip power performance. Operating power and associated speed of each functional unit is adjusted by threshold voltage variation with the associated limitations as described further above with respect to U.S. Pat. No. 6,097,243.

A different approach to power reduction by architecture and design is described in U.S. Pat. No. 6,625,740, to Datar et al., where instructions are examined and code is rearranged such that circuits not required for a group of instructions are turned OFF. Circuit groups are turned ON as needed to process various instructions. In the example given, circuits are assumed to require 10 clock cycles to be in the OFF state, and 10 cycles to be restored to the full power state. Both dynamic and static power are reduced in those circuits where power is turned off, however, data is not retained in registers during power OFF and will be lost unless transferred to memory at power-off and transferred back at power-on.

A still different approach to power reduction by architecture and design is described in U.S. Pat. No. 6,658,634, to Goodnow et al., where logic is designed to ensure critical logic nets contain associated registers, and logic synthesis software is used to ensure that the clock can be selectively stopped and last data retained in registers in logic stages that are not required for particular sequences of instructions. While this method reduces dynamic power dissipation, static power dissipation remains high due to leakage currents.

In U.S. Pat. No. 5,986,962, to Bertin et al., power reduction is achieved by architecture and design such that each register (latch) has a corresponding shadow register (latch) designed (optimized) for low power retention (low leakage current CMOS devices). The state of the system is transferred to the shadow latches upon a transition to a low power mode, and power is removed from logic circuits in portions of the chip, or the entire chip. The logic state is restored to each register when power is restored. While this method significantly reduces both dynamic and static power, and in fact eliminates all power dissipation except for the low power shadow registers if the entire chip is turned OFF, the shadow registers introduce significant problems of their own. First, low power dissipation registers (latches) are sensitive to alpha particles and data integrity is an issue. Radiation hardening techniques could be applied to the latches, but some technology changes may be required. Second, static power is still dissipated in the low power shadow latches. Also, adding a low power shadow latch for each high performance latch significantly increases chip area which impacts chip design and reduces the number of chips per wafer, which in turn increases chip cost.

Highly integrated products with a wide variety of circuit functions such as high logic and memory content, system-on-chip (SoC) architecture for example, are an important part of current semiconductor industry design practices. Highly integrated product designs using bulk or SOI CMOS technologies are especially important for portable battery-operated systems that require a high level of integration and the mixed data and signal processing that SoC devices offer. Product requirements, especially in consumer applications, are subject to change as the design progresses. As a result, designs often utilize a combination of disparate elements including embedded, programmable logic functions such as general purpose (usually RISC architecture) embedded microprocessor cores, embedded DSPs, embedded ASIC designs (eASIC), embedded FPGAs, embedded memory, and other functions. Time-to-market with the desired product functions is vital to product success, so that typically there is insufficient time to optimize function for maximum performance at minimum total power dissipation using a more customized approach such as an optimized ASIC design, for example. Instead, designs must include programmable logic functions that dissipate more power than optimized designs in order to allow for flexibility in modifying product function near the end of the design cycle, and servicing multiple applications for economic reasons.

Migration to new denser technology generations enables more function per chip and is done for economic as well as performance reasons. New generations of technology (new technology nodes) result in transistor density improvements with increased current drive of device width and denser interconnect wiring. However, for sub-150 nm technologies, device threshold voltage scaling is increasingly difficult, resulting in high FET device OFF-state leakage currents and correspondingly high static power dissipation.

FIG. 1 shows normalized power dissipation as a function of technology node (and corresponding year). The source of FIG. 1 is the IEEE Computer Society, December 2003. Technology nodes are presented in terms of minimum feature size and associated gate length. Static power grows exponentially as dimensions shrink, while dynamic (switching) power grows at a modest rate. At the 90 nm technology node, 25 to 50% of the total power (dynamic and static power) is due to leakage current-induced static power dissipation. Projections show that for products at the 65 nm technology node, static power dissipation may exceed dynamic (operating) power dissipation. New generations of technology are limited by power dissipation, especially static power dissipation due to poor scaling and resulting high device OFF-state leakage currents. Using conventional dimensional and voltage scaling is no longer sufficient for fast dense chips, SoCs for example, so that power dissipation is setting limits on the combination of speed and function per chip. Because many applications such as PCs, cell phones, games, and others are portable and require battery operation, controlling power dissipation through chip architecture and circuit design is a requirement. However, even in non-portable applications such as workstations and servers, power dissipation limitations caused by poor CMOS technology scaling is limiting operating speeds and requiring power management architectures.

In order to successfully incorporate power management in highly integrated product designs, it is important to understand circuit design efficiency with respect to power dissipation. FIG. 2 shows the energy (pico-Joules) per operation required to implement a 32-bit operation for various logic design approaches. Programmable logic, the most flexible and versatile, is the least power efficient, requiring 2,000 pJ for a PC/Workstation, and 200 pJ for a RISC architecture microprocessor. By contrast, ASIC, the least flexible design approach is the most power effective dissipating only 2 pJ for the same logic function. DSPs are also quite efficient at 60 pJ because they are typically used as an accelerating digital signal processing function to perform specific digital signal processing tasks. The source of FIG. 2 is from a presentation by Bill Dally entitled, "Low-Power Architecture."

The energy required for various operations is dominated by bandwidth. FIG. 3 illustrates the energy required for register, ALU, and OCD 32-bit operations as well as reading from memory and transferring 32 bits across a chip (100 pJ). The relatively high energy (100 pJ) associated with driving long distance (10 mm) on chip interconnections is a consequence of wiring non-scalability and increasing chip size. The source of FIG. 3 is Bill Dally, International Symposium on High-Performance Computer Architecture, 2002.

If present single processor chip architectures and design methodologies were left unchanged, then power dissipation and latency associated with on-chip interconnection of logic and memory functions would become a dominant factor resulting in power-limited chip performance. Actually, chip architecture has responded and multiple, simple processors, distributed register files, explicit managed local memory, enhanced floor planning for more optimum placement, and other innovations have prevented on-chip interconnections to become a dominant power/performance limiting factor.

With these new evolving chip architectures and design methodologies, limitations to chip performance are primarily due to embedded logic and memory functions as has always been the case. However, these embedded circuits are increasingly difficult to scale as described further above, and static power dissipation is beginning to set performance on chip operation.

Static power in CMOS circuits is present even when no switching takes place. It is due to leakage current that flows because of poorly scaled device threshold voltages and operating voltages. Static power is reduced only by reducing voltages, preferably reducing the voltages in temporarily unused circuits to zero (selectively removing applied voltages from these circuits).

High speed chip design often uses logic design techniques referred to as concurrent operation. These techniques are pipelining and parallelism, in which logic function is divided into smaller pieces (sub blocks), called stages, such that the rate at which instructions are executed improves because many operations are executed at the same time. Concurrent logic design techniques are described in more detail in the following references: H. B. Bakoglu, "Circuits, Interconnections, and Packaging for VLSI", Addison-Wesley Publishing Company, Inc, 1990, pp. 412-416; and David T. Wang, "Revisiting the FO4 Metric."

An important aspect of concurrent logic operations is that the start of an instruction does not wait for previous ones to be completed. In this way, all portions of the hardware are utilized every cycle, making best use of available logic and increasing machine throughput. Dependencies between instructions prevent logic performance from achieving maximum possible performance; however instruction optimization is used to achieve faster performance using, for example, the pipelining technique.

The pipelining technique, for example, uses random logic blocks divided (separated) by registers (also referred to as register files, register banks, pipeline latches, or latches) that result in a substantially higher speed of operation; that is, pipelining used to improve the execution rate. Logic is divided into roughly equal smaller pieces, called stages, and a bank of registers (latches) is inserted to hold temporary values (logic states) at the interface of the logic stages. The logic clock frequency may then be increased to a level that is proportional to the inverse of the sum of the longest delay of the logic stages plus the latch delay overhead. Examples of logic stages, registers (single-latch and double-latch designs), and clocking are given in the H. B. Bakoglu reference book described further above, pp. 338-349. Examples of register (latch) design are given in the H. B. Bakoglu reference book, pp. 349-355. Designs are increasing the number of registers and decreasing the logic stage delay. By way of example, the number of registers (latches) used in the IBM 750 power PC chip is about 10,000 registers. The next generation power PC design, the IBM 970, uses about 300,000 registers.

Design Using Volatile Registers (Latches)

Power dissipation is an important consideration because it often sets the maximum performance limit of the logic function as discussed further above with respect to FIGS. 1-3. Presently, logic states are temporarily stored in volatile register latches. However, introducing nonvolatile registers having a dedicated nanotube device per register enables logic states to be saved with no applied voltage, that is zero power dissipation in portions (or all) of the integrated circuit in order to reduce power dissipation, enabling other logic blocks to consume more power and run faster as needed, and other advantages discussed further below.

In addition to the performance benefits of dividing random logic into smaller blocks, there is a testing benefit as well. Logic testing requires that each logic node be switched to both "ONE" and "ZERO" logic states. Chips with a large number of gates, tens and hundreds of millions, for example, cannot be tested efficiently unless the logic is subdivided into smaller stages (blocks). Smaller logic stages separated by latches enable logic testability to reach 98 to 99%, for example. The registers described herein may also be interconnected serially for test purposes. Logic test patterns (test vectors) are applied, and logic response is measured in order to identify and eliminate defective chips as is well known in the industry. The following references discuss design for logic testability: H Fujiwara, "Logic Design and Design for Testability", Cambridge, Mass., the MIT press, 1985, pp. 238, 256-259; and P. H. Bardel, W. H. McAnney, and J. Savir, "Built-In Test for VLSI: Pseudorandom Techniques", New York, N.Y., John Wiley & Sons, 1987, pp.38-43.

A number of different register file circuit designs are possible (see Bakoglu above). For example, a clocked synchronous register file stage circuit design may use a master latch stage circuit and a slave latch stage circuit with two non-overlapping clocks such as CLK1 and CLK2 illustrated in FIG. 4A. Alternatively, a clocked synchronous register file stage circuit design may use a master latch stage circuit and a slave latch stage circuit with a single clock such as CLK (and its complement CLKb) as illustrated in FIG. 4B and described further below.

FIG. 4A illustrates prior art pipelined synchronous logic function 5 using two nonoverlapping clocks CLK1 and CLK2, including logic stages 10 and 14 (and others not shown) separated by registers 7, 12, 18 (and other registers not shown) designed for state-of-the-art high speed operation. Exemplary register 12 is composed of a master (L1) latch 20 and a slave (L2) latch 25. Master (L1) latch 20 is composed of register cells 1-n and slave (L2) latch 25 is composed of cells 1'-n'. A register stage is composed a corresponding pair of register cells, such as register stage 16 composed of corresponding register cells k and k'. It is important to note that logic stages 10 and 14 may be composed of random logic stages, for example, or may be an onboard cache such as a high speed Sync SRAM L1 cache, for example. A master (L1) latch such as master (L1) latch 20 accepts data from preceding logic stage 10 when activated by clock CLK1, captures and holds the input data. A slave (L2) latch such as slave (L2) latch 25 accepts information from a corresponding master (L1) latch 20 when activated by clock CLK2, transmits the information to the next logic stage 14, and then latches the information near the end of the CLK2 clock cycle.

FIG. 4B illustrates prior art pipelined synchronous logic function 40 using a single clock CLK, including logic stages 50 and 60 (and others not shown) separated by registers 45, 55, 65 (and other registers not shown) designed for state-of-the-art high speed operation. Exemplary register 55 is composed of a master (L1) latch 70 and a slave (L2) latch 75. Master (L1) latch 70 is composed of register cells 1-n and slave (L2) latch 75 is composed of cells 1'-n'. A register stage is composed a corresponding pair of register cells, such as register stage 80 composed of corresponding register cells k and k'. It is important to note that logic stages 50 and 60 may be composed of random logic stages, for example, or may be an onboard cache such as a high speed Sync SRAM L1 cache, for example. A master (L1) latch such as master (L1) latch 70 accepts data from preceding logic stage 50 during the first half of the clock CLK cycle time, captures and holds the input data, and also transfers the data to the slave (L2) latch at the beginning of the second half of the clock cycle. A slave (L2) latch such as slave (L2) latch 75 accepts information from a corresponding master (L1) latch 70 at the beginning of the second half of the clock CLK cycle time, transmits the data to the next logic stage 60, and then latches the data near the end of the second half of the clock CLK cycle time.

The electrical characteristics of state of the art PC chips, e.g. the IBM 970 power PC chip used in Apple computers and SONY Playstations, illustrate the relationship between operating speed and dynamic and static power dissipation in high speed synchronized logic chips using two non overlapping clocks design. The IBM 970 chip operates at 1.3 volts, is designed at the 130 nm technology node using an SOI CMOS technology with copper wiring, and includes an on-board L1 Sync SRAM cache of 1 megabit, an on-board L2 Sync SRAM cache of 4 megabits, and a double-latch design with non-overlapping clocks CLK1 and CLK2 (similar in approach to synchronous logic function 5 of FIG. 4A) operating at approximately 3 GHz clock frequency.

In operation, at a clock periodicity of approximately 340 ps, a master latch has approximately 170 ps to accept data from a preceding logic stage, capture (latch) the data, and have the data ready for the slave latch. A slave latch has approximately 170 ps to accept data from a corresponding master latch, transmit the information to the next logic stage, and then latch the information.

The IBM 970 chip has a dynamic (active) power dissipation of approximately 90 watts and static (standby) power dissipation due to device leakage of 25 watts; static power is approximately 28% of the active power dissipation. FIG. 5 illustrates prior art IBM 970 power PC relative dynamic (active) and static (standby) power plotted at the 130 nm technology node point on prior art FIG. 1 which illustrates projected relative dynamic and static power based on CMOS device scaling that includes the increasing impact of device leakage current on static power due to less-than-ideal threshold voltage and corresponding power supply scaling. The state-of-the-art IBM 970 power PC chip relative power dissipation values indicate that the static power problem is at least as significant as indicated in FIGS. 1 and 5, and that as more advanced technology nodes are developed, the static power dissipation may become dominant unless architecture and circuit design means are used to prevent it.

FIG. 6 illustrates prior art register file stage circuit 500 which corresponds to register stage 80 illustrated in FIG. 4B. A description of register file design and operation may found in the reference H. B. Bakoglu, "Circuits, Interconnections, and Packaging for VLSI", Addison-Wesley Publishing Company, Inc, 1990, pp. 349-356. Prior art register file stage circuit 500 includes a master latch stage circuit 505 and a slave latch stage circuit 510, all operating in synchronous (clocked) mode and all are volatile. That is, stored data is lost if power is lost or removed. Master latch stage circuit 505 has input node 515 and output node 520. Slave latch stage circuit 510 has input node 520, which is also the output node of master latch stage circuit 505, and output node 525. Node 520 is also a storage node of slave latch stage circuit 510.

Input node 515 of master latch stage circuit 505 receives input signal $V_{IN}$ and drives CMOS transfer gate 530, which is connected to node 535, and drives a first storage node 535 formed by cross coupled CMOS inverters 545 and 550. Input signal $V_{IN}$ corresponds to $V_{IN}$ from logic 50 in FIG. 4B. CMOS transfer gate 530 uses both NMOS and PMOS devices instead of an NMOS-only transfer gate, for example, to ensure that both logic "1" and logic "0" states transition between full power supply and ground voltage levels by eliminating device threshold voltage drops. Clock CLK 540, and complimentary clock CLKb 540' are used to enable or block input signal $V_{IN}$ on input node 515 from driving node 535 by turning CMOS transfer gate 530 ON and OFF, thereby determining the logic storage state of cross coupled CMOS inverters 545 and 550. Note that all inverters are CMOS inverters unless otherwise specified. CMOS inverters include a PMOS pull-up device connected to a power supply, and a NMOS pull-down device connected to ground and operates as discussed in the reference by H. B. Bakoglu, "Circuits, Interconnections, and Packaging for VLSI", Addison-Wesley Publishing Company, Inc, 1990, pp. 152. Cross coupled inverters 545 and 550 drive a storage node 555 which is connected to CMOS transfer gate 560. Clock CLK and complimentary clock CLKb are used to enable or block stored logic state node 555 from driving master latch stage circuit 505 output node 520 by turning CMOS transfer gate 560 ON and OFF.

Input node 520 of slave latch stage circuit 510, which is also the output node of master latch stage circuit 505, drives inverter 570. The output of inverter 570 output $V_{OUT}$ on output node 525, and also drives the input of inverter 575. Output signal $V_{OUT}$ corresponds to $V_{OUT}$ in FIG. 4B, which drives an input to logic 60. The output 580 of inverter 575 is connected to CMOS transfer gate 585. Clock CLK, and complimentary clock CLKb are used to enable or block the presence of a feedback loop that cross couples inverters 570 and 575 when enabled. When storing data, CMOS transfer gate 585 is ON and inverters 570 and 575 form a cross coupled storage device with node 520 acting as a storage node. When CMOS transfer gate 585 is OFF, then inverters 570 and 575 are not cross coupled and do not form a storage device.

In operation, a clocking scheme such as illustrated in FIG. 4B is used to synchronize the operation of double-latch design 40 illustrated in FIG. 4B. Register stage 80 includes cell k, a subset of master (L1) latch 70 and cell k', a subset of slave (L2) latch 75.

A master (L1) latch such as master (L1) latch 70 accepts data from a preceding logic stage 50 during the first half of the clock cycle time, captures and holds the data, and also transfers the information to a slave (L2) latch such as slave (L2) latch 75 at the beginning of the second half of the clock cycle time. A slave (L2) latch such as slave (L2) latch 75 accepts information from a corresponding master (L1) latch 70 at the beginning of the second half of the clock cycle time, transmits the information to the next logic stage 60, and latches the information before the end of the second half of the clock cycle time. If the clock is stopped during the first half of the clock cycle, then master (L1) latch 70 holds (stores) a logic state or data. If the clock is stopped during the second half of the clock cycle, then slave (L2) latch holds (or stores) a logic state or data. If power is removed or lost, the logic state or data are lost.

FIG. 6 illustrates prior art master latch stage circuit 505 corresponding to cell k of register file stage 80 of master (L1) latch 70 illustrated in FIG. 4B, and slave latch stage circuit 510 corresponding to cell k' of register file stage 80 of slave (L2) latch 75 illustrated in FIG. 4B.

In operation, at the beginning of a clock cycle, clock CLK 540 transitions from high to low voltage and remains at low voltage for the first half the clock cycle, and complimentary clock CLKb 540' transitions from low to high voltage and remains at high voltage for the first half of the clock cycle. CMOS transfer device 530 turns ON coupling input node 515 voltage $V_{IN}$ to storage node 535. CMOS transfer device 560 turns OFF and isolates the output of master latch stage circuit 505 from the input node 520 of slave latch stage circuit 510. CMOS transfer device 585 also turns OFF breaking the feedback path between the output 580 of inverter 575 and the input 520 of inverter 570 such that node 520 does not act as a storage node. Voltage $V_{IN}$ may transition to a voltage value corresponding to the correct logic state any time prior to the end of the first half of the clock cycle, providing sufficient time remains for cross coupled inverters 545 and 550 to store the corresponding logic state prior to clock transition at the beginning of the second half of the clock cycle.

Clock CLK 540 transitions from low to high voltage and remains at high voltage at the beginning of the second half of the clock cycle, and complimentary clock CLKb 540' transitions from high to low voltage and remains at low voltage for the second half of the clock cycle. CMOS transfer device 530 turns OFF decoupling input node 515 voltage $V_{IN}$ from storage node 535, which remains in a state corresponding to input voltage $V_{IN}$ at the end of the first half of the clock cycle. CMOS transfer device 560 turns ON and transfers the state of storage node 555 to input 520 of inverter 570 that drives output node 525 to output voltage $V_{OUT}$, and also drives the input of inverter 575. CMOS transfer device 585 turns ON which enables output 180 of inverter 575 to drive the input of inverter 570 and store the state of slave latch state stage circuit 510 until the end of the second stage of the clock cycle.

In U.S. Pat. No. 5,986,962, to Bertin et al., volatile low power shadow latches hold register file logic states or data so that volatile high performance register file power may be turned OFF to reduce static power dissipation as described above. However, volatile low power shadow latches must remain ON and therefore still dissipate power while storing logic states or data in backup mode because the storage is volatile, and information is lost if power is lost. Furthermore, volatile low power dissipating shadow latches use low bias current to minimize static power and are therefore very susceptible to disturb, in which stored logic states or data may be lost or corrupted. This may occur due to power supply noise, on-chip switching noise, alpha particle or other radiation disturb, for example. Also, shadow latches require additional chip area that can substantially increase chip size.

FIG. 7 illustrates prior art subsystem 700 with two modes of operation, a normal run mode and a low power logic state (or data) retention mode. In the normal run mode, volatile high performance and corresponding high active power logic operations are executed using high performance system latches. In the low power logic state (or data) retention mode, logic state or data is stored in low power shadow latches. Volatile means that logic state or data information is lost is power is lost or removed.

FIG. 7 illustrates a plurality of prior art volatile system latches 710, 710', and 710" coupled to related volatile shadow latch circuits 720, 270', and 720" by dedicated coupling circuits 730, 730', and 730". System latches may also be referred to as a latch circuit or as a register file or register file circuit, for example. The system or latch circuits are powered from $V_{DD}$ supplied by switch S1, which comes from power source P. The shadow latch circuits are powered from supply $V_{MS}$ supplied by switch S2, which comes also comes from power source P. However, switches S1 and S2 may get power from different sources instead. A detector D is used to detect a request for low power, which may come from a low power interrupt pin (not shown), or by monitoring an op code stream ST for a code calling for low power as shown in FIG. 7. When detector D detects an op code (or interrupt pin) calling for low power or standby mode, detector D energizes its output resulting in two effects. One effect is to enable switch S1 to provide power from voltage supply $V_{MS}$. A second effect is to activate switch S2, after a time delay between detector D transition and switch S2 activation, to disable the $V_{DD}$ power supply to the latch circuits. A time delay is introduced to ensure that shadow latches 720, 720', and 720" are enabled by the time latch circuits are de-powered. Volatile shadow latches 720, 720', and 720" remain powered at voltage VMS until the reduced power mode has ended, and may be de-powered only after the stored logic state or data is transfer to volatile system latches 710, 710', and 710".

SUMMARY

The present invention provides a non-volatile shadow latch using a nanotube switch.

Under one aspect, a non-volatile memory cell includes a volatile storage device that stores a corresponding logic state in response to electrical stimulus, and a shadow memory device coupled to the volatile storage device so as to receive and store the corresponding logic state in response to electrical stimulus. The shadow memory device includes a non-volatile nanotube switch, wherein said nanotube switch stores the corresponding state of the shadow device. Under another aspect, the non-volatile nanotube switch includes a two terminal nanotube switch.

Under another aspect, the non-volatile memory cell further includes a coupling circuit capable of transferring the corresponding logic state of the volatile storage device to the shadow memory device in response to electrical stimulus, and also capable of transferring a logic state of the shadow memory device to the volatile storage device in response to electrical stimulus.

Under another aspect, the non-volatile memory cell further includes a coupling circuit which includes a program circuit providing an electrical pathway between the volatile storage device and the shadow memory device and responsive to a program signal to transfer a corresponding logic state of the volatile storage device to the shadow memory device; and a restore circuit providing an electrical pathway between the shadow memory device and the volatile storage device and responsive to a restore signal to transfer a logic state of the shadow memory device to the volatile storage device.

Under another aspect, the non-volatile memory cell further includes a coupling circuit which includes an erase circuit in electrical communication with the shadow memory device and responsive to an erase signal to erase a logic state of the shadow memory device.

Under another aspect, a first terminal of the nanotube switch is in electrical communication with an output node of the volatile storage device, and a second terminal of the nanotube switch is in electrical communication with a program/erase/read line.

Under another aspect, the non-volatile memory cell includes a controller in electrical communication with the volatile storage device and capable of monitoring a level of power to the volatile storage device. Under another aspect the controller is capable of applying electrical stimulus to the shadow memory device in response to a loss of power to the volatile storage device. The electrical stimulus transfers the logic state of the volatile storage device to the shadow memory device.

Under another aspect, the controller is capable of applying electrical stimulus to the shadow memory device in response to an increase of power to the volatile storage device. The electrical stimulus transfers the logic state of the shadow memory device to the volatile storage device.

Under another aspect, the state stored by the non-volatile nanoswitch is characterized by the resistance of an electrical pathway in the nanoswitch.

Under another aspect, the non-volatile memory cell includes a master latch stage capable of receiving a voltage and outputting that voltage to the volatile storage device. The voltage corresponds to a logic state. Under another aspect, a random logic stage produces the voltage corresponding to the logic state. Under another aspect, an onboard cache produces the voltage corresponding to the logic state.

BRIEF DESCRIPTION OF THE DRAWINGS

In the Drawing:

FIG. 1 is a prior art representation of chip dynamic and static normalized power dissipation as a function of technology node, minimum gate length, and year;

FIG. 2 is a prior art representation of the relative energy efficiency of various logic design approaches;

FIG. 3 is a prior art representation of the relative energy efficiency of various logic operations;

FIG. 4A is a prior art schematic representation of a clocked logic function using two nonoverlapping clocks and volatile master and slave latches;

FIG. 4B is a prior art schematic representation of a clocked logic function using one clock and volatile master and slave latches;

FIG. 5 is a prior art representation of the normalized power dissipation of the IBM 970 logic chip designed at the 130 nm technology node superimposed on FIG. 1;

FIG. 6 is a prior art schematic of a register file stage circuit;

FIG. 7 is a prior art schematic representation of system latches coupled to low power shadow latches by coupling circuits, and an associated power supply;

DETAILED DESCRIPTION

Preferred embodiments of the present invention provide non-volatile shadow elements that include nanotube switches. In general, the non-volatile shadow elements are coupled to corresponding system volatile latches, also referred to as register file latches. In some embodiments, the shadow elements are coupled to corresponding system latches by coupling circuits. In other embodiments, the shadow elements are directly coupled to corresponding system latches. In general, the state of a system latch is transferred to a shadow element when the power is turned off to that latch. Accordingly, power may be turned off for an entire chip, or selectively turned off for one or more portions of a chip, and information in each system latch will be transferred to the corresponding shadow element. Then, when power is restored to the latch, the state stored in the shadow element will be transferred back to the corresponding system latch. This enables power to be turned OFF while saving critical data, and restoring operation of chip sub-functions as power is restored.

In preferred embodiments, the nonvolatile nanotube switches can be fabricated with processes that integrate well with existing CMOS technologies. In preferred embodiments, the nanotube switches in the non-volatile shadow elements include a nanotube article, which is in electrical communication with each of two conductive terminals. The nanotube article includes at least one nanotube. By applying appropriate electrical stimuli to at least one of the conductive terminals, the electrical resistance of the nanotube article between the two conductive terminals can be reprogrammably changed between a relatively high resistance, and a relatively low resistance. The relative resistance of the nanotube article characterizes the logical state stored in the non-volatile shadow element. The state is non-volatile, allowing the logical state to be stored (indefinitely) with zero power dissipation. Although in the described embodiments nanotube switches with two terminals are used, in general other kinds of nanotube switches can also be used.

Design Using Non-Volatile Register Files

Non-volatile nanotube switches can be used in embodiments of shadow storage devices that are nonvolatile (holds information when power is turned OFF), and are tolerant of harsh environments such as high temperature and high radiation levels. Further, non-volatile nanotube switches can be integrated easily with any CMOS process such as bulk CMOS or SOI CMOS, and require relatively little additional chip area to implement. The use of nonvolatile nanotube switches in the design of embodiments of nonvolatile register files is described further below. Nonvolatile register files have two modes of operation, a normal run mode, and a zero power dissipation logic state (or data) retention mode.

Figure 8A:
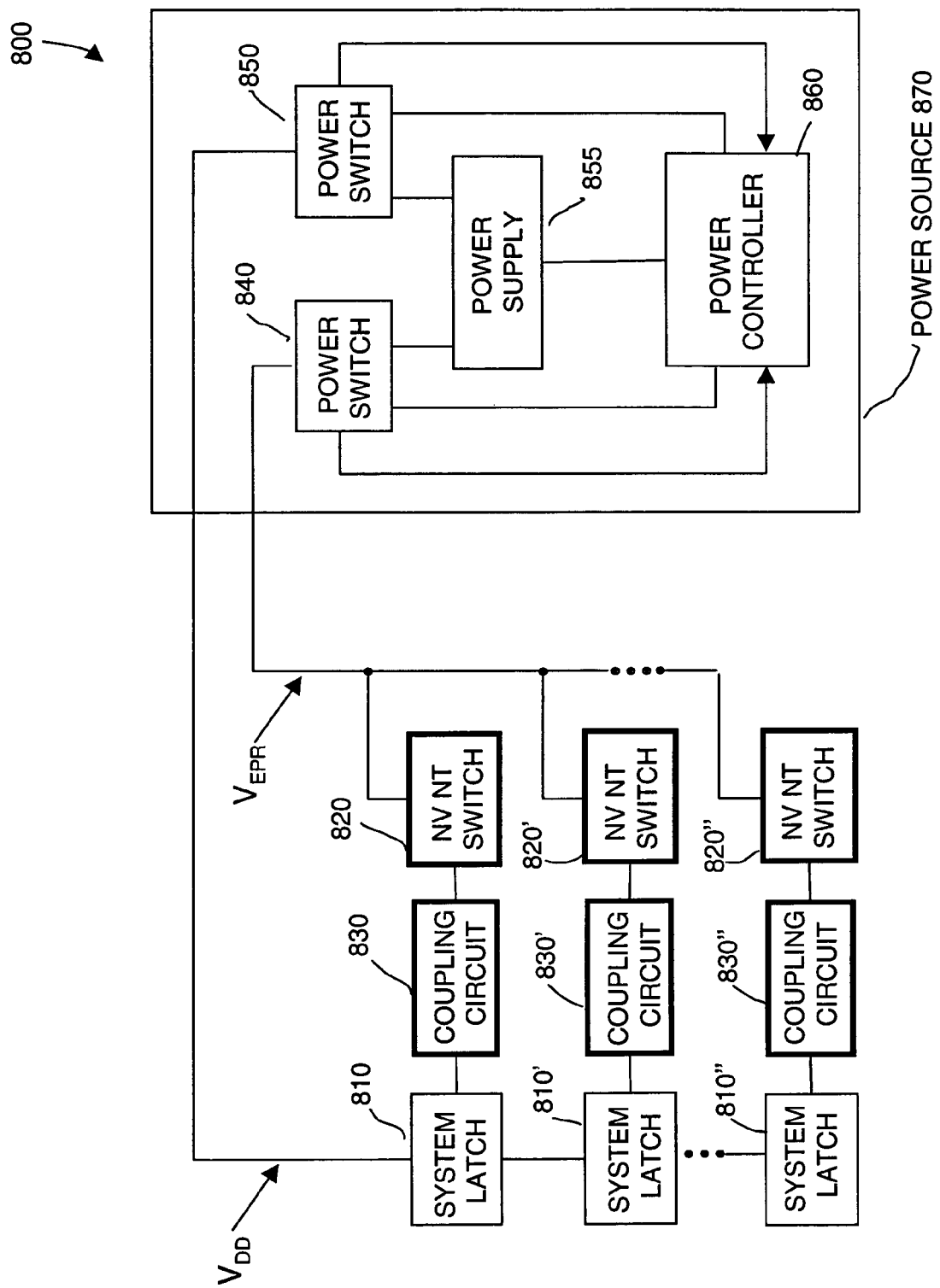
FIG. 8A is a schematic representation of system latches coupled to nonvolatile nanotube switches by coupling circuits, and an associated power supply according to certain embodiments of the invention.

FIG. 8A illustrates one embodiment of a nonvolatile shadow latch subsystem 800 with two modes of operation, a normal run mode and a zero power logic state (or data) nonvolatile retention mode in which power is disconnected. In the normal run mode, volatile high performance high active power mode logic operations are executed using high performance latches. In the zero power logic state (or data) nonvolatile retention mode, logic state or data is stored in nonvolatile nanotube switches that are tolerant of harsh environments such as high temperatures and high levels of radiation, and power is disconnected.

FIG. 8A illustrates a plurality of latches, also referred to as register file latches 810, 810', and 810", coupled to related nonvolatile nanotube switches 820, 820', and 820" by dedicated coupling circuits 830, 830', and 830". The register file latches are powered from power source 870 with $V_{DD}$ supplied by switch 850, which comes from power supply 855. The nonvolatile nanotube switches are powered from power source 870 with erase/program/restore pulse $V_{EPR}$ supplied by switch 840, which comes from the same power supply 855. It is not required that switches 840 and 850 receive power from the same power supply 855. Erase/program/restore pulse $V_{EPR}$ may be one, or several pulses applied to nonvolatile nanotube switches 820, 820', and 820" in order to store the state latches 810, 810', and 810" in a nonvolatile mode. Power controller 860 monitors the switching of power switch 840 and 850 to ensure sufficient time for transfer of logic state or data from the register file latches to the nonvolatile nanotube switches. At this point, power supply $V_{DD}$ is de-powered and erase/program/restore pulse $V_{EPR}$ is de-powered such that the logic state or data remains stored by nonvolatile nanotube switches 820, 820', and 820" with zero power dissipation.

Figure 8B:
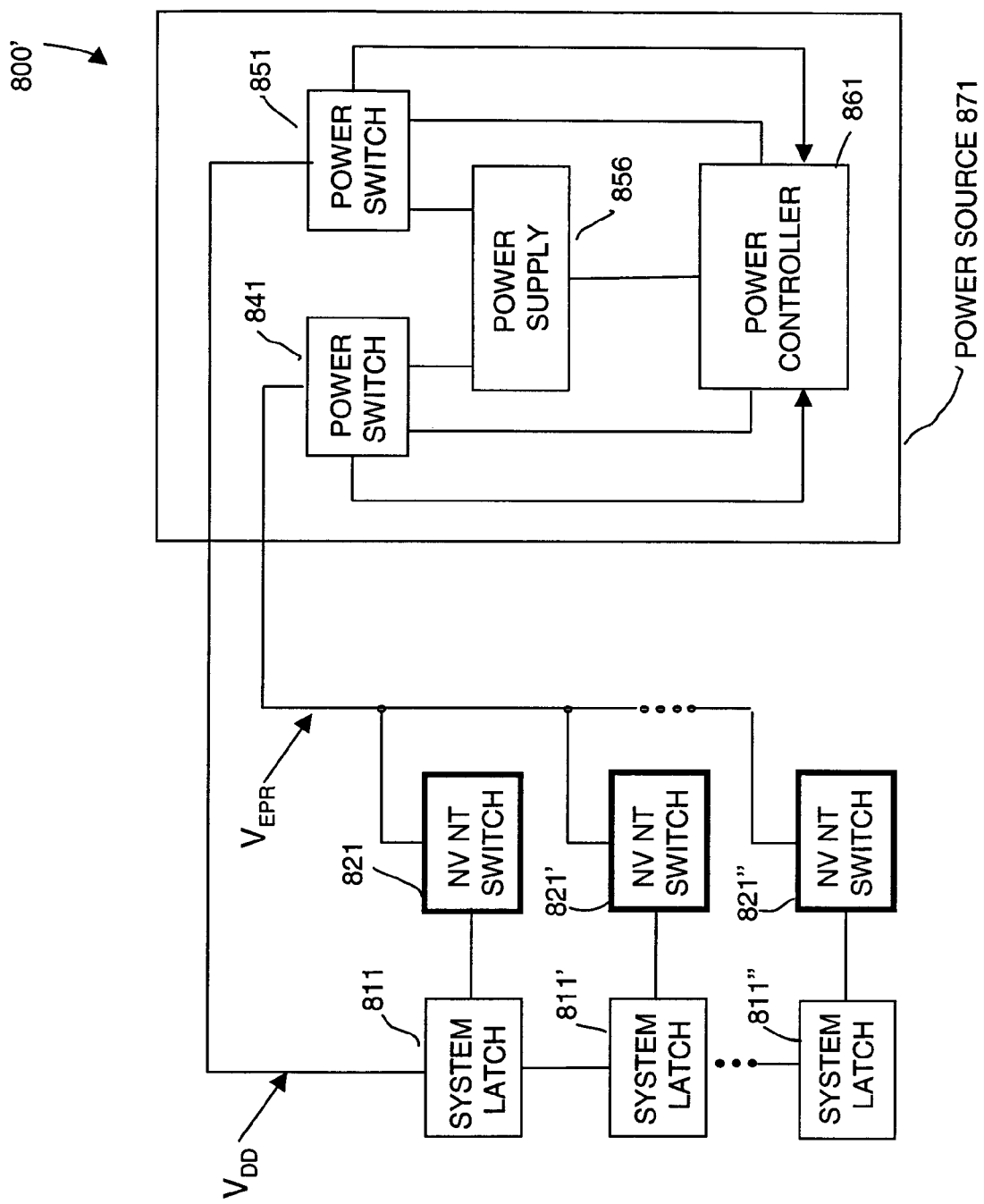
FIG. 8B is a schematic representation of system latches coupled directly to nonvolatile nanotube switches, and an associated power supply according to certain embodiments of the invention.

FIG. 8B illustrates another embodiment of a nonvolatile shadow latch subsystem 800' with two modes of operation, a normal run mode and a zero power logic state (or data) nonvolatile retention mode in which power is disconnected. In the normal run mode, volatile high performance high active power mode logic operations are executed using high performance latches. In the zero power logic state (or data) nonvolatile retention mode, logic state or data is stored in nonvolatile nanotube switches that are tolerant of harsh environments such as high temperatures and high levels of radiation, and power is disconnected.

FIG. 8B illustrates a plurality of latches, also referred to as register file latches 811, 811', and 811", coupled directly to related nonvolatile nanotube switches 821, 821', and 821". The register file latches are powered from power source 871 with $V_{DD}$ supplied by switch 851, which comes from power supply 856. The nonvolatile nanotube switches are powered from power source 871 with erase/program/restore pulse $V_{EPR}$ supplied by switch 841, which comes from the same power supply 856. It is not required that switches 841 and 851 receive power from the same power supply 856. Erase/program/restore pulse $V_{EPR}$ may be one, or several pulses applied to nonvolatile nanotube switches 821, 821', and 821" in order to store the state latches 811, 811', and 811" in a nonvolatile mode. Power controller 861 monitors the switching of power switch 841 and 851 to ensure sufficient time for transfer of logic state or data from the register file latches to the nonvolatile nanotube switches. At this point, power supply $V_{DD}$ is de-powered and erase/program/restore pulse $V_{EPR}$ is de-powered such that the logic state or data remains stored by nonvolatile nanotube switches 821, 821', and 821" with zero power dissipation.

Non-Volatile Nanotube Switch

Embodiments of non-volatile two-terminal nanotube switches that can be included in the described shadow latches are described in U.S. patent application Ser. No. 11/280,786, filed on Nov. 15, 2005, entitled "Two-Terminal Nanotube Devices And Systems And Methods Of Making Same," the contents of which are incorporated herein in their entirety by reference. Associated structures using the switches, along with electrical characteristics, methods of fabricating, and methods of integrating the switches with existing semiconductor technology are described.

Figure 9A:
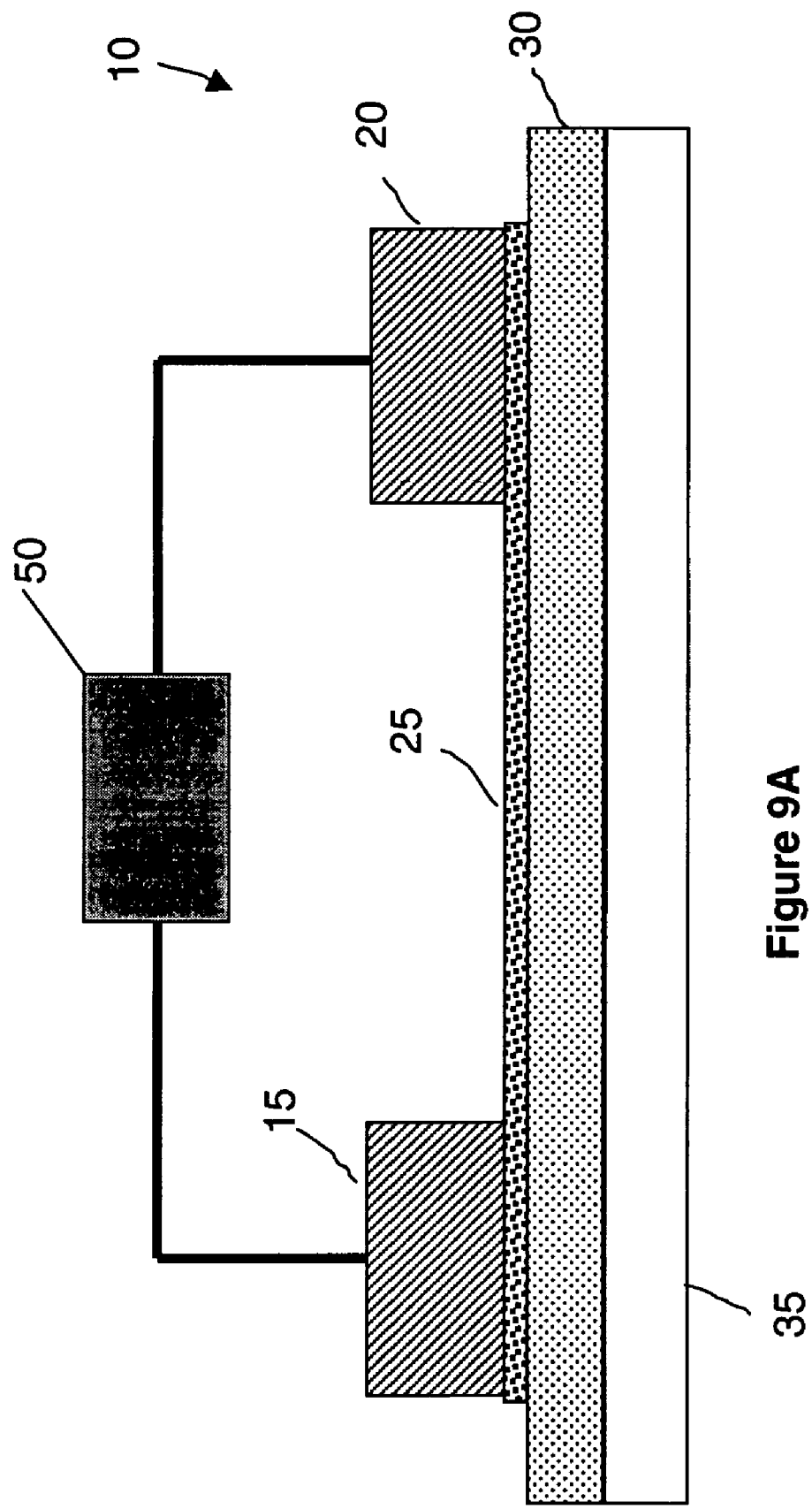
FIGS. 9A and 9B are cross-sectional representations of certain embodiments of non-volatile two-terminal nanotube switches.

FIG. 9A illustrates a cross sectional representation of a nonvolatile 2-terminal nanotube switch (2-TNS) 10. Nanotube element 25 is disposed on substrate 35, which includes a layer of insulator 30. Nanotube element 25 at least partially overlaps two terminals, e.g., conductive elements 15 and 20, which are both deposited directly onto nanotube element 25. In this embodiment, nanotube element 25 is patterned within a region that can be defined before or after deposition of conductive elements 15 and/or 20.

Conductive elements 15 and 20 are in contact with stimulus circuit 50. Stimulus circuit 50 electrically stimulates at least one of conductive elements 15 and 20, which changes the state of switch 10. More specifically, nanotube element 25 responds to the simulation by changing the resistance of switch 10 between conductive elements 15 and 20; the relative value of the resistance corresponds to the state of the switch. For example, if stimulus circuit 50 applies a first electrical stimulus, which may be for example a relatively high voltage and a current across conductive elements 15 and 20, then nanotube element 25 responds by changing the resistance of the device between conductive elements 15 and 20 to a relatively high resistance. This corresponds to an "erased" or "off" state of the device, where electrical conduction is relatively poor between conductive elements 15 and 20. The impedance between elements 15 and 20 may also be relatively high in this state. For example, if stimulus circuit 50 applies a second electrical stimulus, which may be for example a relatively low voltage and a current across conductive elements 15 and 20, then nanotube element 25 responds by changing the resistance of the switch between conductive elements 15 and 20 to a relatively low resistance. This corresponds to a "programmed" or "on" state of the device, where electrical conduction is relatively good, or even near-ohmic, between conductive elements 15 and 20. The impedance between elements 15 and 20 may also be relatively low in this state. The "erase" current associated with the relatively high "erase" voltage may be greater than or less than the "program" current associated with the relatively low "program" voltage. "Erase" and "program" currents are typically in the in the nano-Ampere or micro-Ampere range, and are determined by geometry and material selection of the nonvolatile two-terminal nanotube switch. In general, the resistance as well as the impedance between the first and second conductive elements of the device is a function of the state of the device, and can be determined by measuring electrical characteristics of the switch.

Conductive elements 15 and 20 are preferably made of a conductive material, and can be the same or different material depending on the desired performance characteristics of switch 10. Conductive elements 15 and 20 can, for example, be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, or semiconductor, materials can also be used. Insulator 30 is preferably a suitable insulative material, for example SiO2, SiN, $Al_2O_3$, BeO, GaAs, polyimide, or other suitable material. Examples of conductive and insulative materials that can be used in 2-TNS 10 are described in greater detail in U.S. patent application Ser. No. 11/280,786, filed on Nov. 15, 2005, entitled "Two-Terminal Nanotube Devices And Systems And Methods Of Making Same."

In some embodiments, nanotube element (article) 25 is a fabric of matted carbon nanotubes (also referred to as a nanofabric). Nanotubes in the nanofabric may be randomly oriented, or may have an orientation that is not constrained to an orientation of nanotube element 25. Nanotube elements generally substantially conform to surfaces; in some embodiments, one or more terminals of a two-terminal nanotube switch have vertically oriented surfaces, and the nanotube element substantially conforms to at least a portion of the vertically oriented surface. In some embodiments, the nanotube element or fabric is porous, and material from conductive elements 15 and/or 20 may fill at least some of the pores in nanotube element 25. In some embodiments, nanotube element 25 includes single-walled nanotubes (SWNTs) and/or multiwalled nanotubes (MWNTs) and/or double-walled nanotubes (DWNTs). In some embodiments, nanotube element 25 includes one or more bundles of nanotubes. Generally, nanotube element 25 includes at least one nanotube. Methods of making nanotube elements and nanofabrics are known and are described in U.S. Pat. Nos. 6,784,028, 6,835, 591, 6,574,130, 6,643,165, 6,706,402, 6,919,592, 6,911,682, and 6,924,538; U.S. Patent Publication Nos. 2005-0062035, 2005-0035367, 2005-0036365, and 2004-0181630; and U.S. patent application Ser. Nos. 10/341005, 10/341055, 10/341054, 10/341130, the contents of which are hereby incorporated by reference in their entireties (hereinafter and hereinbefore the "incorporated patent references"). Some embodiments for nanotube elements that can be used in 2-TNS 10 are described in greater detail in U.S. patent application Ser. No. 11/280,786, filed on Nov. 15, 2005, entitled "Two-Terminal Nanotube Devices And Systems And Methods Of Making Same."

Generally it is preferable that the values of the high and low resistances are separated by at least an order of magnitude. In some preferred embodiments, the "off" state has a resistance that is at least about 10 times higher than a resistance of the "on" state. In some preferred embodiments, the "off" state has an impedance that is at least about 10 times higher than an impedance of the "on" state. In some embodiments, the "programmed" or "on" state is characterized by a resistance ($R_{ON}$) between conductive elements 15 and 20 that is generally in the range of 100 Ohms to 1 M-Ohm. In some embodiments, the "erased" or "off" state is characterized by a resistance ($R_{OFF}$) between conductive elements 15 and 20 that is generally in the range of 10 M-Ohm to 10 G-Ohm or more. The two states are non-volatile, i.e., they do not change until stimulus circuit 50 applies another appropriate electrical stimulus to at least one of conductive elements 15 and 20, and they retain state even if power is removed from the circuit. Stimulus circuit can also determine the state of 2-TNS 10 with a non-destructive read-out operation (NDRO). For example, stimulus circuit 50 may apply a low measurement voltage across conductive elements 15 and 20, and measure the resistance R between the conductive elements. This resistance can be measured by measuring the current flow between conductive elements 15 and 20 and from that calculating the resistance R. The stimulus is sufficiently weak that it does not change the state of the device. Another example of a method of determining the state of the cell by measuring pre-charged bit line capacitance discharge through (between) conductive elements 15 and 20 is described in U.S. patent application Ser. No. 11/274,967, filed on Nov. 15, 2005, entitled "Memory Arrays Using Nanotube Articles With Reprogrammable Resistance." Example electrical stimuli and resistances for "programmed" and "erased" states for some embodiments of two-terminal nanotube switches, and example "read" stimuli, are described in greater detail in U.S. patent application Ser. No. 11/280,786, filed on Nov. 15, 2005, entitled "Two-Terminal Nanotube Devices And Systems And Methods Of Making Same."

Figure 9B:
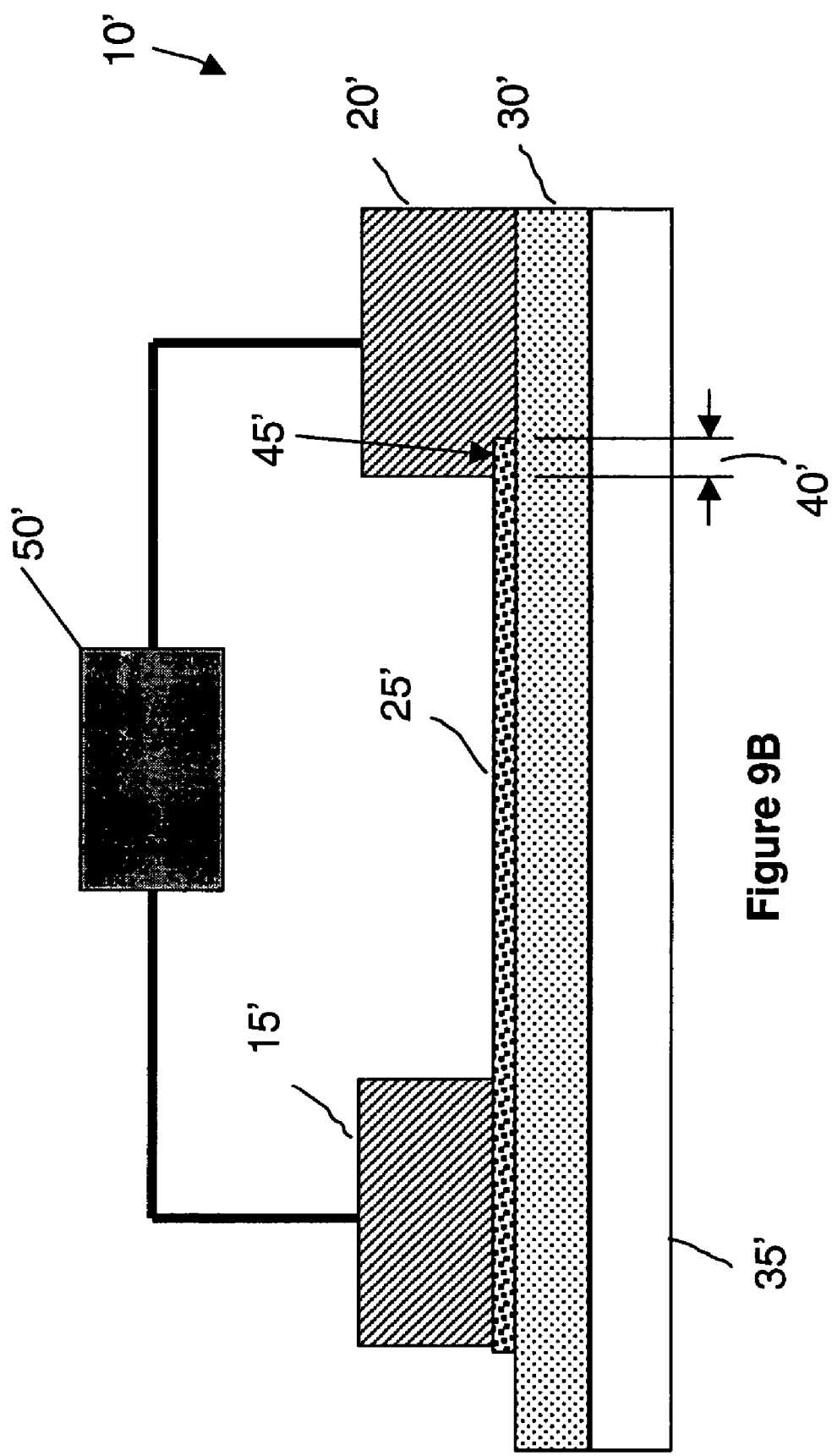

In some embodiments, thermal and/or electrical engineering, that is, thermal and/or electrical management (design), can be used to enhance the performance of a two-terminal nanotube switch, as described in U.S. patent application No. 11/280,786, filed on Nov. 15, 2005, entitled "Two-Terminal Nanotube Devices And Systems And Methods Of Making Same." FIG. 9B illustrates a cross sectional representation of nonvolatile two-terminal nanotube switch (2-TNS) 10', in which thermal and/or electrical engineering or management (design) is accomplished by limiting the overlap between nanotube element 25' and conductive element 20'. Nanotube element 25' is disposed on substrate 35', which includes a layer of insulator 30'. Nanotube element 25' is arranged to overlap with a specified geometrical relationship, e.g., by a predetermined extent, at least a portion of at least one of the terminals, e.g., conductive elements 15' and 20', which are both deposited directly onto nanotube element 25'.

Passivation of NRAM devices may be used to facilitate device operation in air, at room temperature, and as a protecting layer in conjunction with stacked material layers on top on the NRAM device. Operation of unpassivated NRAM devices are typically performed in an inert ambient, such as argon, nitrogen, or helium, or an elevated (greater than 125 C) sample temperature to remove adsorbed water from the exposed nanotubes. Therefore, the requirements of a passivation film are typically twofold. First, the passivation should form an effective moisture barrier, preventing exposure of the nanotubes to water. Second, the passivation film should not interfere with the switching mechanism of the NRAM device.

One approach to passivation involves cavities, which have been fabricated around the NRAM devices to provide a sealed switching region. Cavities both around individual devices (device-level passivation) and around an entire die of 22 devices (die-level passivation) have been demonstrated. However, the process flow to fabricate is complicated, with at least 2 additional lithography steps, and at least 2 additional etching steps required.

Another approach to passivation involves depositing a suitable dielectric layer over the NRAM devices. An example of this approach is the use of spin-coated polyvinyledenefluoride (PVDF) in direct contact with the NRAM devices. The PVDF is patterned into either die-level (over an entire die active region) or device-level patches (individual patches covering individual devices). Then a suitable secondary dielectric passivation film, such an alumina or silicon dioxide is used to seal off the PVDF and provide a passivation robust to NRAM operation. It is thought that NRAM operation thermally decomposes the overlying PVDF, hence a secondary passivation film is required to seal off the devices. Since the die level passivations are typically ~100 micron square patches, this local decomposition can lead to ruptures of the secondary passivation, exposure of NRAM devices to air, and their subsequent failure. To avoid such failures of the secondary passivation film, the die-level passivated devices are "burned-in" electrically by pulsing the devices typically with 500 ns pulses from 4V to 8V in 0.5V steps. This is thought to controllably decompose the PVDF and prevent a rupture of the overlying secondary passivation film. After the burn-in procedure the die-level passivated NRAM devices operate normally. Devices passivated with a device-level PVDF coating and a secondary passivation film do not require such a burn in procedure and may be operated in air at room temperature directly at operating voltages. With device-level passivaton the PVDF is patterned in the exact shape of the CNT fabric, typically 0.5 microns wide and 1-2 microns long. It is thought that such small patches can decompose without stressing the secondary passivation film to failure. It is possible that for a given defect density in the secondary passivation, there are no defects on average over the smaller footprint of the device-level PVDF patches in comparison to the larger, die-level patches.

In this embodiment, nanotube element 25' is patterned within a region that can be defined before or after deposition of conductive elements 15' and/or 20'. Conductive element 15' overlaps one entire end-region of nanotube element 25', forming a near-ohmic contact. At the opposite end of nanotube element 25', at overlap region 45', conductive element 20' overlaps nanotube element 25' by a controlled overlap length 40'. Controlled overlap length may be for example in the range of 1 to 150 nm, or in the range of 15-50 nm. In one preferred embodiment, controlled overlap length 40' is about 45 nm. The materials and methods of making switch 10' may be similar to those described above for switch 10 of FIG. 8A.

Switches 10 and 10' illustrated in figures 9A and 9B are intended to be illustrative examples of two-terminal nanotube switches that can be used in non-volatile shadow latches using a nanotube switch. Other embodiments of 2-TNS that can be used in non-volatile shadows latches are described in U.S. patent application Ser. No. 11/280,786, filed on Nov. 15, 2005, entitled "Two-Terminal Nanotube Devices And Systems And Methods Of Making Same."

Systems With Nonvolatile Shadow Latches Using A Nanotube Switch

Figure 10:
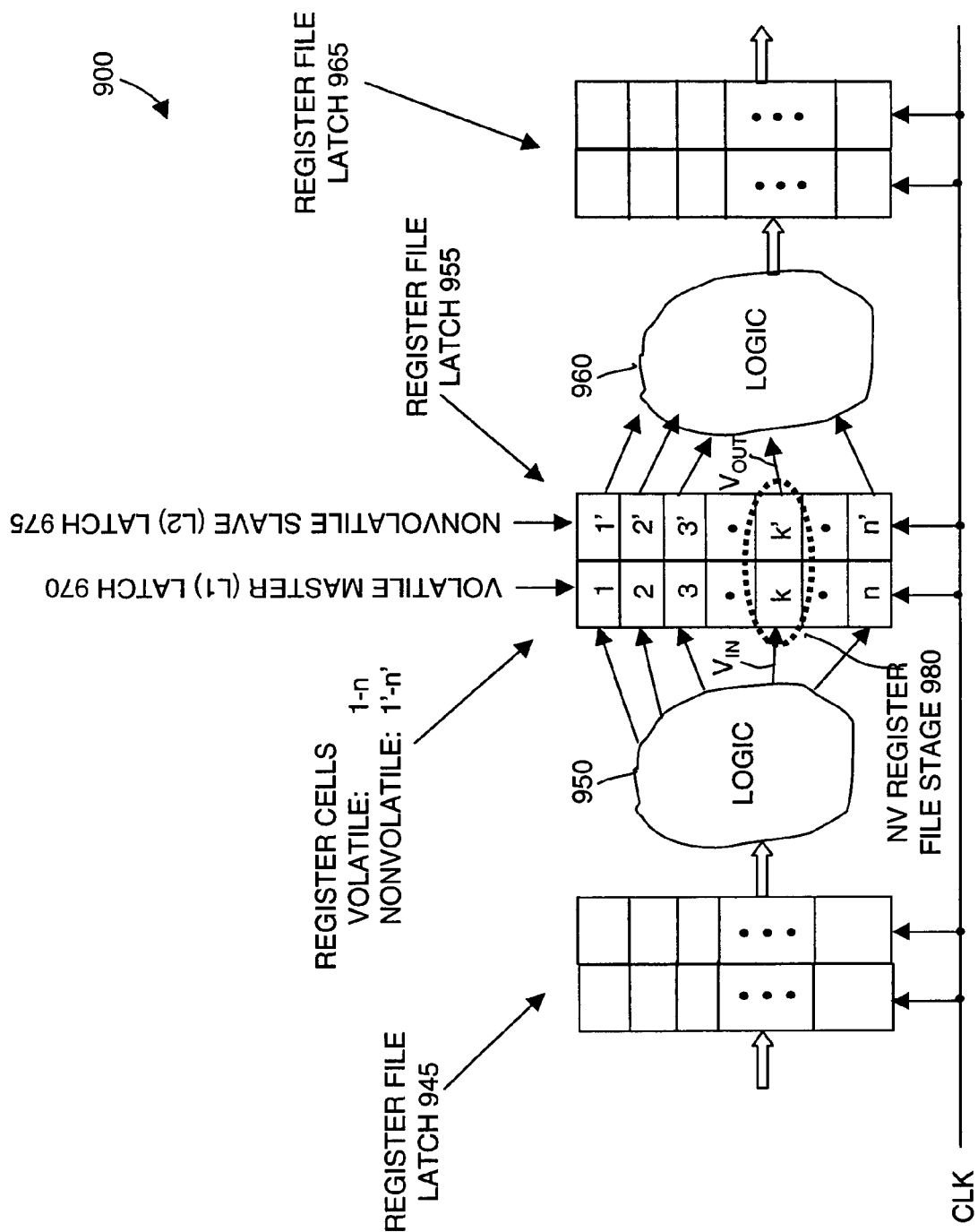
FIG. 10 is a schematic representation of a clocked logic function using one clock, volatile master latches, and non-volatile slave latches according to certain embodiments of the invention.

FIG. 10 illustrates a system using nonvolatile register file latches based on the operating principles described with respect to FIGS. 8A and 8B. Nonvolatile register file latches and logic architecture 900 include volatile master (L1) latches corresponding to volatile master (L1) latches in FIG. 4B; nonvolatile slave (L2) latches; logic 950 corresponding to logic 50; and logic 960 corresponding to logic 60 in FIG. 4B.

FIG. 10 illustrates a pipelined synchronous logic architecture 900 including logic stages 950 and 960 (and others not shown) separated by nonvolatile register file latches 945, 955, 965 (and other nonvolatile register file latches not shown) designed for state-of-the-art high speed operation and nonvolatile logic state or data storage in de-powered register file latches with zero active and zero static power dissipation. Exemplary register 955 is composed of a volatile master (L1) latch 970 and a nonvolatile slave (L2) latch 975. Volatile master (L1) latch 970 is composed of volatile register cells 1-n and nonvolatile slave (L2) latch 975 is composed of nonvolatile cells 1'-n'. A nonvolatile register stage is composed a corresponding pair of register cells, such as nonvolatile register stage 980 composed of corresponding volatile register cell k and nonvolatile register cell k'. It is important to note that logic stages 950 and 960 may be composed of random logic stages, for example, or may be an onboard cache such as a high speed Sync SRAM L1 cache, for example. A volatile master (L1) latch such as volatile master (L1) latch 970 accepts data from preceding logic stage 950 during the first half of the clock cycle time, captures and holds the data, and also transfers the information to the nonvolatile slave (L2) latch at the beginning of the second half of the clock cycle time. A nonvolatile slave (L2) latch such as nonvolatile slave (L2) latch 975 accepts information from a corresponding master (L1) latch 970 at the beginning of the second half of the clock cycle time, transmits the information to the next logic stage 960, and then latches the information near the end of the second half of the clock cycle time.

Nonvolatile slave (L2) latch operates as a volatile slave (L2) latch during high speed chip operation. If power is to be reduced, then clock CLK is stopped during the second half of the clock cycle, after data has been latched in volatile slave (L2) latch. In one embodiment, the logic state of nonvolatile slave (L2) latch is transferred to a nonvolatile nanotube switch corresponding to switches 820, 820', and 820" by dedicated coupling circuits corresponding to dedicated coupling circuits 830, 830', and 830" as shown in FIG. 8A, and described further below. In another embodiment, the logic state of nonvolatile slave (L2) latch is transferred directly to a nonvolatile nanotube switch corresponding to switches 821, 821', and 821" as shown in FIG. 8B, and described further below.

Figure 11A:
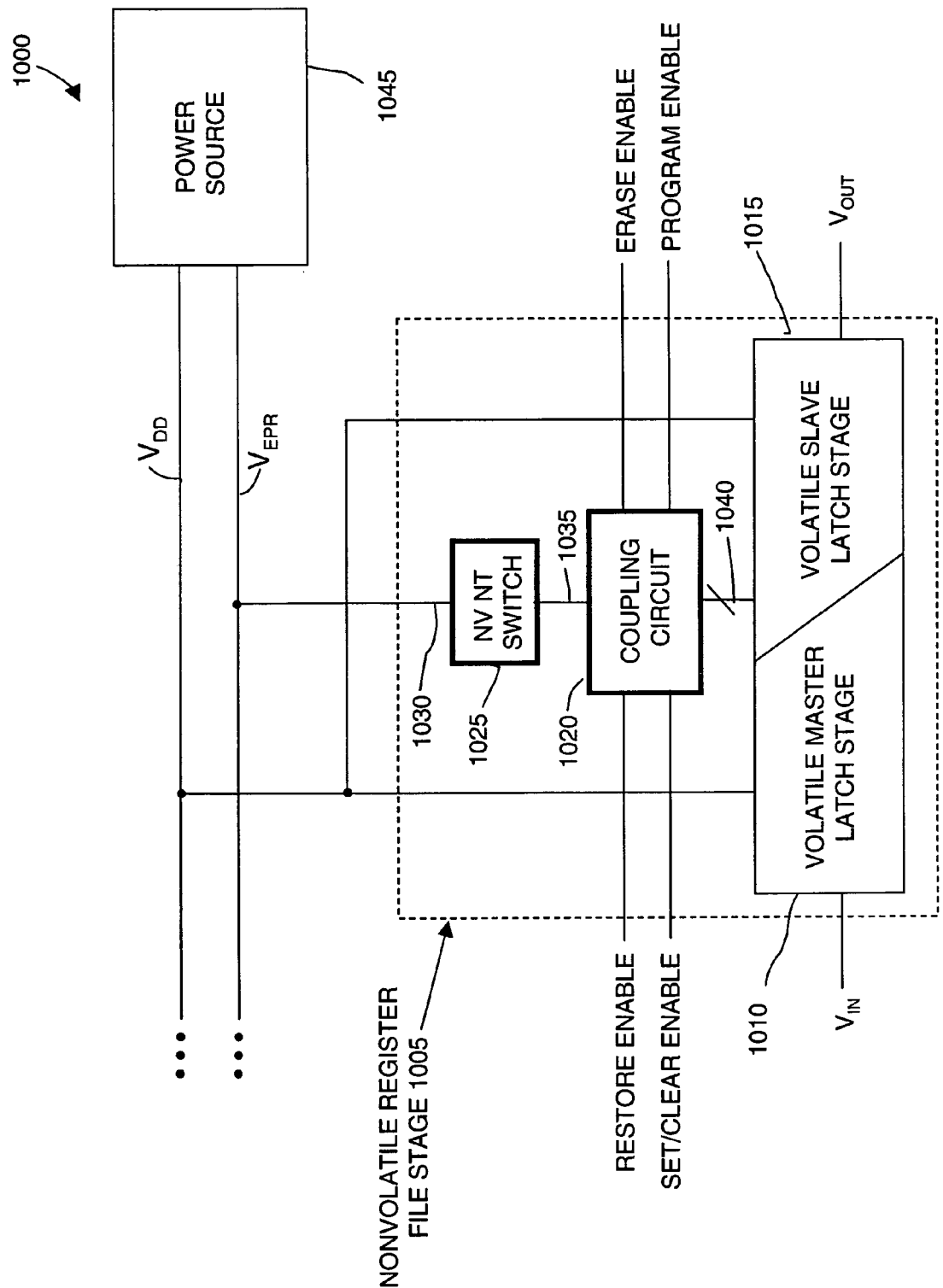
FIG. 11A is a schematic representation of a nonvolatile register file stage including a coupling circuit and non-volatile nanotube switch according to certain embodiments of the invention.

FIG. 11A is a block diagram 1000 of nonvolatile register file stage 980 illustrated in FIG. 10 and including a dedicated coupling circuit to transfer the logic state of a volatile slave latch stage to a nonvolatile nanotube switch. Nonvolatile register file stage 1005 corresponds to nonvolatile register file stage 980 shown in FIG. 10. Volatile cell k of nonvolatile register file stage 980 shown in FIG. 10 corresponds to volatile master latch stage 1010 with input $V_{IN}$ shown in FIG. 11A. Nonvolatile cell k' of nonvolatile register file stage 980 shown in FIG. 10 includes volatile slave latch stage 1015 with output $V_{OUT}$, nonvolatile nanotube switch 1025, coupling circuit 1020, and corresponding interconnections shown in FIG. 11A. Nonvolatile register file stage 1005 has two modes of operation, a normal run mode and a zero power logic state (or data) nonvolatile retention mode in which power is disconnected.

In the normal run mode, volatile master latch stage 1010 receives input voltage $V_{IN}$, drives volatile slave latch stage 1015, is clocked (shown further below), and is powered from $V_{DD}$ supplied by power source 1045.

Volatile slave latch stage 1015 receives input from the output of volatile master latch 1010, supplies output voltage $V_{OUT}$, is clocked (shown further below), and is powered from $V_{DD}$ supplied by power source 1045. Volatile slave latch stage 1015 is coupled to nonvolatile nanotube switch 1025 by coupling circuit 1020.

During transition from normal run mode to zero power nonvolatile retention mode, or from zero power nonvolatile retention mode to normal run node, nonvolatile nanotube switch 1025 is powered from $V_{EPR}$ supplied by power source 1045 through electrical connection 1030. Nonvolatile nanotube switch 1025 is connected to coupling circuit 1020 by electrical connection 1035.

In addition to electrical connection 1035 to nonvolatile nanotube switch 1025, coupling circuit 1020 is also connected to volatile slave latch stage 1015 by electrical connections 1040. A controller (not shown) supplies erase enable, program enable, restore enable, and set/clear enable pulses to coupling circuit 1020 as shown in FIG. 11A. When transitioning from normal run mode (power ON) to zero power nonvolatile retention mode (power OFF), erase enable and program enable pulses (shown further below) are used to transfer the logic state of volatile slave latch stage 1015 to nonvolatile nanotube switch 1025 prior to reducing power supply voltage from $V_{DD}$ to zero. When transitioning from zero power nonvolatile retention mode (power OFF) to normal run mode (power ON), and after restoring power supply voltage from zero to $V_{DD}$, set/clear enable and restore enable pulses (shown further below) are used to transfer the logic state stored in nonvolatile nanotube switch 1025 to volatile slave latch stage 1015. Normal run mode may then begin. Voltage pulse (or pulses) $V_{EPR}$ are applied only during transitions between normal run mode and zero power nonvolatile retention mode using erase enable, program enable, set/clear enable, and restore enable pulses as described further below, otherwise $V_{EPR}$ voltage is zero.

Figure 11B:
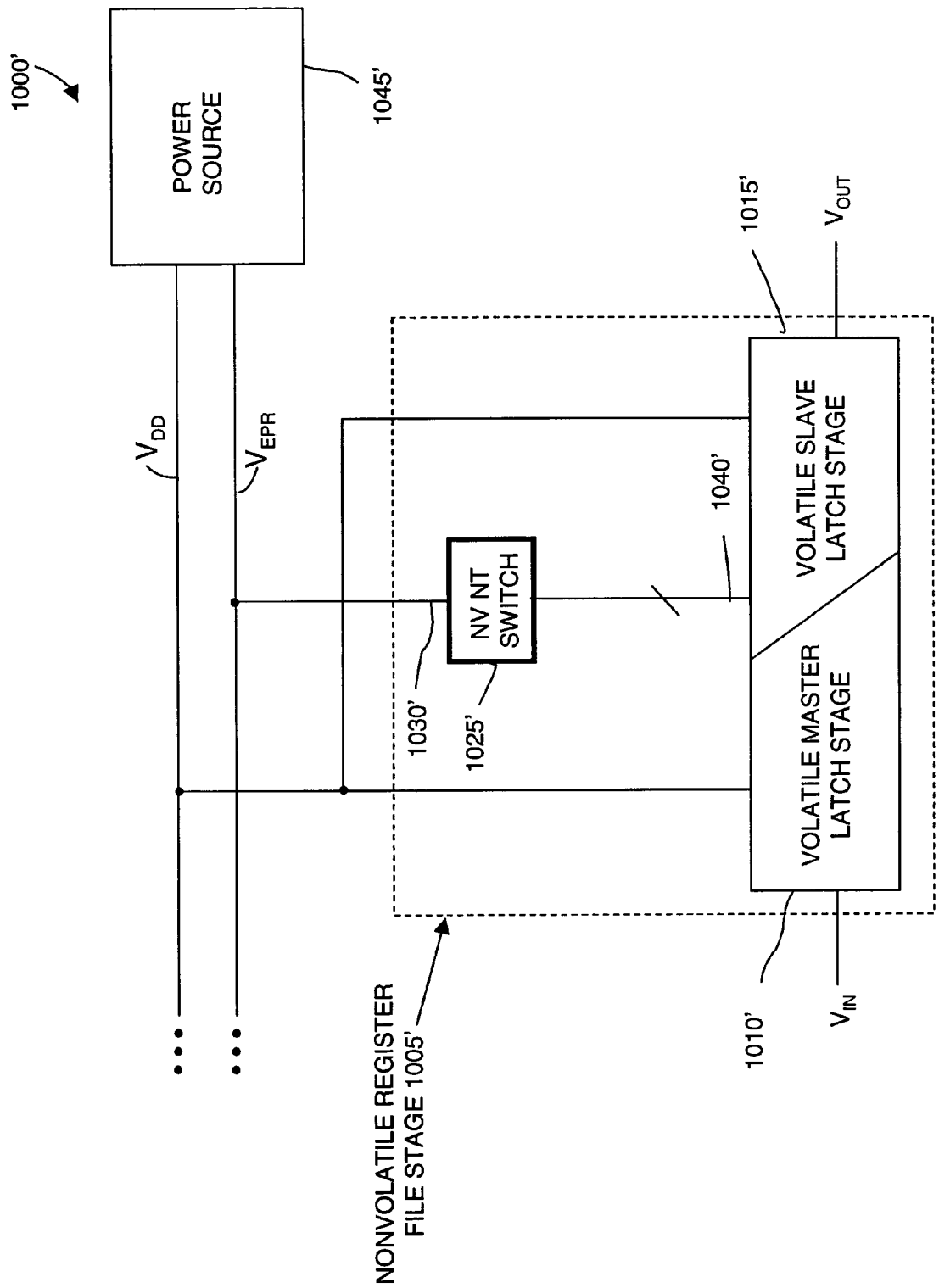
FIG. 11B is a schematic representation of a nonvolatile register file stage including a non-volatile nanotube switch according to certain embodiments of the invention.

FIG. 11B is a block diagram 1000' of nonvolatile register file stage 980 illustrated in FIG. 10 wherein the logic state of a volatile slave latch stage is directly transferred to a nonvolatile nanotube switch. Nonvolatile register file stage 1005' corresponds to nonvolatile register file stage 980 shown in FIG. 10. Volatile cell k of nonvolatile register file stage 980 shown in FIG. 10 corresponds to volatile master latch stage 1010' with input $V_{IN}$ shown in FIG. 11B. Nonvolatile cell k' of nonvolatile register file stage 980 shown in FIG. 10 includes volatile slave latch stage 1015' with output $V_{OUT}$, nonvolatile nanotube switch 1025' and corresponding interconnections shown in FIG. 11B. Nonvolatile register file stage 1005' has two modes of operation, a normal run mode and a zero power logic state (or data) nonvolatile retention mode in which power is disconnected.

In the normal run mode, volatile master latch stage 1010' receives input voltage $V_{IN}$, drives volatile slave latch stage 1015', is clocked (shown further below), and is powered from $V_{DD}$ supplied by power source 1045'.

Volatile slave latch stage 1015' receives input from the output of volatile master latch 1010', supplies output voltage $V_{OUT}$, is clocked (shown further below), and is powered from $V_{DD}$ supplied by power source 1045'. Volatile slave latch stage 1015' is coupled to nonvolatile nanotube switch 1025' by electrical connection 1040'.

During transition from normal run mode to zero power nonvolatile retention mode, or from zero power nonvolatile retention mode to normal run node, nonvolatile nanotube switch 1025' is powered from $V_{EPR}$ supplied by power source 1045' through electrical connection 1030'.

A controller (not shown) supplies erase enable, program enable, restore enable, and set/clear enable pulses to nonvolatile nanotube switch 1025' via $V_{EPR}$ connected to switch 1025' by electrical connection 1030' as shown in FIG. 11B. When transitioning from normal run mode (power ON) to zero power nonvolatile retention mode (power OFF), erase enable and program enable pulses (shown further below) are used to transfer the logic state of volatile slave latch stage 1015' to nonvolatile nanotube switch 1025' prior to reducing power supply voltage from $V_{DD}$ to zero. When transitioning from zero power nonvolatile retention mode (power OFF) to normal run mode (power ON), and after restoring power supply voltage from zero to $V_{DD}$, set/clear enable and restore enable pulses (shown further below) are used to transfer the logic state stored in nonvolatile nanotube switch 1025' to volatile slave latch stage 1015'. Normal run mode may then begin. Voltage pulse (or pulses) $V_{EPR}$ are applied only during transitions between normal run mode and zero power nonvolatile retention mode using erase enable, program enable, set/clear enable, and restore enable pulses as described further below, otherwise $V_{EPR}$ voltage is zero.

Figure 12A:
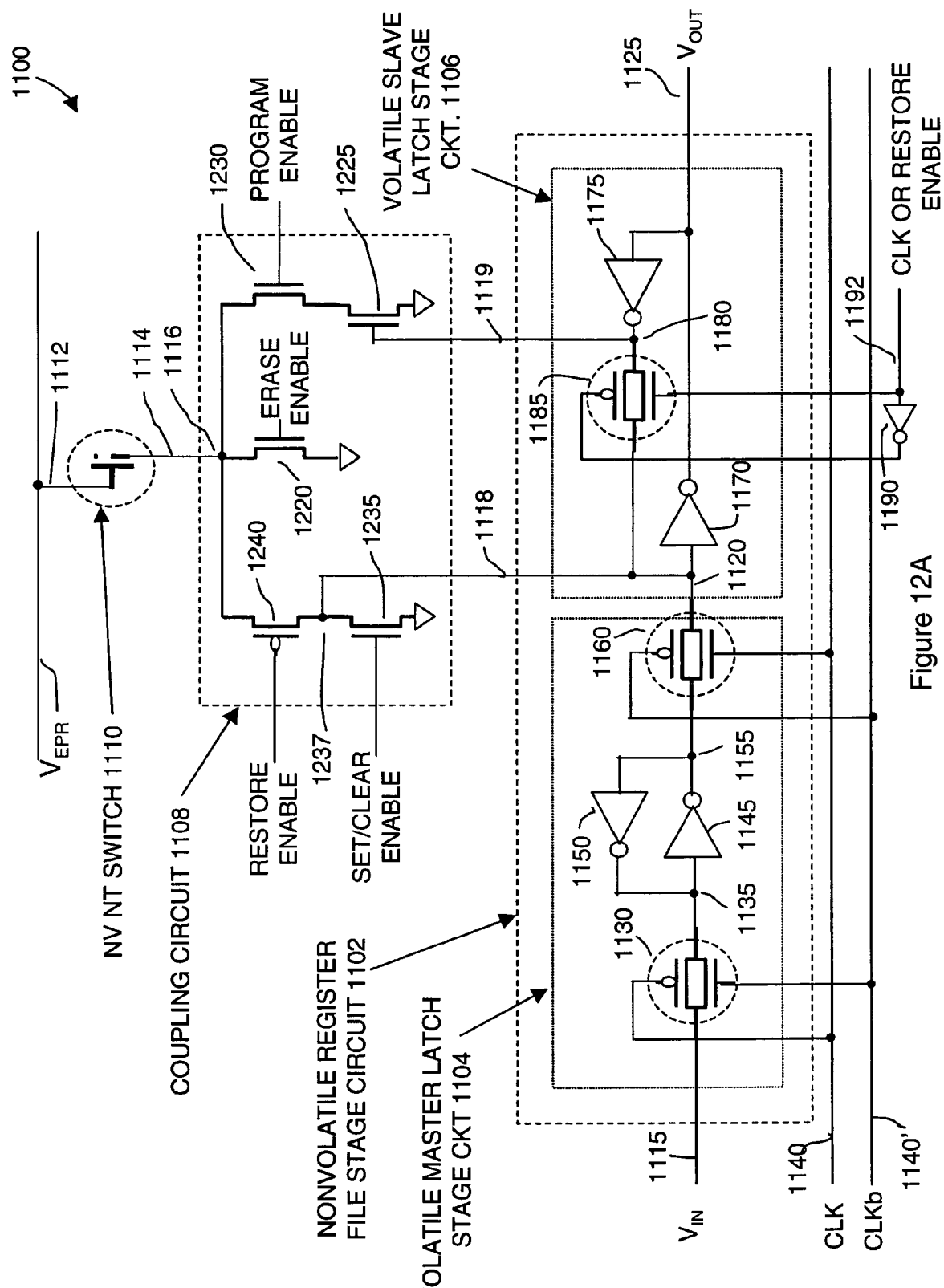
FIG. 12A is a circuit schematic representation of a nonvolatile register file stage circuit including coupling circuit and nonvolatile nanotube storage element according to certain embodiments of the invention.

FIG. 12A illustrates one embodiment of a nonvolatile register file stage circuit 1100 that corresponds to nonvolatile register file stage 1005 in FIG. 11A. Nonvolatile register file stage 1100 has two modes of operation, a normal run mode and a zero power logic state (or data) nonvolatile retention mode in which power is disconnected. Volatile master latch stage circuit 1104 corresponds to volatile master latch stage 1010, volatile slave latch stage circuit 1106 corresponds to volatile slave latch stage 1015, coupling circuit 1108 corresponds to coupling circuit 1020, and nonvolatile nanotube switch 1110 corresponds to nonvolatile nanotube switch 1025 in FIG. 11A. Electrical connection 1112 between nonvolatile nanotube switch 1110 and supply voltage $V_{EPR}$ corresponds to electrical connection 1030, electrical connections 1118 and 1119 between coupling circuit 1108 and volatile slave latch stage circuit 1106 corresponds to electrical connection 1040 in FIG. 11A. Power supply voltage $V_{DD}$ connections to the inverters in volatile master latch stage circuit 1104 (not shown) and volatile slave latch stage circuit 1106 (not shown) correspond to power supply connections $V_{DD}$ in FIG. 11A.

As illustrated in FIG. 12A, input node 1115 of volatile master latch stage circuit 1104 receives input signal $V_{IN}$ and drives CMOS transfer gate 1130, which is connected to and drives storage node 1135 formed by cross coupled CMOS inverters 1145 and 1150. Input signal $V_{IN}$ corresponds to $V_{IN}$ from logic 950 in FIG. 10. CMOS transfer gate 1130 uses both NMOS and PMOS devices instead of an NMOS-only transfer gate, for example, to ensure that both logic "1" and logic "0" states transition between full power supply and ground voltage levels by eliminating device threshold voltage drops. Clock CLK 1140, and complimentary clock CLKb 1140' are used to enable or block input signal $V_{IN}$ on input node 1115 from driving storage node 1135 by turning CMOS transfer gate 1130 ON and OFF, thereby determining the logic storage state of cross coupled CMOS inverters 1145 and 1150. Note that all inverters are CMOS inverters unless otherwise specified. CMOS inverters include a PMOS pull-up device connected to a power supply, and a NMOS pull-down device connected to ground and operates as discussed in the reference by H. B. Bakoglu, "Circuits, Interconnections, and Packaging for VLSI", Addison-Wesley Publishing Company, Inc, 1990, pp. 152. Cross coupled inverters 1145 and 1150 drive storage node 1155 which is connected to CMOS transfer gate 1160. Clock CLK and complimentary clock CLKb are used to enable or block stored logic state node 1155 from driving master latch stage node 1120, by turning CMOS transfer gate 1160 ON and OFF.

As illustrated in FIG. 12A, input node 1120 of volatile slave latch stage circuit 1106, which is also the output node of master latch stage circuit 1104, drives inverter 1170. The output of inverter 1170 is output voltage $V_{OUT}$ on output node 1125, and also drives the input of inverter 1175. Output signal $V_{OUT}$ corresponds to $V_{OUT}$ in FIG. 10, which drives an input to logic 960. The output 1180 of inverter 1175 is connected to CMOS transfer gate 1185. Clock CLK, and complimentary clock CLKb are used to enable or block the presence of a feedback loop that cross couples inverters 1170 and 1175 when enabled. During normal high speed operation, clock CLK switches at high speed, 3 GHz clock rate, for example, for the 130 nm CMOS technology node. Inverter 1190 produces the complement CLKb or clock CLK. When storing data, CMOS transfer gate 1185 is ON and inverters 1170 and 1175 form a cross coupled storage device with node 1120 acting as a storage node. When CMOS transfer gate 1185 is OFF, then inverters 1170 and 1175 are not cross coupled and do not form a storage device. Slave latch stage circuit 1106 is coupled to nonvolatile nanotube switch 1110 by coupling circuit 1108.

As illustrated in FIG. 12A, nonvolatile nanotube switch 1110 is connected to power supply voltage $V_{EPR}$, which supplies erase, program, or restore voltage pulse (or pulses) as required by the corresponding operating mode selected using coupling circuit 1108. Nonvolatile nanotube switch 1110 is also connected to node 1116 of coupling circuit 1108 using electrical connection 1114. Coupling circuit 1108 is connected to volatile slave latch stage circuit 1106, where electrical connection 1119 connected to node 1180 is used in program mode, and electrical connection 1118 is used in restore mode.

As illustrated in FIG. 12A, coupling circuit 1108 includes an erase function. The erase circuit includes NMOS transistor 1220 with drain connected to common node 1116, source connected to ground, and input gate connected to an erase enabling pulse.

As illustrated in FIG. 12A, coupling circuit 1108 also includes a programming function including NMOS transistor 1230 with drain connected to common node 1116, source connected to the drain of series NMOS transistor 1225, and gate connected to a program enable input. Series NMOS transistor 1225 also has source connected to ground, and gate connected to node 1180 of volatile slave latch stage circuit 1106. Transistor 1225 is used to reflect the logic state of volatile slave latch stage circuit 1106. If node 1180 is at a high voltage, $V_{DD}$ for example, then transistor 1225 is in the ON state and can conduct programming current. However, if node 1180 is at a low voltage, zero for example, then transistor 1225 is in the OFF state and cannot conduct programming current.

As illustrated in FIG. 12A, coupling circuit 1108 also includes a restore function including PMOS transistor 1240 with source connected to common node 1116, drain connected to drain of NMOS transistor 1235 at common node 1237, and gate connected to a restore enable input. The source of transistor 1235 is connected to ground and the gate is connected to a set/clear enable input. Common node 1237 is connected to storage node 1120 of volatile slave latch stage circuit 1106.

While in normal run mode, coupling circuit 1108 is inactive, and nonvolatile nanotube switch 1110 is not powered by $V_{EPR}$ and is also decoupled from volatile slave latch stage circuit 1106. Hence, volatile master latch stage circuit 1104 and volatile slave latch stage circuit 1106 operate in a normal (conventional) synchronized logic master/slave register run mode of operation at high speed clock rates, typically 3 GHz, with $V_{DD}$=1.3 volts, for logic products fabricated using the 130 nm technology node.

In normal run mode, at the beginning of a clock cycle, clock CLK 1140 transitions from high to low voltage and remains at low voltage for the first half the clock cycle, and complimentary clock CLKb 1140' transitions from low to high voltage and remains at high voltage for the first half of the clock cycle. CMOS transfer device 1130 turns ON coupling input node 1115 voltage $V_{IN}$ to storage node 1135. CMOS transfer device 1160 turns OFF and isolates the output of volatile master latch stage circuit 1104 from the input node 1120 of volatile slave latch stage circuit 1106. In normal run mode, clock CLK is connected to mode input 1192 of volatile slave latch stage circuit 1106, clock CLK is connected to CMOS transfer device 1185, and complimentary clock CLKb output of inverter 1190 is also connected to CMOS transfer device 1185, such that CMOS transfer device also turns OFF breaking the feedback path between the output 1180 of inverter 1175 and the input 1120 of inverter 1170 such that node 1120 does not act as a storage node. Voltage $V_{IN}$ may transition to a voltage value corresponding to the correct logic state any time prior to the end of the first half of the clock cycle, providing sufficient time remains for cross coupled inverters 1145 and 1150 to store the corresponding logic state on storage node 1155 prior to clock transition at the beginning of the second half of the clock cycle.

In normal run mode, clock CLK 1140 transitions from low to high voltage and remains at high voltage at the beginning of the second half of the clock cycle, and complimentary clock CLKb 1140' transitions from high to low voltage and remains at low voltage for the second half of the clock cycle. CMOS transfer device 1130 turns OFF decoupling input node 1115 voltage $V_{IN}$ from storage node 1135, which remains in a state corresponding to input voltage $V_{IN}$ at the end of the first half of the clock cycle, and storage node 1155 remains in a complimentary state to storage node 1135. CMOS transfer device 1160 turns ON and transfers the state of storage node 1155 to input 1120 of inverter 1170 that drives output node 1125 to output voltage $V_{OUT}$, and also drives the input of inverter 1175. In normal run mode, clock CLK is connected to mode input 1192 of volatile slave latch stage circuit 1106, clock CLK is connected to CMOS transfer device 1185, and complimentary clock CLKb output of inverter 1190 is also connected to CMOS transfer device 1185, such that CMOS transfer device also turns ON forming the feedback path between the output 1180 of inverter 1175 and the input 1120 of inverter 1170 such that node 1120 acts as a storage node. With CMOS transfer device 1185 turned ON, output 1180 of inverter 1175 drives the input of inverter 1170 and stores the state of slave latch state stage circuit 1110 until the end of the second stage of the clock cycle.

While in zero power logic state (or data) nonvolatile retention mode, coupling circuit 1108 is inactive, nonvolatile nanotube switch 1110 is not powered by $V_{EPR}$, and is also decoupled from volatile slave latch stage circuit 1106. Volatile master latch stage circuit 1104 and volatile slave latch stage circuit 1106 power supplies are at zero volts.

In operation, when transitioning from normal run mode to zero power nonvolatile retention mode, coupling circuit 1108 must transfer the logic state from volatile slave latch stage circuit 1106 to nonvolatile nanotube switch 1110 before power is turned OFF. As illustrated in waveforms 1250 in FIG. 12B, while power remains ON, clock CLK is stopped in a low voltage state, with complimentary clock CLKb in a high voltage state, where a high voltage state is at $V_{DD}$ (1.3 to 2.5 volts, for example) and a low voltage state is at zero volts. If nonvolatile nanotube 1110 has not been erased, and is therefore storing a previous logic state, then coupling circuit 1108 is directed to perform an erase operation, followed by a program operation. If nonvolatile nanotube 1110 is in an erased state, then program mode is initiated using coupling circuit 1108.

During the erase operation, an erase enable pulse transitions from zero volts to $V_{DD}$ (1.3 to 2.5 volts, for example) turning transistor 1220 ON and providing a conducting path between node 1116 and ground as illustrated in figure 12A. Program enable voltage is at zero volts, transistor 1230 is OFF, and there is no conducting path between node 1116 and ground. Restore enable voltage is at $V_{DD}$ (1.3 to 2.5 volts, for example), transistor 1240 is OFF, and there is no conducting path from node 1116 through transistor 1240. Also, set/clear enable voltage is also at zero volts, transistor 1235 is OFF. There is no conducting path between common node 1237 and node 1116 or ground, so that the state of volatile slave latch stage circuit 1106 at node 1120 is not disturbed. A $V_{EPR}$ erase voltage pulse of amplitude $V_E$ is applied to nonvolatile nanotube switch 1110 terminal. The resistance of transistor 1220 is much less than the resistance of nonvolatile nanotube switch 1110, even if switch 1110 is in the ON state. If switch 1110 is in the ON state, then current flows between node 1112, through switch 1110 and electrical connection 1114 and the channel of ON transistor 1220 to ground, and nonvolatile nanotube switch 1110 is switched to the OFF (erased) state. If switch 1110 is in the OFF state, it remains in the OFF (erased) state. Note that nonvolatile nanotube switch 1110 may be erased at any time prior to programming. If switch 1110 is known to be in the erased state, then programming can begin immediately. Erase stimuli according to certain embodiments of the invention are described in greater detail in U.S. patent application Ser. No. 11/280,786, filed on Nov. 15, 2005, entitled "Two-Terminal Nanotube Devices And Systems And Methods Of Making Same."

Note that during the erase operation, transistors 1240, 1235, and 1230 are all OFF, isolating nonvolatile nanotube switch 1110 from volatile slave latch stage circuit 1106. Therefore, the erase operation may be performed any time during the normal run mode without impacting the performance of volatile slave latch stage circuit 1106, and can therefore be made transparent to the logic operation of the device.

Figure 12B:
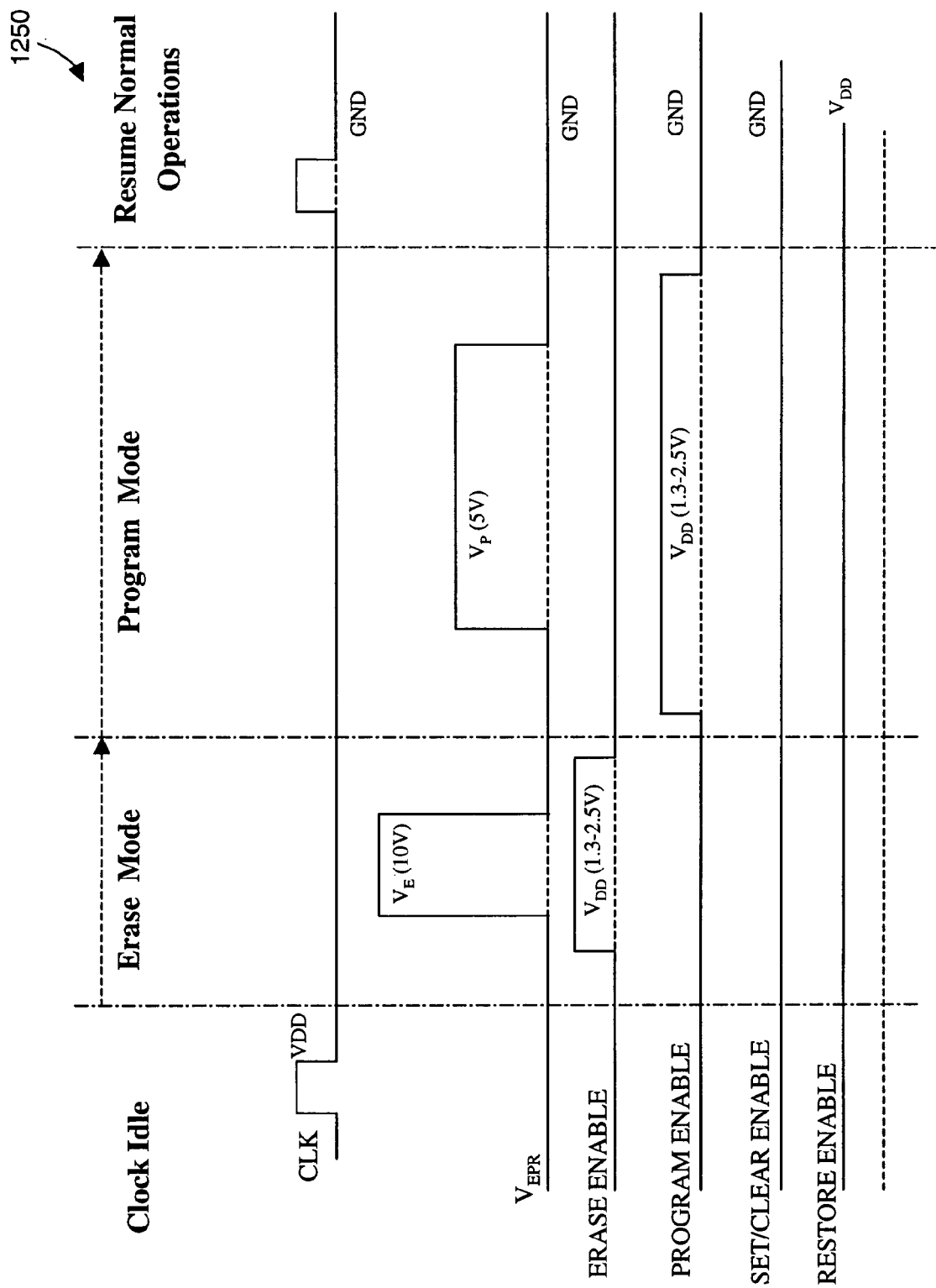
FIG. 12B is an illustration of operational waveforms for a power-ON to power-OFF transition in which a logic state (or data) on a volatile slave latch state circuit is transferred to a nonvolatile nanotube switch, then followed by power-OFF according to certain embodiments of the invention.

As illustrated in figure 12B, during the program operation, a program enable pulse transitions from zero volts to $V_{DD}$ turning transistor 1230 ON, connecting node 1116 to the drain of transistor 1225. Transistor 1225 is OFF if node 1180 of volatile slave latch stage circuit 1106 is at a low voltage, zero for example. Transistor 1225 is ON if node 1180 of volatile slave latch stage circuit 1106 is at a high voltage, $V_{DD}$ for example. After the program enable pulse transitions from zero to $V_{DD}$, then a $V_{EPR}$ pulse of amplitude $V_p$ (5 volts, for example) is applied to node 1112 of switch 1110. If transistor 1225 is OFF, then no current flows, no programming takes place, and nonvolatile nanotube switch 1110 remains in the OFF (OPEN) erased state. However, if transistor 1225 is ON, then current flows, programming takes place, and nonvolatile nanotube switch 1110 transitions from an OFF (OPEN) state to an ON (CLOSED) state. Programming stimuli according to certain embodiments of the invention are described in greater detail in U.S. patent application Ser. No. 11/280,786, filed on Nov. 15, 2005, entitled "Two-Terminal Nanotube Devices And Systems And Methods Of Making Same."

During the program operation, the erase enable voltage is held at zero volts and transistor 1220 is OFF. Also, the restore enable voltage is held at $V_{DD}$ so that transistor 1240 is OFF. Also, set/clear restore voltage is held at zero so transistor 1235 is OFF, such that only the program operation is enabled.

Figure 12C:
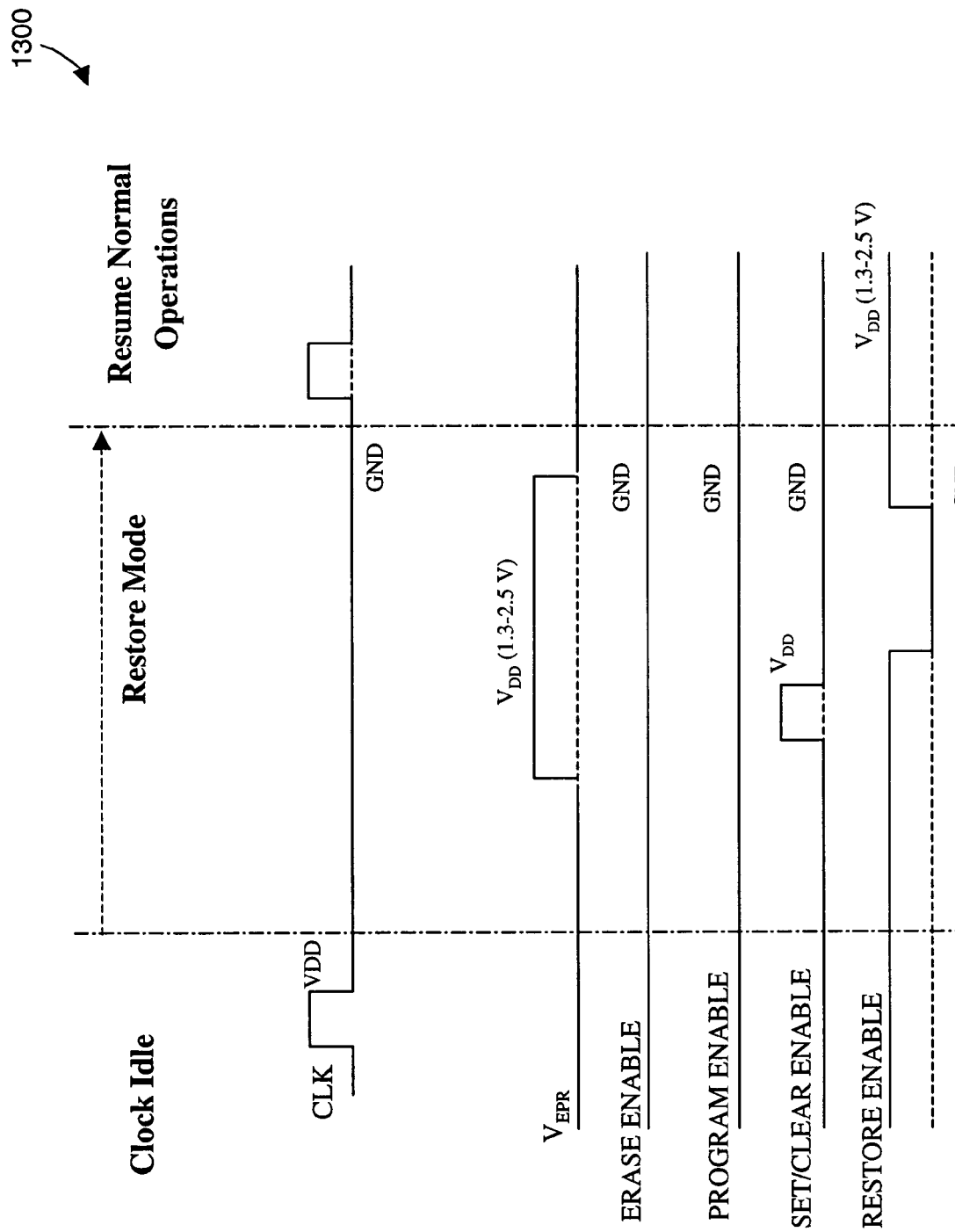
FIG. 12C is an illustration of operation waveforms for a power-OFF to power-ON transition in which a logic state (or data) stored on a nonvolatile nanotube switch is transferred to a volatile slave latch state circuit, then followed by normal clocked operation according to certain embodiments of the invention.

In operation, when transitioning from zero power nonvolatile retention mode to normal run mode, coupling circuit 1108 must transfer the logic state from nonvolatile nanotube switch 1110 to volatile slave latch stage circuit 1106 after power supply $V_{DD}$ is restored, but before clock operation begins. As illustrated in FIG. 12C, even after $V_{DD}$ is restored, clock CLK remains stopped in a low voltage state, with complimentary clock CLKb in a high voltage state, where a high voltage state is at $V_{DD}$ (1.3 to 2.5 volts, for example) and a low voltage state is at zero volts.

As illustrated by waveforms 1300 in FIG. 12C, during the restore operation, a $V_{EPR}$ pulse of amplitude $V_{DD}$ (1.3-2.5 volts, for example) is applied to terminal 1112 of nonvolatile nanotube switch 1110 illustrated in FIG. 12A. With clock pulse CLK at zero volts, CMOS transfer gate 1160 of volatile master latch stage circuit 1104 is OFF, isolating volatile slave latch stage circuit 1106. At the beginning of the restore operation, the restore enable level applied to input 1192 of inverter 1190 and CMOS transfer gate 1185 is at $V_{DD}$, and its compliment at the output of inverter 1190 applied to CMOS transfer gate 1185, turn CMOS transfer gate 1185 ON. With transfer gate 1185 ON, output 1180 of inverter 1175 is electrically connected to input 1120 of inverter 1170; a storage device is formed with 1120 as a storage node. With restore enable voltage at $V_{DD}$, transistor 1240 is OFF. With set/clear enable at zero volts, transistor 1235 is OFF; therefore the common node 1237 voltage is determined by node 1120 of volatile slave latch stage circuit 1106. After the restoration of power supply connection to $V_{DD}$ to volatile slave latch stage circuit 1106, node 1120 may be at a voltage of zero or $V_{DD}$. After the transition of $V_{EPR}$ to restore pulse voltage $V_{DD}$, a set/clear enable pulse turns transistor 1235 ON, and node 1120 is forced to ground (zero volts). Set/clear enable pulse is then turned OFF, leaving storage node 1120 at zero volts. Next, restore enable pulse transitions from $V_{DD}$ to ground. CMOS transfer gate 1185 is turned OFF, breaking the feedback path between inverters 1175 and 1170 such that node 1120 is no longer behaves as a storage node. At the same time, transistor 1240 turns ON and connects nonvolatile nanotube switch 1110 to node 1120. If nonvolatile nanotube switch 1110 is ON (CLOSED), then voltage $V_{EPR}$ on node 1112 is applied through transistor 1240 to node 1120, the input of inverter 1170. If nonvolatile nanotube switch 1110 is OFF (OPEN) then node 1120 remains at ground. By having CMOS transfer gate 1185 OFF facilitates the restore operation because voltage supplied through nonvolatile nanotube switch 1110 only has the small input load of inverter 1170 input, and does not have to overcome a latched storage state. Next, when the restore/enable pulse transitions from zero volts to $V_{DD}$, CMOS transfer gate 1185 turns on and the logic state (or data) is stored on node 1120, with the compliment stored on the output node 1125. Transistor 1240 turns OFF and decouples nonvolatile nanotube switch 1120 from volatile slave latch stage circuit 1106. The restore operation is estimated to take just a few nanoseconds. Normal run mode then begins.

During the restore operation, the erase enable voltage is held at zero volts and transistor 1220 is OFF. Also, the program enable voltage is held at zero volts, and transistor 1230 is OFF such that only the restore operation is enabled.

Figure 13A:
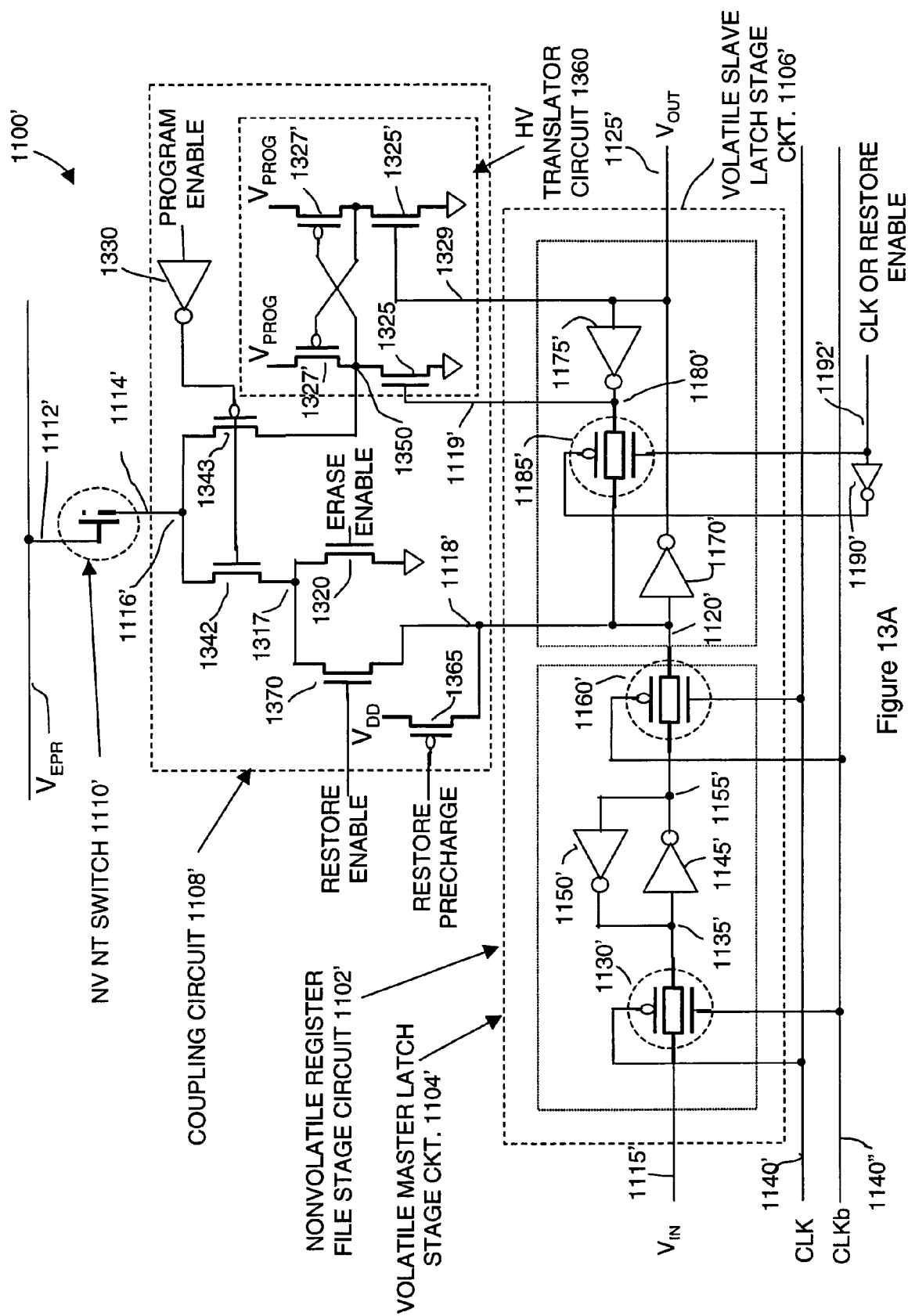
FIG. 13A is a circuit schematic representation of a non-volatile register file stage circuit including coupling circuit and nonvolatile nanotube storage element according to certain embodiments of the invention.

FIG. 13A illustrates a second embodiment of a nonvolatile register file stage circuit 1100' that corresponds to nonvolatile register file stage 1005 in FIG. 11A. Nonvolatile register file stage 1100' has two modes of operation, a normal run mode and a zero power logic state (or data) nonvolatile retention mode in which power is disconnected. Volatile master latch stage circuit 1104' corresponds to volatile master latch stage 1010, volatile slave latch stage circuit 1106' corresponds to volatile slave latch stage 1015, coupling circuit 1108' corresponds to coupling circuit 1020, and nonvolatile nanotube switch 1110' corresponds to nonvolatile nanotube switch 1025 in FIG. 11A. Electrical connection 1112' between nonvolatile nanotube switch 1110' and supply voltage $V_{EPR}$ corresponds to electrical connection 1030, electrical connections 1118', 1119', and 1329 between coupling circuit 1108' and volatile slave latch stage circuit 1106' corresponds to electrical connection 1040 in FIG. 11A. Power supply voltage $V_{DD}$ connections to the inverters in volatile master latch stage circuit 1104 (not shown) and volatile slave latch stage circuit 1106 (not shown) correspond to power supply connections $V_{DD}$ in FIG. 11A.

As illustrated in FIG. 13A, input node 1115' of volatile master latch stage circuit 1104' receives input signal $V_{IN}$ and drives CMOS transfer gate 1130', which is connected to and drives storage node 1135' formed by cross coupled CMOS inverters 1145' and 1150'. Input signal $V_{IN}$ corresponds to $V_{IN}$ from logic 950 in FIG. 10. CMOS transfer gate 1130' uses both NMOS and PMOS devices instead of an NMOS-only transfer gate, for example, to ensure that both logic "1" and logic "0" states transition between full power supply and ground voltage levels by eliminating device threshold voltage drops. Clock CLK 1140, and complimentary clock CLKb 1140' are used to enable or block input signal $V_{IN}$ on input node 1115' from driving storage node 1135; by turning CMOS transfer gate 1130' ON and OFF, thereby determining the logic storage state of cross coupled CMOS inverters 1145' and 1150'. Note that all inverters are CMOS inverters unless otherwise specified. CMOS inverters include a PMOS pull-up device connected to a power supply, and a NMOS pull-down device connected to ground and operates as discussed in the reference by H. B. Bakoglu, "Circuits, Interconnections, and Packaging for VLSI", Addison-Wesley Publishing Company, Inc, 1990, pp. 152. Cross coupled inverters 1145' and 1150' drive storage node 1155' which is connected to CMOS transfer gate 1160'. Clock CLK and complimentary clock CLKb are used to enable or block stored logic state node 1155' from driving master latch stage circuit 1106' input node 1120' by turning CMOS transfer gate 1160' ON and OFF.

As illustrated in FIG. 13A, input node 1120' of volatile slave latch stage circuit 1106', which is also the output node of master latch stage circuit 1104', drives inverter 1170'. The output of inverter 1170' is output voltage $V_{OUT}$ on output node 1125', and also drives the input of inverter 1175'. Output signal $V_{OUT}$ corresponds to $V_{OUT}$ in FIG. 10, which drives an input to logic 960. The output 1180' of inverter 1175' is connected to CMOS transfer gate 1185'. Clock CLK, and complimentary clock CLKb are used to enable or block the presence of a feedback loop that cross couples inverters 1170' and 1175' when enabled. During normal high speed operation, clock CLK switches at high speed, 3 GHz clock rate, for example, for the 130 nm CMOS technology node. Inverter 1190' produces the complement CLKb or clock CLK. When storing data, CMOS transfer gate 1185' is ON and inverters 1170' and 1175' form a cross coupled storage device with node 1120' acting as a storage node. When CMOS transfer gate 1185' is OFF, then inverters 1170' and 1175' are not cross coupled and do not form a storage device. Slave latch stage circuit 1106' is coupled to nonvolatile nanotube switch 1110' by coupling circuit 1108'.

As illustrated in FIG. 13A, nonvolatile nanotube switch 1110' is connected to power supply voltage $V_{EPR}$, which supplies erase voltage pulse (or pulses) as required by the corresponding operating mode selected using coupling circuit 1108'. Nonvolatile nanotube switch 1110' is also connected to node 1116' of coupling circuit 1108' using electrical connection 1114'. Coupling circuit 1108' is connected to volatile slave latch stage circuit 1106', where electrical connections 1119' and 1329 connected to node 1180' are used in program mode, and electrical connection 1118' is used in restore mode.

As illustrated in FIG. 13A, coupling circuit 1108' includes an erase function. The erase circuit includes NMOS transistor 1220' with drain connected to common node 1317, source connected to ground, and input gate connected to an erase enabling pulse. During an erase operation, transistor 1343 is activated by a program enable pulse at zero volts, and common node 1317 is connected to common node 1116', which is connected to nonvolatile nanotube switch 1110 in order to enable an erase operation As illustrated in FIG. 13A, coupling circuit 1108' also includes a programming function including PMOS transistor 1343 with drain connected to common node 1116', source connected to common node 1350, and gate connected to output of inverter 1330, with the input of inverter 1330 connected to a program enable input. Common node 1350 is connected to cross coupled NMOS transistors 1325 and 1325' and PMOS transistors 1327 and 1327' forming high voltage translation circuit 1360. The sources of NMOS transistors 1325 and 1325' are connected to ground, and the sources of PMOS transistors 1327 and 1327' are connected to program voltage $V_{PROG}$ Complementary inputs 1119' and 1329 are connected to high voltage translator circuit 1360 input NMOS transistor 1325 and NMOS 1325', respectively, such that the logic state of high voltage translator circuit 1360 corresponds to the state of volatile slave latch stage 1106'. $V_{PROG}$ voltage may be much higher than volatile slave latch stage voltage circuit 1106'. Programming voltage is applied to common node 1350 through PMOS transistor 1327, which is in turn applied to common node 1116' and nonvolatile nanotube switch 1110' through PMOS transistor 1343. If common node 1350 is held at ground by NMOS transistor 1325, then no programming voltage is applied to common node 1350, and nonvolatile nanotube switch 1110' is not programmed.

As illustrated in FIG. 13A, coupling circuit 1108' also includes a restore function including PMOS transistor 1365 with source connected to $V_{DD}$, and drain connected to volatile slave latch stage circuit 1106' input 1120' by connector 1118'. During a restore operation, PMOS transistor 1365 is used to pre-charge input node 1120' to $V_{DD}$, and then is turned OFF. NMOS transistor 1370 has source connected to input 1120' by connector 1118', drain connected to common node 1317, and gate connected to a restore enable input. NMOS transistor 1342 is in the ON state during a restore operation, and provides a discharge path between input node common node 1317 and $V_{EPR}$, through nonvolatile nanotube switch 1110'. $V_{EPR}$ is at zero volts during a restore operation. When transistor 1370 is activated by a restore enable input, if nonvolatile nanotube switch 1110' is ON, then input node 1120' is discharged; if nonvolatile switch 1110' is OFF, then input node remains at $V_{DD}$. The state of volatile slave latch stage circuit 1106' is restored to a state corresponding to the nonvolatile state of nonvolatile nanotube switch 1110'.

While in normal run mode, coupling circuit 1108' is inactive, and nonvolatile nanotube switch 1110' is not powered by $V_{EPR}$ and is also decoupled from volatile slave latch stage circuit 1106'. Hence, volatile master latch stage circuit 1104' and volatile slave latch stage circuit 1106' operate in a normal (conventional) synchronized logic master/slave register run mode of operation at high speed clock rates, typically 3 GHz, with $V_{DD}$=1.3 volts, for logic products fabricated using the 130 nm technology node.

In normal run mode, at the beginning of a clock cycle, clock CLK 1140 transitions from high to low voltage and remains at low voltage for the first half the clock cycle, and complimentary clock CLKb 1140' transitions from low to high voltage and remains at high voltage for the first half of the clock cycle. CMOS transfer device 1130' turns ON coupling input node 1115' voltage $V_{IN}$ to storage node 1135'. CMOS transfer device 1160' turns OFF and isolates the output of volatile master latch stage circuit 1104' from the input node 1120' of volatile slave latch stage circuit 1106'. In normal run mode, clock CLK is connected to mode input 1192' of volatile slave latch stage circuit 1106', clock CLK is connected to CMOS transfer device 1185', and complimentary clock CLKb output of inverter 1190' is also connected to CMOS transfer device 1185', such that CMOS transfer device also turns OFF breaking the feedback path between the output 1180' of inverter 1175' and the input 1120' of inverter 1170' such that node 1120' does not act as a storage node. Voltage $V_{IN}$ may transition to a voltage value corresponding to the correct logic state any time prior to the end of the first half of the clock cycle, providing sufficient time remains for cross coupled inverters 1145' and 1150' to store the corresponding logic state on storage node 1155' prior to clock transition at the beginning of the second half of the clock cycle.

In normal run mode, clock CLK 1140 transitions from low to high voltage and remains at high voltage at the beginning of the second half of the clock cycle, and complimentary clock CLKb 1140' transitions from high to low voltage and remains at low voltage for the second half of the clock cycle. CMOS transfer device 1130' turns OFF decoupling input node 1115' voltage $V_{IN}$ from storage node 1135', which remains in a state corresponding to input voltage $V_{IN}$ at the end of the first half of the clock cycle, and storage node 1155' remains in a complimentary state to storage node 1135'. CMOS transfer device 1160' turns ON and transfers the state of storage node 1155' to input 1120' of inverter 1170' that drives output node 1125' to output voltage $V_{OUT}$, and also drives the input of inverter 1175'. In normal run mode, clock CLK is connected to mode input 1192' of volatile slave latch stage circuit 1106', clock CLK is connected to CMOS transfer device 1185', and complimentary clock CLKb output of inverter 1190' is also connected to CMOS transfer device 1185', such that CMOS transfer device also turns ON forming the feedback path between the output 1180' of inverter 1175' and the input 1120' of inverter 1170' such that node 1120' acts as a storage node. With CMOS transfer device 1185' turned ON, output 1180' of inverter 1175' drives the input of inverter 1170' and stores the state of slave latch state stage circuit 1110' until the end of the second stage of the clock cycle.

While in zero power logic state (or data) nonvolatile retention mode, coupling circuit 1108' is inactive, nonvolatile nanotube switch 1110' is not powered by $V_{EPR}$, and is also decoupled from volatile slave latch stage circuit 1106'. Volatile master latch stage circuit 1104' and volatile slave latch stage circuit 1106' power supplies are at zero volts.

In operation, when transitioning from normal run mode to zero power nonvolatile retention mode, coupling circuit 1108' transfers the logic state from volatile slave latch stage circuit 1106' to nonvolatile nanotube switch 1110' before power is turned OFF. As illustrated in waveforms 1250' in FIG. 13B, while power remains ON, clock CLK is stopped in a low voltage state, with complimentary clock CLKb in a high voltage state, where a high voltage state is at $V_{DD}$ (1.3 to 2.5 volts, for example) and a low voltage state is at zero volts. If nonvolatile nanotube 1110' has not been erased, and is therefore storing a previous logic state, then coupling circuit 1108' is directed to perform an erase operation, followed by a program operation. If nonvolatile nanotube 1110 is in an erased state, then program mode is initiated using coupling circuit 1108'.

During an erase operation, program enable input voltage is at zero volts, and transistor 1342 is held in an ON state by the output of inverter 1330. An erase enable pulse transitions from zero volts to $V_{DD}$ (1.3 to 2.5 volts, for example) turning transistor 1320 ON and providing a conducting path between node 1116' and ground, through ON transistors 1342 and 1320 as illustrated in figure 13A. With program enable voltage at zero volts, transistor 1343 is held in the OFF state by the output of inverter 1330. Restore enable voltage is at zero volts and transistor 1370 is OFF, and restore pre-charge voltage is at $V_{DD}$ and transistor 1365 is OFF input 1120' is isolated so that the state of volatile slave latch stage circuit 1106' at node 1120 is not disturbed. A $V_{EPR}$ erase voltage pulse of amplitude $V_E$ is applied to nonvolatile nanotube switch 1110' terminal. The resistance of transistors 1342 and 1320 in series is much less than the resistance of nonvolatile nanotube switch 1110', even if switch 1110' is in the ON state. If switch 1110' is in the ON state, then current flows between node 1112', through switch 1110' and electrical connection 1114' and the channels of ON transistors 1342 and 1320 to ground, and nonvolatile nanotube switch 1110' is switched to the OFF (erased) state. If switch 1110' is in the OFF state, it remains in the OFF (erased) state. Note that nonvolatile nanotube switch 1110' may be erased at any time prior to programming. If switch 1110' is known to be in the erased state, then programming can begin immediately. Erase stimuli according to certain embodiments of the invention are described in greater detail in U.S. patent application Ser. No. 11/280,786, filed on Nov. 15, 2005, entitled "Two-Terminal Nanotube Devices And Systems And Methods Of Making Same."

Note that during the erase operation, transistors 1370, 1365, and 1343 are all OFF, isolating nonvolatile nanotube switch 1110' from volatile slave latch stage circuit 1106'. Therefore, the erase operation may be performed any time during the normal run mode without impacting the performance of volatile slave latch stage circuit 1106', and can therefore be made transparent to the logic operation of the device.

Figure 13B:
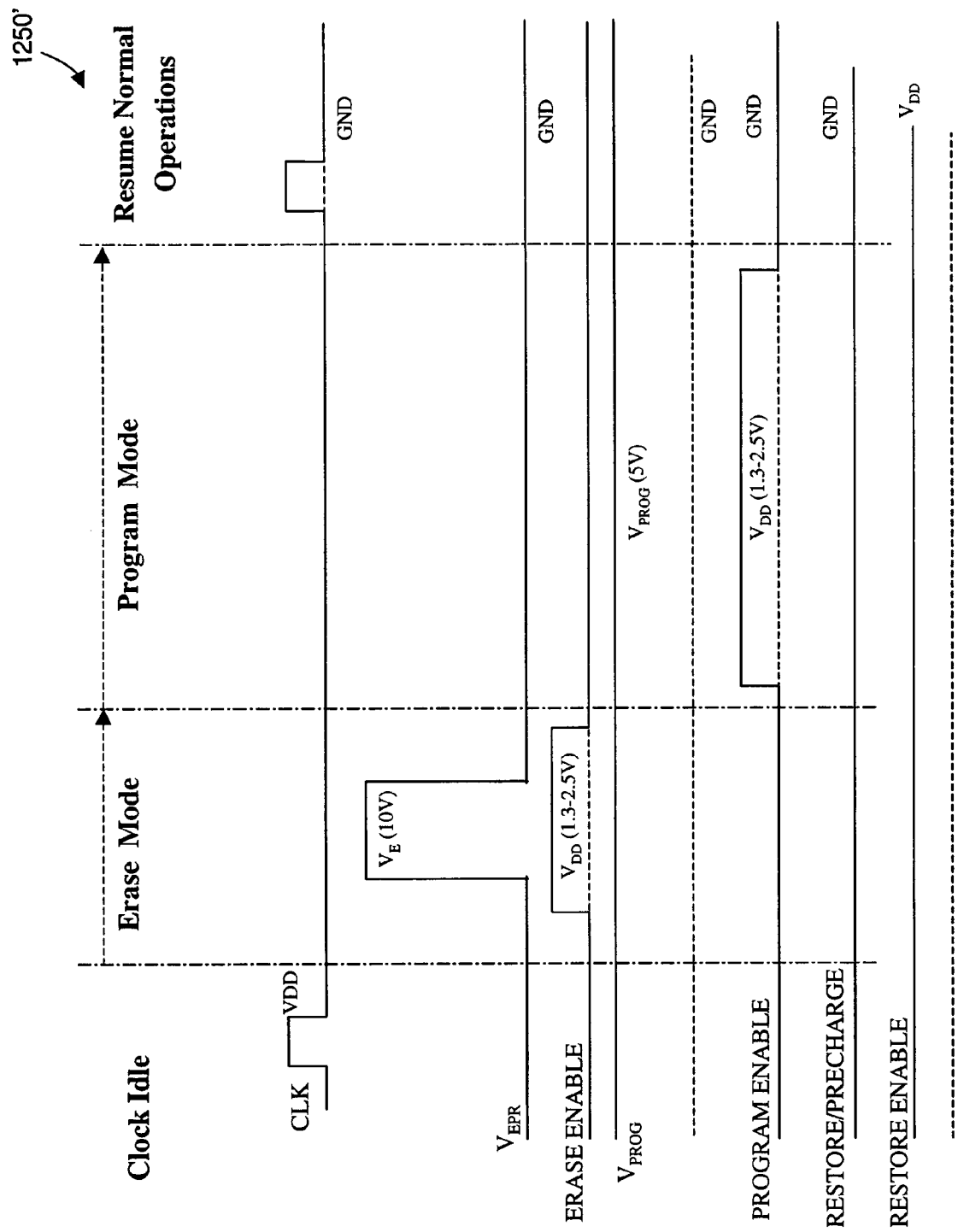
FIG. 13B is an illustration of operational waveforms for a power-ON to power-OFF transition in which a logic state (or data) on a volatile slave latch state circuit is transferred to a nonvolatile nanotube switch, then followed by power-OFF according to certain embodiments of the invention.

As illustrated in figure 13B, during the program operation, $V_{EPR}$ is at zero volts, and a program enable pulse transitions from zero volts to $V_{DD}$ turning transistor 1343 ON connecting node 1116' to common node 1350, which is also the output of high voltage translator circuit 1360. Common node 1350 is at high voltage $V_{PROG}$ if PMOS transistor 1350 is ON and NMOS transistor 1325 is OFF; common node 1350 is at zero volts if NMOS transistor 1325 is ON and PMOS transistor 1327 is OFF. If common node 1350 is at high voltage $V_{PROG}$, then current flows and nonvolatile nanotube switch 1110' transitions from an OFF to an ON state. However, common node 1350 is at ground, then nonvolatile nanotube switch 1110' remains in the OFF state. Programming stimuli according to certain embodiments of the invention are described in greater detail in U.S. patent application No. 11/280,786, filed on Nov. 15, 2005, entitled "Two-Terminal Nanotube Devices And Systems And Methods Of Making Same."

During the program operation, the erase enable voltage is held at zero volts and transistor 1320 is OFF. Transistor 1342 is held in the OFF position by the output of inverter 1330. Also, the restore enable voltage is held at zero volts so that transistor 1370 is OFF. Also, restore precharge voltage is held at zero so transistor 1365 is OFF, such that only the program operation is enabled.

Figure 13C:
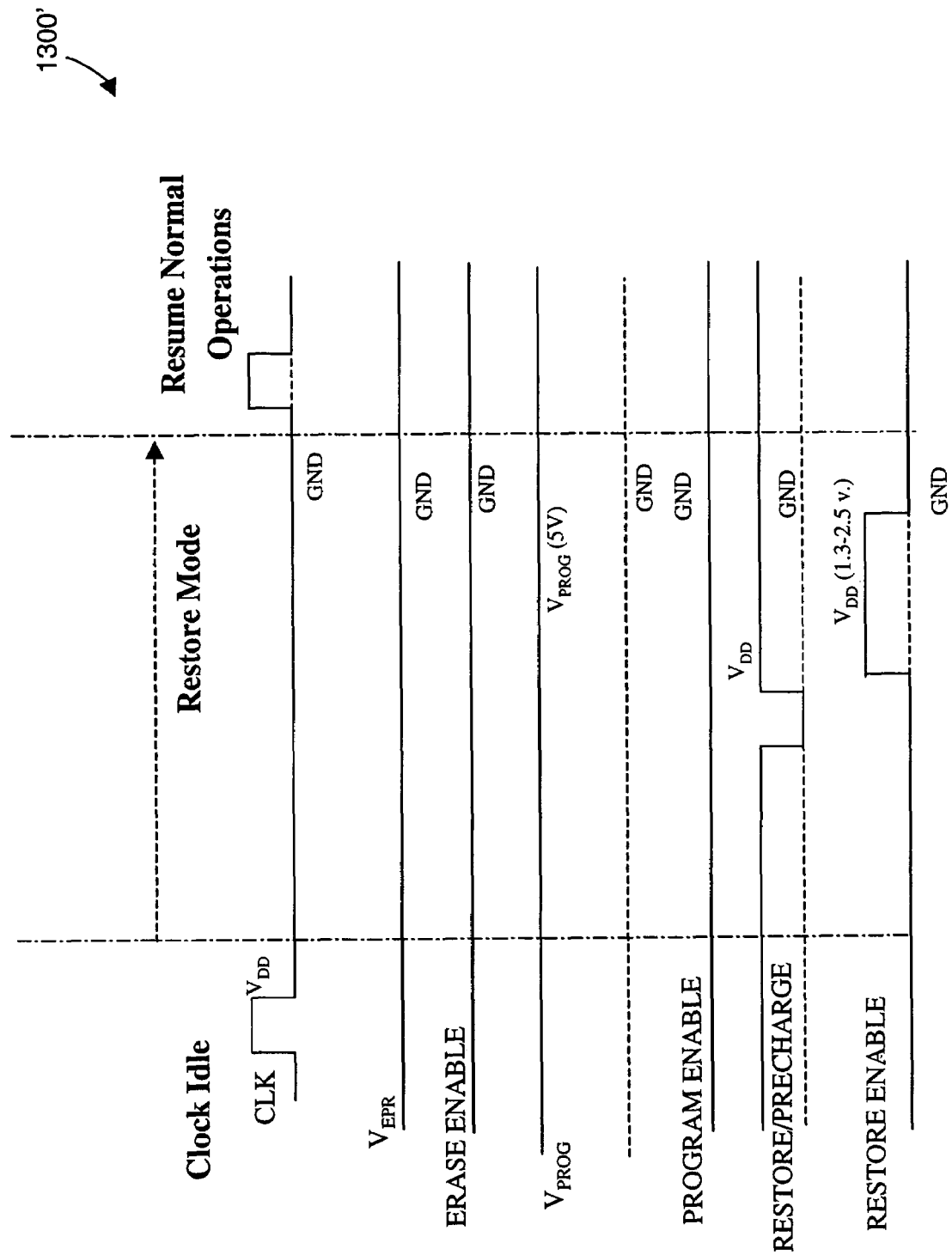
FIG. 13C is an illustration of operation waveforms for a power-OFF to power-ON transition in which a logic state (or data) stored on a nonvolatile nanotube switch is transferred to a volatile slave latch state circuit, then followed by normal clocked operation according to certain embodiments of the invention.

In operation, when transitioning from zero power nonvolatile retention mode to normal run mode, coupling circuit 1108' transfers the logic state from nonvolatile nanotube switch 1110' to volatile slave latch stage circuit 1106' after power supply $V_{DD}$ is restored, but before clock operation begins. As illustrated in FIG. 13C, even after $V_{DD}$ is restored, clock CLK remains stopped in a low voltage state, with complimentary clock CLKb in a high voltage state, where a high voltage state is at $V_{DD}$ (1.3 to 1.8 volts, for example) and a low voltage state is at zero volts.

As illustrated by waveforms 1300 in FIG. 13C, during the restore operation, a $V_{EPR}$ is held at ground (zero volts) and zero volts is applied to terminal 1112' of nonvolatile nanotube switch 1110' illustrated in FIG. 13A. With clock pulse CLK at zero volts, CMOS transfer gate 1160' of volatile master latch stage circuit 1104' is OFF, isolating volatile slave latch stage circuit 1106'. At the beginning of the restore operation, the restore enable level applied to input 1192' of inverter 1190' and CMOS transfer gate 1185' is at $V_{DD}$, and its compliment at the output of inverter 1190' applied to CMOS transfer gate 1185', turn CMOS transfer gate 1185' ON. With transfer gate 1185' ON, output 1180' of inverter 1175' is electrically connected to input 1120' of inverter 1170'; a storage device is formed with 1120' as a storage node. Restore precharge voltage pulse transitions from $V_{DD}$ to ground and back to $V_{DD}$, briefly turning transistor 1365 ON and precharging node 1120' to a positive voltage. Next, restore enable voltage transistor 1370 ON, connecting node 1120' to common node 1317. Program enable input voltage is at zero volts during a restore operation, and the output of inverter 1330 holds transistor 1342 in the ON state connecting common node 1370 to common node 1116', and to one terminal of nonvolatile nanotube switch 1110' through connector 1114'. With transistors 1370 and 1342 in the ON state, volatile slave latch stage circuit 1106' is connected to $V_{EPR}$ which is held at ground (zero volts). With the restoration of power supply connection to $V_{DD}$ to volatile slave latch stage circuit 1106' prior to the start of the restore operation, and the precharging of node 1120' to $V_{DD}$ prior to the start of the restore enable operation, volatile slave latch stage circuit 1106' is in a state with node 1120' at $V_{DD}$. If nonvolatile nanotube switch 1110 is ON (CLOSED), then voltage $V_{DD}$ on node 1120' is discharged, and the input of inverter 1170' transitions to ground. If nonvolatile nanotube switch 1110 is OFF (OPEN) then node 1120', the input of inverter 1170', remains at $V_{DD}$. By having CMOS transfer gate 1185' OFF facilitates the restore operation because voltage supplied through nonvolatile nanotube switch 1110' only has the small input load of inverter 1170' input, and does not have to overcome a latched storage state. Next, when the restore enable pulse transitions from $V_{DD}$ to zero volts, CMOS transfer gate 1185' turns on and the logic state (or data) is stored on node 1120', with the compliment stored on the output node 1125'. Transistor 1370 turns OFF and decouples nonvolatile nanotube switch 1120' from volatile slave latch stage circuit 1106'. The restore operation is estimated to take just a few nanoseconds. Normal run mode then begins.

During the restore operation, the erase enable voltage is held at zero volts and transistor 1320 is OFF. Also, the program enable voltage is held at zero volts, and transistor 1343 is OFF and transistor 1342 is ON such that only the restore operation is enabled.

Figure 14A:
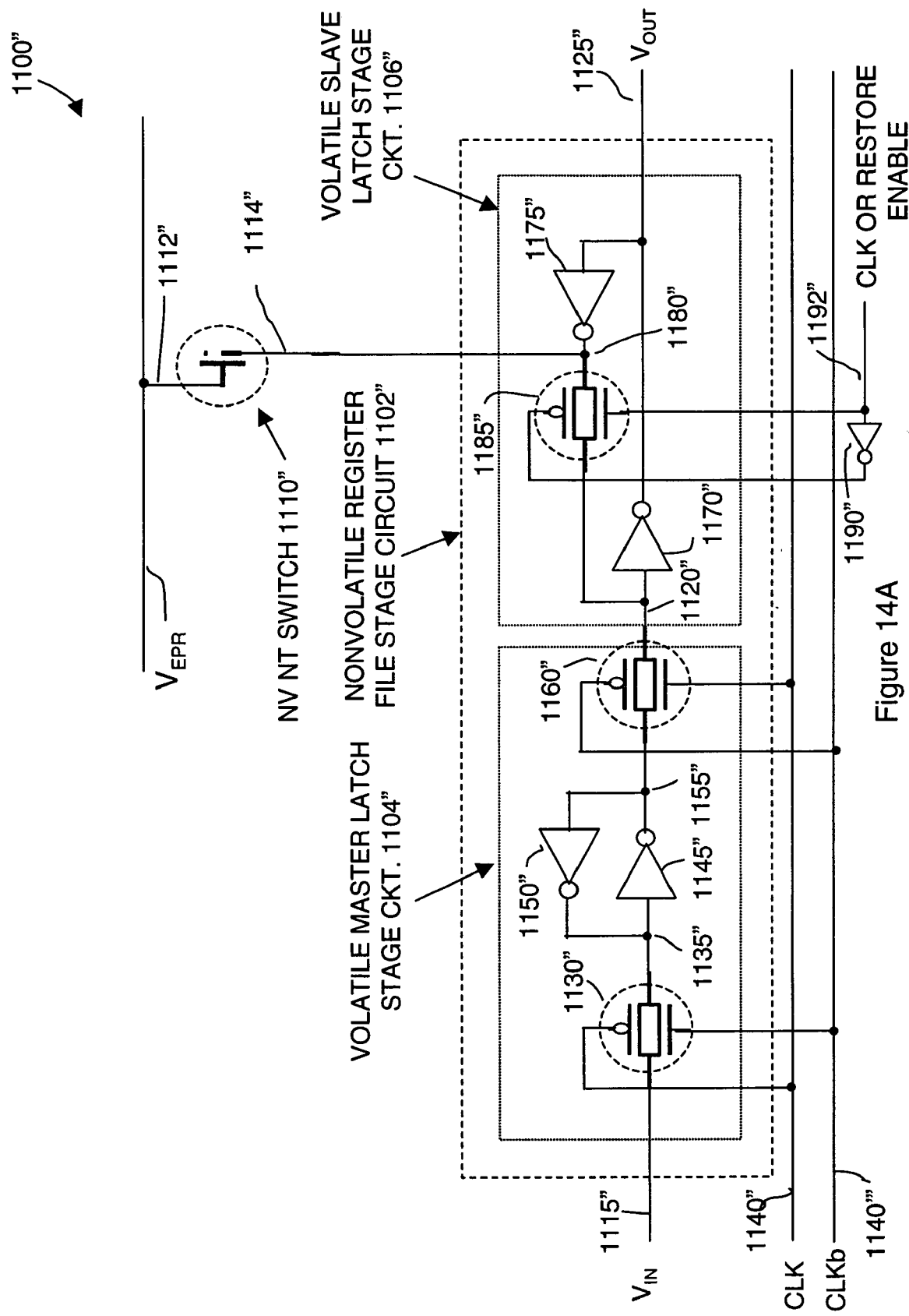
FIG. 14A is a circuit schematic representation of a non-volatile register file stage circuit including nonvolatile nanotube storage element according to certain embodiments of the invention.

FIG. 14A illustrates a third embodiment of a nonvolatile register file stage circuit 1100" that corresponds to nonvolatile register file stage 1005' in FIG. 11B. Nonvolatile register file stage 1100" has two modes of operation, a normal run mode and a zero power logic state (or data) nonvolatile retention mode in which power is disconnected. Volatile master latch stage circuit 1104" corresponds to volatile master latch stage 1010', volatile slave latch stage circuit 1106" corresponds to volatile slave latch stage 1015', and nonvolatile nanotube switch 1110" corresponds to nonvolatile nanotube switch 1025' in FIG. 11B. Electrical connection 1112" between nonvolatile nanotube switch 1110" and supply voltage $V_{EPR}$ corresponds to electrical connection 1030', electrical connection 1114" between nonvolatile nanotube switch 1110" and volatile slave latch stage circuit 1106' corresponds to electrical connection 1040' in FIG. 11B. Power supply voltage $V_{DD}$ connections to the inverters in volatile master latch stage circuit 1104" (not shown) and volatile slave latch stage circuit 1106" (not shown) correspond to power supply connections $V_{DD}$ in FIG. 11B. Note that third embodiment nonvolatile register file stage circuit 1100" has no coupling circuit between nonvolatile register file stage circuit 1102" and nonvolatile nanotube switch 1110".

As illustrated in FIG. 14A, input node 1115" of volatile master latch stage circuit 1104" receives input signal $V_{IN}$ and drives CMOS transfer gate 1130", which is connected to and drives storage node 1135" formed by cross coupled CMOS inverters 1145" and 1150". Input signal $V_{IN}$ corresponds to $V_{IN}$ from logic 950 in FIG. 10. CMOS transfer gate 1130" uses both NMOS and PMOS devices instead of an NMOS-only transfer gate, for example, to ensure that both logic "1" and logic "0" states transition between full power supply and ground voltage levels by eliminating device threshold voltage drops. Clock CLK 1140, and complimentary clock CLKb 1140' are used to enable or block input signal $V_{IN}$ on input node 1115" from driving storage node 1135"; by turning CMOS transfer gate 1130" ON and OFF, thereby determining the logic storage state of cross coupled CMOS inverters 1145" and 1150". Note that all inverters are CMOS inverters unless otherwise specified. CMOS inverters include a PMOS pull-up device connected to a power supply, and a NMOS pull-down device connected to ground and operates as discussed in the reference by H. B. Bakoglu, "Circuits, Interconnections, and Packaging for VLSI", Addison-Wesley Publishing Company, Inc, 1990, pp. 152. Cross coupled inverters 1145" and 1150" drive storage node 1155" which is connected to CMOS transfer gate 1160". Clock CLK and complimentary clock CLKb are used to enable or block stored logic state node 1155" from driving master latch stage circuit 1106" input node 1120" by turning CMOS transfer gate 1160" ON and OFF.

As illustrated in FIG. 14A, input node 1120" of volatile slave latch stage circuit 1106", which is also the output node of master latch stage circuit 1104", drives inverter 1170". The output of inverter 1170" is output voltage $V_{OUT}$ on output node 1125", and also drives the input of inverter 1175". Output signal $V_{OUT}$ corresponds to $V_{OUT}$ in FIG. 10, which drives an input to logic 960. The output 1180" of inverter 1175" is connected to CMOS transfer gate 1185". Clock CLK, and complimentary clock CLKb are used to enable or block the presence of a feedback loop that cross couples inverters 1170" and 1175" when enabled. During normal high speed operation, clock CLK switches at high speed, 3 GHz clock rate, for example, for the 130 nm CMOS technology node. Inverter 1190" produces the complement CLKb or clock CLK. When storing data, CMOS transfer gate 1185" is ON and inverters 1170" and 1175" form a cross coupled storage device with node 1120" acting as a storage node. When CMOS transfer gate 1185" is OFF, then inverters 1170" and 1175" are not cross coupled and do not form a storage device. Slave latch stage circuit 1106" is directly coupled to nonvolatile nanotube switch 1110' by connector 1114".

As illustrated in FIG. 14A, nonvolatile nanotube switch 1110" is connected to power supply voltage $V_{EPR}$, which supplies erase, program, and restore pulse (or pulses) as required. Nonvolatile nanotube switch 1110' is also directly connected to volatile slave latch stage circuit 1106" by connector 1114".

Figure 14B:
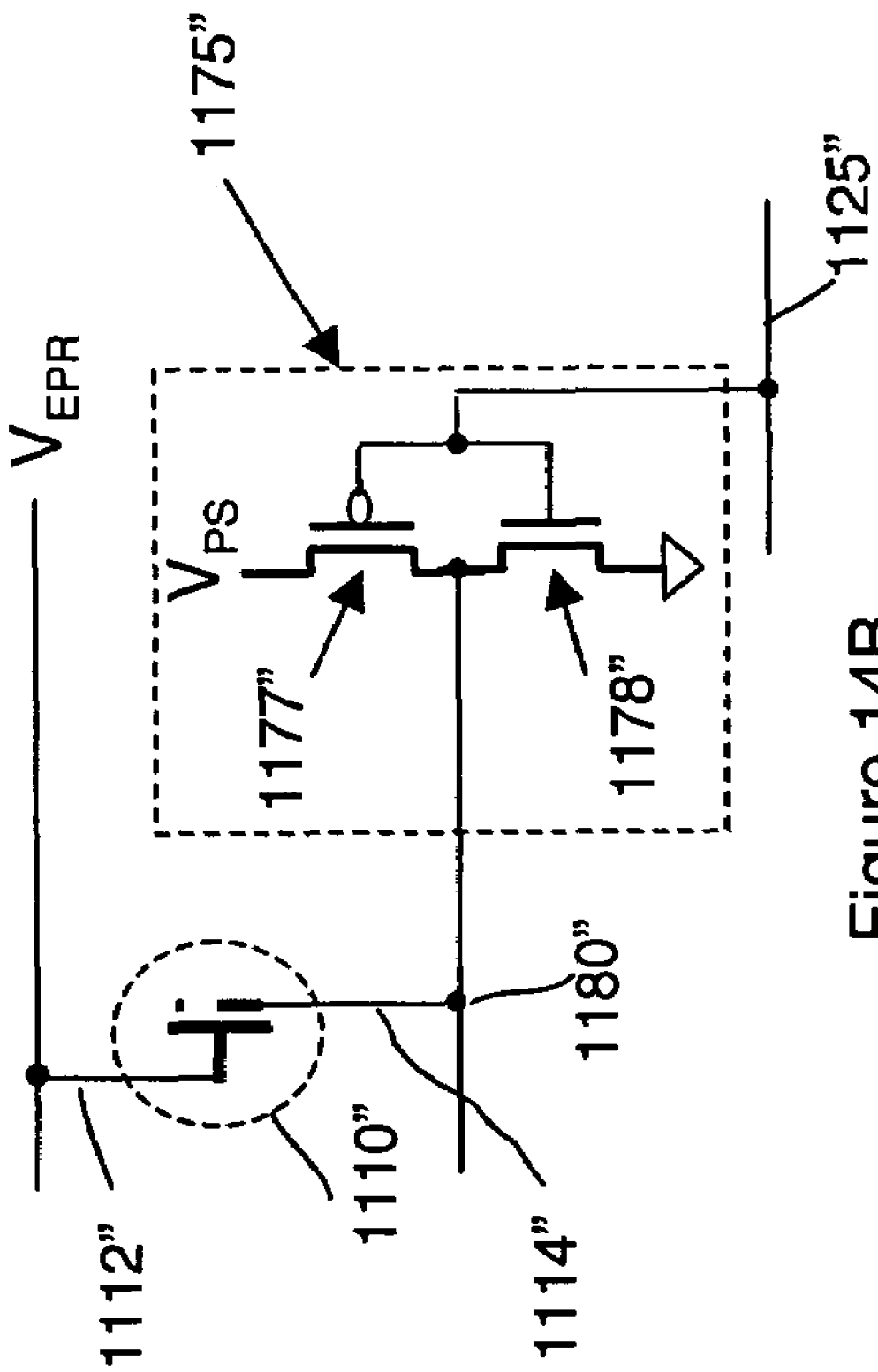
FIG. 14B is a circuit schematic representation of an inverter that forms part of a nonvolatile register file stage circuit, where the inverter controls the state of a common node which includes the inverter output and one terminal of a nonvolatile nanotube switch, and the inverter input is at the same voltage as the nonvolatile register file stage circuit output.

FIG. 14B illustrates nonvolatile nanotube switch 1110" direct connection to common node 1180" of volatile slave latch stage circuit 1106" by connector 1114" in more detail. Inverter 1175" is formed using pull-up PFET transistor 1177" with source connected to voltage source $V_{PS}$ and drain connected to common node 1180", and pull-down NFET transistor 1178" with source connected to ground and drain connected to common node 1180". The gate of PFET transistor 1177'" and the gate of NFET transistor 1178" are both connected to node 1125" as illustrated in FIG. 14A.

While in a normal run mode, all directly coupled nonvolatile nanotube switches 1110" are in an OFF (high resistance) state and $V_{EPR}$ may be at or near zero volts. Hence, volatile master latch stage circuit 1104" and volatile slave latch stage circuit 1106" operate in a normal (conventional) synchronized logic master/slave register run mode of operation at high speed clock rates, typically 3 GHz with $V_{DD}$=1.3 volts, for logic products fabricated using the 130 nm technology node.

In normal run mode, at the beginning of a clock cycle, clock CLK 1140" transitions from high to low voltage and remains at low voltage for the first half the clock cycle, and complimentary clock CLKb 1140'" transitions from low to high voltage and remains at high voltage for the first half of the clock cycle. CMOS transfer device 1130" turns ON coupling input node 1115" voltage $V_{IN}$ to storage node 1135". CMOS transfer device 1160" turns OFF and isolates the output of volatile master latch stage circuit 1104" from the input node 1120" of volatile slave latch stage circuit 1106". In normal run mode, clock CLK is connected to mode input 1192" of volatile slave latch stage circuit 1106", clock CLK is connected to CMOS transfer device 1185", and complimentary clock CLKb output of inverter 1190" is also connected to CMOS transfer device 1185", such that CMOS transfer device also turns OFF breaking the feedback path between the output 1180" of inverter 1175" and the input 1120" of inverter 1170" such that node 1120" does not act as a storage node. Voltage $V_{IN}$ may transition to a voltage value corresponding to the correct logic state any time prior to the end of the first half of the clock cycle, providing sufficient time remains for cross coupled inverters 1145" and 1150" to store the corresponding logic state on storage node 1155" prior to clock transition at the beginning of the second half of the clock cycle.

Referring to FIG. 14A, in normal run mode, clock CLK 1140" transitions from low to high voltage and remains at high voltage at the beginning of the second half of the clock cycle, and complimentary clock CLKb 1140'" transitions from high to low voltage and remains at low voltage for the second half of the clock cycle. CMOS transfer device 1130" turns OFF decoupling input node 1115" voltage $V_{IN}$ from storage node 1135", which remains in a state corresponding to input voltage $V_{IN}$ at the end of the first half of the clock cycle, and storage node 1155" remains in a complimentary state to storage node 1135". CMOS transfer device 1160" turns ON and transfers the state of storage node 1155" to input 1120" of inverter 1170" that drives output node 1125" to output voltage $V_{OUT}$, and also drives the input of inverter 1175". In normal run mode, clock CLK is connected to mode input 1192" of volatile slave latch stage circuit 1106", clock CLK is connected to CMOS transfer device 1185", and complimentary clock CLKb output of inverter 1190" is also connected to CMOS transfer device 1185", such that CMOS transfer device also turns ON forming the feedback path between the output 1180" of inverter 1175" and the input 1120" of inverter 1170" such that node 1120" acts as a storage node. With CMOS transfer device 1185" turned ON, output 1180" of inverter 1175" drives the input of inverter 1170" and stores the state of slave latch state stage circuit 1110" until the end of the second stage of the clock cycle.

In operation, nonvolatile nanotube switch 1110" is erased (turned OFF) prior to normal operation of nonvolatile register file stage circuit 1102". During an erase operation, input $V_{IN}$ illustrated in FIG. 14A is chosen such that node 1180" of volatile slave latch stage circuit 1106" is held at zero volts. Node 1180" is at zero volts when inverter 1175" input 1125", correspond to $V_{OUT}$, is at a positive voltage, 1.8 to 3 volts, for example. When input voltage 1125" is at a positive voltage, NFET 1178" is ON and PFET 1177" is OFF, such common node 1180" is at or near zero volts.

Figure 14C:
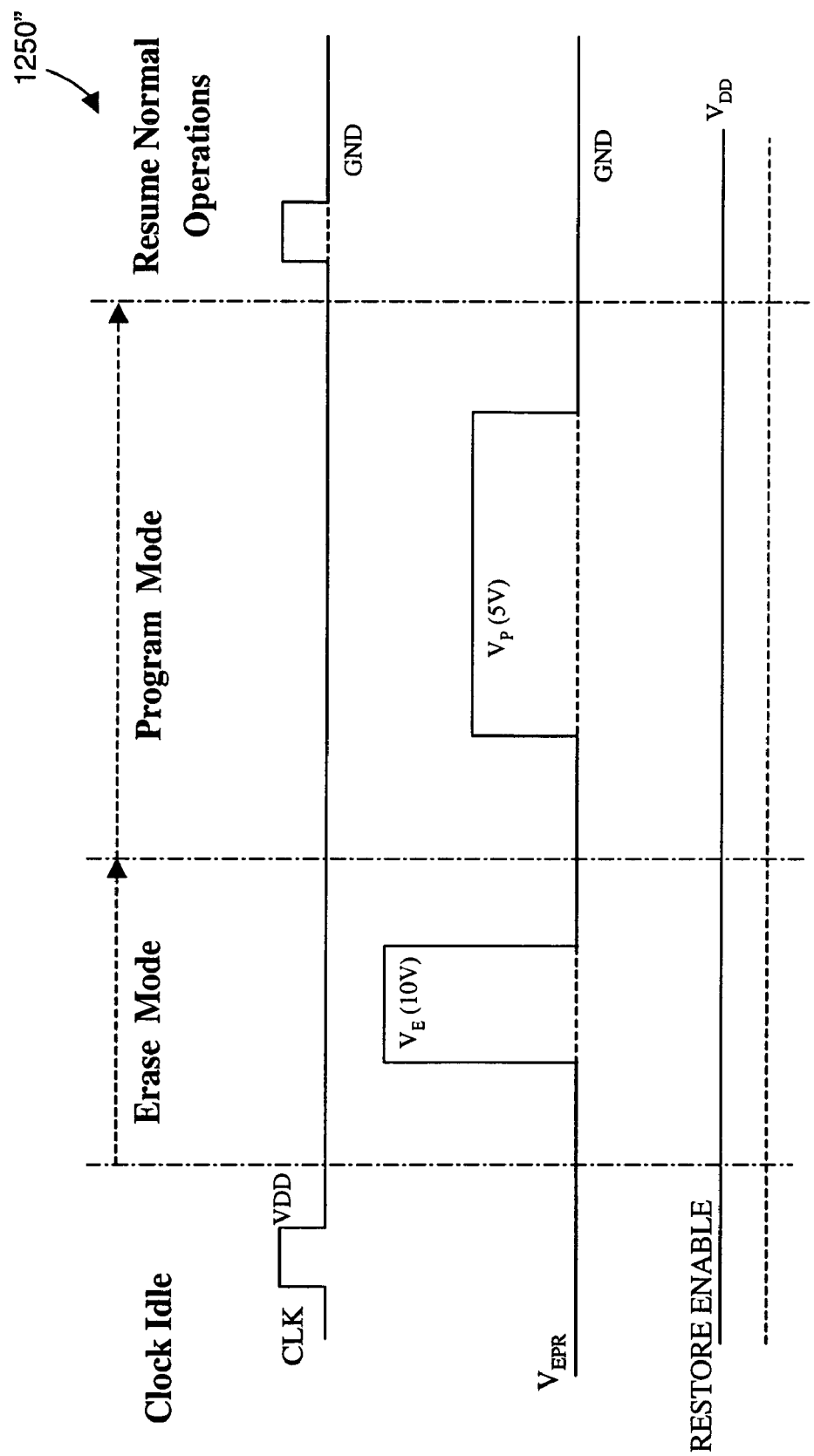
FIG. 14C is an illustration of operational waveforms for a power-ON to power-OFF transition in which a logic state (or data) on a volatile slave latch state circuit is transferred to a nonvolatile nanotube switch, then followed by power-OFF according to certain embodiments of the invention.

With NFET 1178" ON, a $V_{EPR}$ erase pulse transitions to 10 volts as illustrated in waveforms 1250" of FIG. 14C. If nonvolatile nanotube switch 1110" is an ON state with resistance of 1 MΩ, for example, and NFET 1178" is in an ON state with channel resistance of 200 KΩ, for example, then a voltage of 8.3 volts is applied across nanotube switch 1110" and a current of 8.3 uA flows through nanotube switch 1110" and NFET 1178" channel to ground. If nonvolatile nanotube switch 1110" erase conditions are 8 volts and 1-5 uA of current, for example, then nanotube switch 1110" transitions from and ON to an OFF state with a high resistance state of 10 MΩ to 1 GΩ or higher. $V_{EPR}$ erase pulse then transitions back to zero volts and the erase operation has ended. If nonvolatile nanotube switch 1110" is in OFF state at the start of an erase operation, it remains in the OFF state. After nonvolatile nanotube switches 1110", normal operation may begin.

In operation, when transitioning from normal run mode to zero power nonvolatile retention mode, the logic state of volatile slave latch stage circuit 1106" is transferred directly to nonvolatile nanotube switch 1110" before power is turned OFF. As illustrated in waveforms 1250" in FIG. 13B, while power remains ON, clock CLK is stopped in a low voltage state, with complimentary clock CLKb in a high voltage state, where a high voltage state is at $V_{DD}$ (1.3 to 1.8 volts, for example).

As illustrated in FIG. 14C, erase mode precedes a programming operation so that nonvolatile nanotube switch 1110" is in the OFF state. During the program operation, a $V_{EPR}$ program pulse transitions from zero to a high voltage of 5 volts. If the logic state of volatile slave latch stage circuit 1106" is such that $V_{OUT}$ is at a positive voltage in the range of 1.8 to 3.0 volts, for example, then common node 1125" is at a positive voltage, NFET 1178" is ON and PFET 1177" is OFF, then common node 1180" is at or near zero volts. Program voltage $V_P$ of 5 volts is connected to one terminal of switch 1110", and the other terminal of nonvolatile nanotube switch 1110" is connected by connector 1114" to common terminal 1180", which is connected to the drain of ON transistor NFET 1178" and through ON NFET 1178" transistor to ground. Initially, nonvolatile nanotube switch 1110" is OFF at high resistance, and the entire 5 volts appears across switch 1110'. Then, as switch 1110" transitions to the ON state, switch 1110" resistance transitions to approximately 1 MΩ, for example. If NFET 1178" has an ON resistance of 200 KΩ, for example, then a programming voltage of 4.2 volts is sustained across nonvolatile nanotube switch 1110" during the programming operation, and a current of 4.2 uA flows from the $V_{EPR}$ source through nonvolatile nanotube switch 1110" and NFET 1178" ON transistor to ground. If nonvolatile nanotube switch 1110" programming requires a sustained programming voltage of 3.5 to 4 volts across switch 1110", and a programming current of 1-4 uA through switch 1110", for example, then nonvolatile nanotube switch 1110" is programmed to a low resistance ON state of 1 MΩ, for example. $V_{EPR}$ program pulse then transitions to zero volts, and nonvolatile nanotube switch 1110" stores volatile slave latch stage circuit 1106" the logic state corresponding to $V_{OUT}$ positive as an ON state, and power may be removed.

If the logic state of volatile latch stage circuit 1106" is such that $V_{OUT}$ is at zero volts, for example, then common node 1125" is at zero volts, PFET 1177" is ON and NFET 1178" is OFF, then common node 1180" is at or near positive voltage $V_{PS}$, 3.0 volts for example. Program pulse transitions from 0 to $V_P$ of 5 volts as illustrated in FIG. 14C. With common node 1180" at 3 volts, the programming voltage applied across nonvolatile nanotube switch 1110" cannot exceed the required programming voltage 3.5 volts, for example, and nonvolatile nanotube switch 1110" remains in the erased OFF (high resistance) state. $V_{EPR}$ program pulse then transitions to zero volts, and nonvolatile nanotube switch 1110" stores volatile latch stage circuit 1106" the logic state corresponding to $V_{OUT}=0$ as an OFF state, and power may be removed.

Figure 14D:
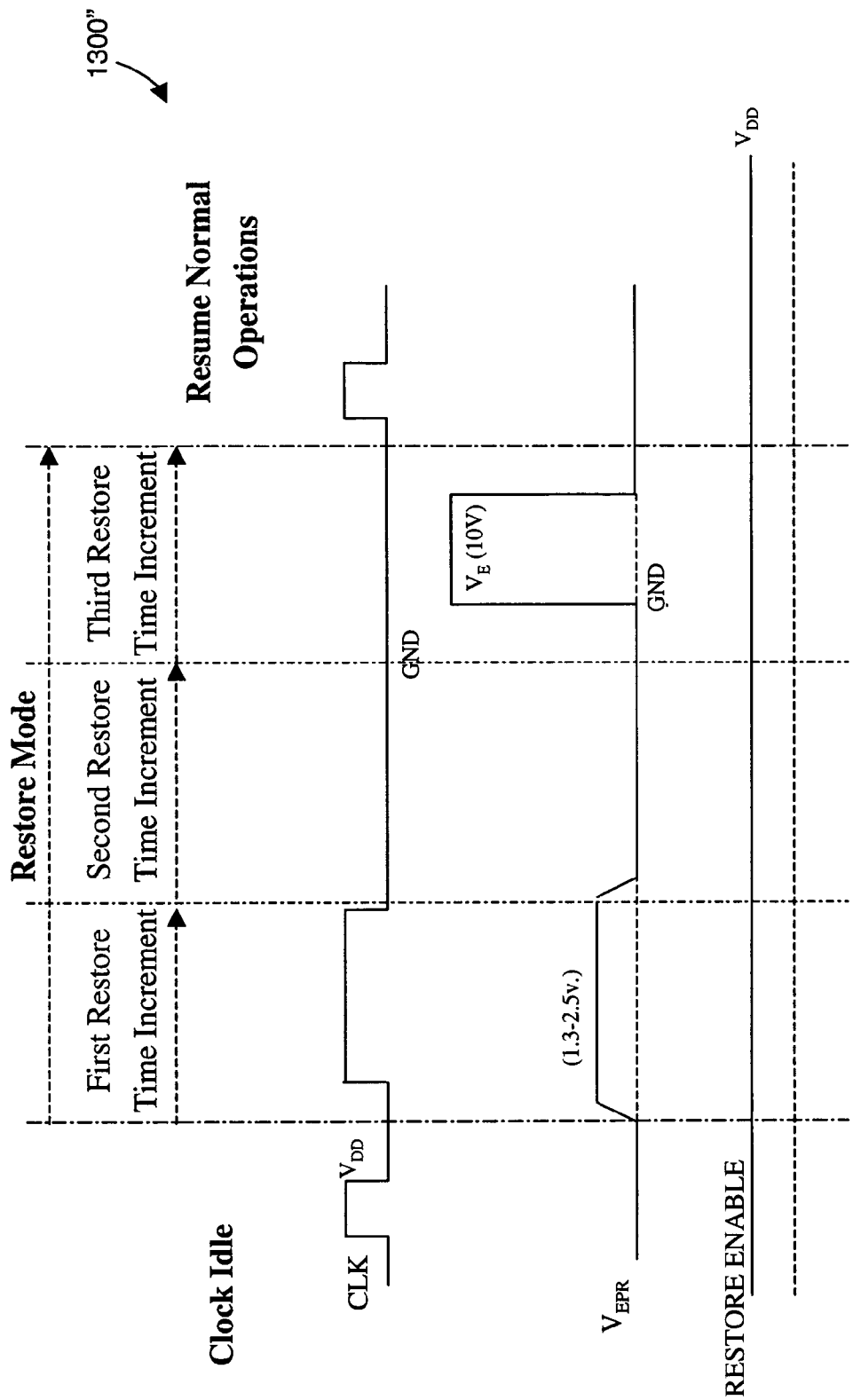
FIG. 14D is an illustration of operation waveforms for a power-OFF to power-ON transition in which a logic state (or data) stored on a nonvolatile nanotube switch is transferred to a volatile slave latch state circuit, then followed by normal clocked operation according to certain embodiments of the invention.

In operation, when transitioning from zero power nonvolatile retention mode to normal run mode, the state of nonvolatile nanotube switch 1110" must be transferred directly to volatile slave latch stage circuit 1106" after power supply $V_{DD}$ is restored, but before clock operation begins. A control circuit shown in FIG. 8B is powered before nonvolatile register file stage circuit 1102" and nonvolatile nanotube switch 1110". The control circuit provides/controls clock waveforms, restores enable waveforms, input waveforms, controls power supply transitions, and provides other waveforms required to carry out the nonvolatile retention mode to normal run mode transition, and to run nonvolatile register file stage circuit 1102" in a normal operating mode. As illustrated in FIG. 14D, restore is accomplished in three timing increments. In the first restore timing increment, common node 1180" that connects volatile slave latch stage circuit 1106" to nonvolatile nanotube switch 1110" using connector 1114" is set to a positive voltage, independent of the state (ON or OFF) of nonvolatile nanotube switch 1110". In the second restore timing increment, common node 1180" is discharged to a low voltage for nonvolatile nanotube switches 1110" in the ON state, or left at a high voltage for nonvolatile nanotube switches 1110" in the OFF state. In the third restore timing increment, an erase operation is carried out such that nanotube switches 1110" in the ON state transition to the OFF state; nanotube switches 1110" in the OFF state remain in the OFF state. At this time, normal nonvolatile register file stage circuit 1102" may begin.

In the first restore timing increment, $V_{EPR}$ transitions to a positive restore voltage $V_R$, 2.2 volts for example. Restore enable is set at voltage $V_{DD}$, CLK transitions high ($V_{DD}$ for example), and CLKb transitions low. $V_{IN}$ is held low, zero volts for example. Volatile master latch stage circuit 1104" drives and holds volatile slave latch stage circuit 1106" $V_{OUT}$ low, zero volts for example, which turns PFET 1177" ON and NFET 1178" OFF (FIG. 14B). Power supply voltage $V_{PS}=2.2$ V, for example, is applied to node 1180" through PFET 1177" for nonvolatile nanotube switches 1110" in the ON or OFF state. For nonvolatile nanotube switch 1110" in the OFF state, $V_{EPR}$ has negligible effect on common node 1180", and PFET 1177" drives common node 1180" to $V_{PS}=2.2$ volts; for non-volatile nanotube switch 1110" in the ON state, both $V_{EPR}$ and PFET 1177" apply 2.2 volts to common node 1180". Then, CLK transitions to ground and CLKb transitions to $V_{DD}$, CMOS pass gate 1160" turns OFF and input node 1120" of volatile slave latch stage circuit 1106" is decoupled from volatile master latch stage circuit 1104", but remains at 2.2 volts. Restore enable remains at VDD and CMOS transfer gate 1185" remains in the ON state, completing the feedback loop of volatile slave latch stage circuit 1106".

In the second restore timing increment, $V_{EPR}$ transitions from 2.2 volts to 0 volts. If nonvolatile nanotube switch 1110" is in the OFF state, then common node 1180" remains positive at 2.2 volts and $V_{OUT}$ remains at or near zero volts; however, if nonvolatile nanotube switch 1110" is in the ON state, then common node 1180" voltage is reduced. If PFET 1177" ON channel resistance is 1.75 MΩ and the ON resistance of nonvolatile nanotube switch 1110" is 1 MΩ, for example, then common node 1180" voltage drops from 2.2 volts to 0.8 volts, and volatile slave latch stage circuit 1106" switches to the opposite state, with $V_{OUT}$ positive, at $V_{DD}$ for example. PFET 1177" turns OFF and NFET 1178" turns ON.

In the third restore timing increment, an erase operation is carried out to ensure that nonvolatile nanotube switch 1110" is in the OFF state. Erase voltage $V_{EPR}$ is ramped up from zero to $V_E$ or approximately 10 volts, for example. If nonvolatile nanotube switch 1110" is in an ON state of 1 MΩ, for example, and NFET 1178" is in an ON state of 200 KΩ, for example, then current flows through nonvolatile nanotube switch 1110" and NFET 1178" in series, and approximately 8.3 volts is applied across nonvolatile switch 1110" with a current of approximately 8.3 uA. For nonvolatile nanotube switch 1110" erase conditions of at least 8 volts, and current in the 1 to 8 uA range, nonvolatile nanotube switch 1110" switches to an OFF state. If nonvolatile nanotube switch 1110" is in the OFF state, 1 GΩ, for example, then essentially all of the 10 volts erase pulse appears across the nonvolatile nanotube switch 1110", and switch 1110" remains in the OFF state. At this time, the restore operation is complete, and normal operation of nonvolatile register file stage circuit 1102" may begin.

Meeting Higher Voltage Erase and Programming Requirements For Non-Volatile Nanotube Switches FET devices used in volatile master latch stage circuit 1104 and volatile slave latch stage circuit 1106, which are part of nonvolatile register file stage circuit 1100 shown in FIG. 12A, operate at low scaled voltages such as $V_{DD}=1.3$ volts, optimized for high speed operation at 3 GHz clock rate for a 130 nm technology node, for example. Coupling circuit 1108 isolates these latch circuits from the relatively high voltage requirement of nonvolatile nanotube switch 1110.

As discussed further above with respect to nonvolatile nanotube switch 1110 operation described in FIG. 12B, in certain embodiments, erase and program voltages applied to node 1112 of nonvolatile nanotube switch 1110 are approximately 10 volts during erase operations, and approximately 5 volts during programming operations. Process engineering and circuit design that enables relatively high voltage operation in semiconductor chips are described in U.S. Pat. No. 5,818,748, to Bertin et al. Transistors used in high voltage circuits require special semiconductor structures to accommodate them, typically using well and drain engineering, thicker gate oxides, and greater FET channel lengths to accommodate high voltage circuits.

Figure 15:
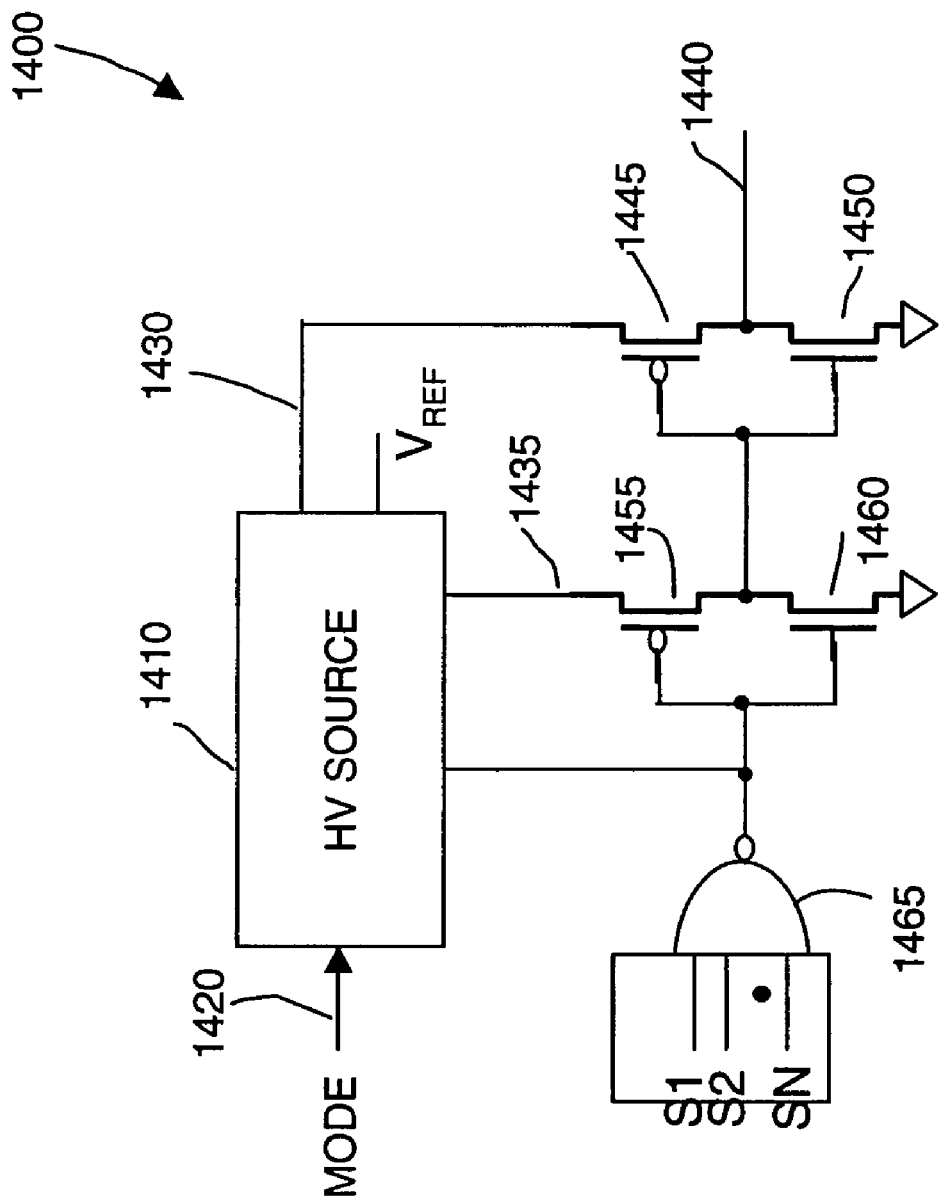
FIG. 15 is a prior art schematic representation of a high voltage power supply and decode circuit.

FIG. 15 illustrates prior art high voltage circuit 1400 as illustrated in U.S. Pat. No. 5,818,748 capable of supplying a voltage of up to approximately 12 volts. High voltage circuit 1400 includes high voltage source 1410, which may be generated on-chip or may supplied from off-chip. On-chip high voltage sources may be designed and high voltages distributed on-chip as described in U.S. Pat. No. 6,346,846, to Bertin et al. The electrical characteristics of programmable off-chip power supplies are described in "Basics of Power Supplies—Use of the HP E3631A Programmable Power Supply." Adjustable Off-chip power supplies can be operate over a wide range of voltages, 1 volt to 12 volts, for example, and voltages can be adjusted in less than 1 millisecond, for example.

Mode selection input 1420 determines if outputs 1430 and 1435 supply an erase voltage of approximately 10 volts, a program voltage of approximately 5 volts, or a restore voltage in the range of 1.3 to 2.5 volts, for example. The restore voltage may be supplied from the $V_{DD}$ supply instead of high voltage circuit 1400.

Output conductor 1440 supplies voltage to multiple non-volatile nanotube switches 1110, 1110', and 1110" using an output stage including high voltage compatible PMOS 1445 and high voltage compatible NMOS 1450. High voltage compatible PMOS 1445 is connected to high voltage source 1410 by conductor 1430 and high voltage compatible NMOS 1450 is connected to ground. $V_{REF}$ voltages are zero volts (ground). A pre-output stage comprising high voltage compatible PMOS 1455 and high voltage compatible NMOS 1460 drives the input of the output stage. High voltage compatible PMOS 1455 is connected to high voltage source 1410 by conductor 1455 and high voltage compatible NMOS 1460 is connected to ground. The input of the pre-output stage is controlled by the output of decoder 1465. Input signals $S_1$-$S_N$ determine which output conductor 1440 will be selected. The output of decoder 1465 connects to high voltage source 1410.

Figure 16:
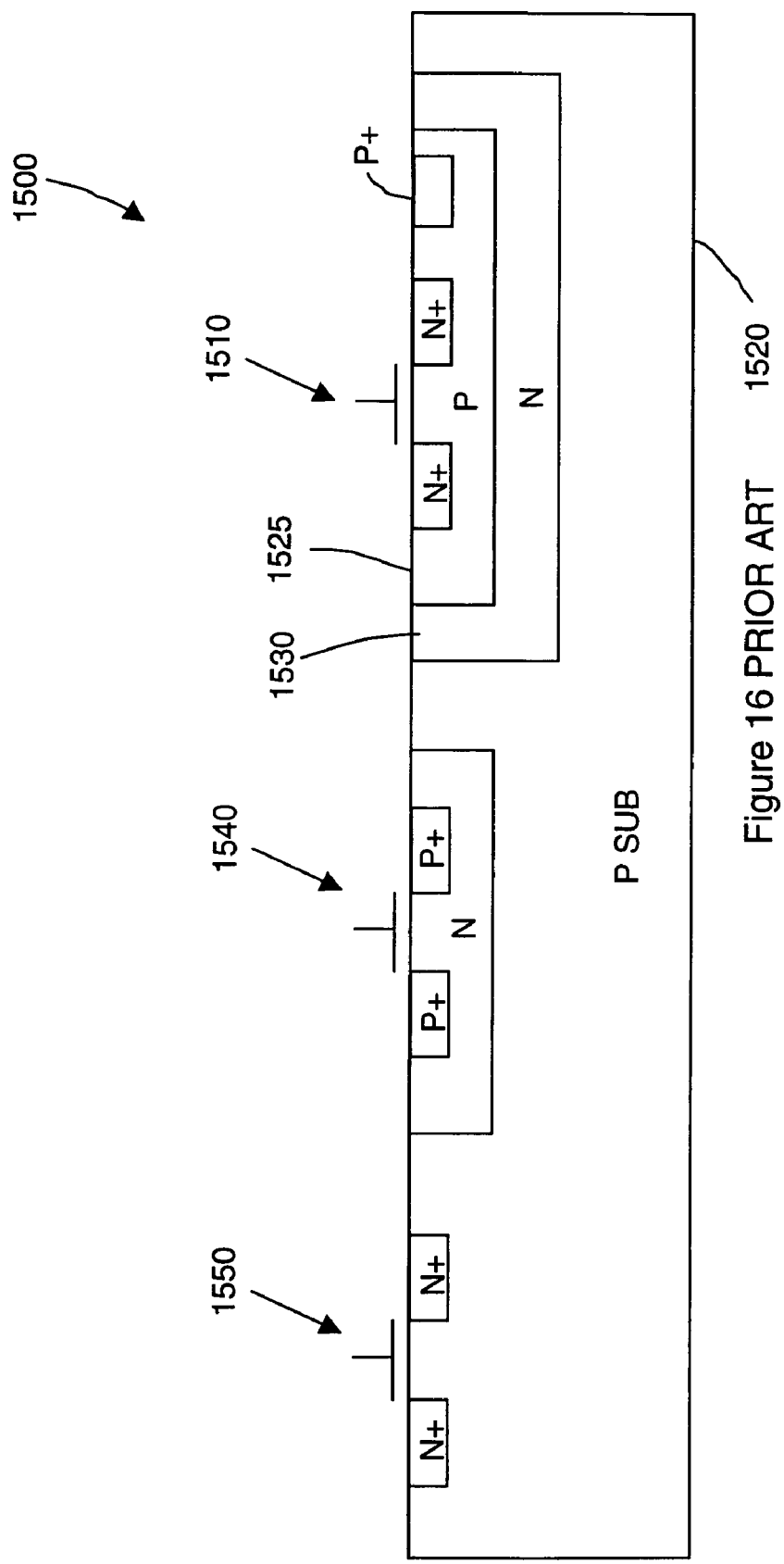
FIG. 16 is a prior art schematic representation of a high voltage compatible semiconductor technology.

FIG. 16 illustrates prior art process engineered structures 1500 described in U.S. Pat. No. 5,818,748, to Bertin et al., such as triple well driver transistor 1510 structure in P-doped substrate 1520, corresponding to high voltage compatible NMOS 1450 and 1460 transistors illustrated in FIG. 14. P-well 1525 and N-well 1530 are introduced to tolerate undershoots below ground level and also provide for below-ground voltage reference levels if desired. PMOS structure 1540 and NMOS structure 1550 are typical of CMOS transistors.

High voltage circuit 1400 layouts as described in U.S. Pat. No. 5,818,748 result in output conductor 1440 spacing with corresponding adjacent conductors of approximately two times the spacing when using low voltage circuits. For this invention, where nonvolatile nanotube switches 1110, 1110', and 1110" are used as shadow devices in register files, such output conductor 1440 spacing provide greater density than is required by this invention.

Figure 17:
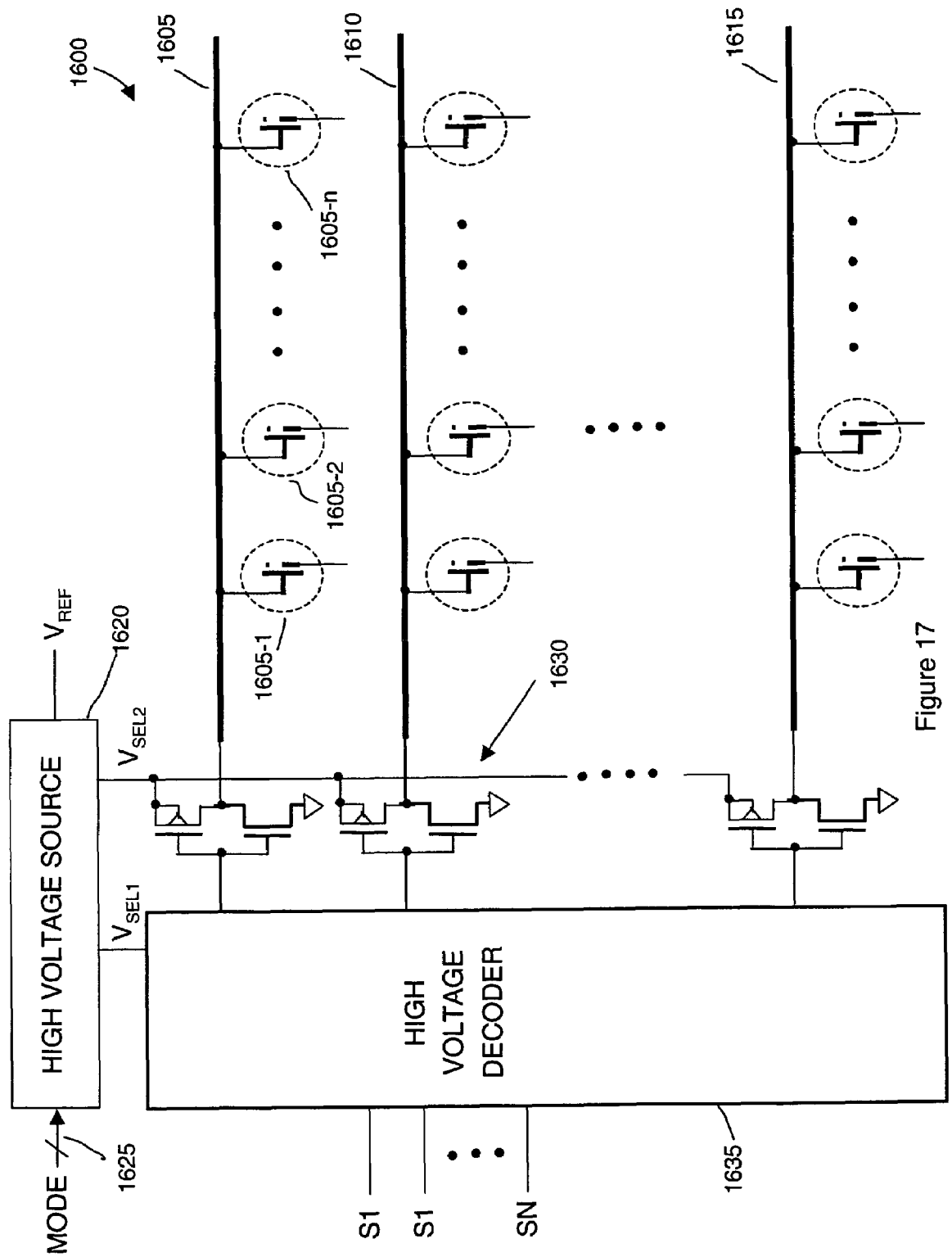
FIG. 17 is a schematic representation of a high voltage decode and distribution system for nonvolatile nanotube switches according to certain embodiments of the invention.

FIG. 17 illustrates power source 1600 designed to supply multiple output conductors 1605, 1610, and 1615 corresponding to output conductor 1440 in FIG. 15. Each output conductor has multiple nanotube switches 1605-1, 1605-2, to 1605-n, for example. $V_{REF}$ is zero volts. High voltage source 1620, mode selection input 1625, output stage 1630, and decoder 1635 correspond to high voltage source 1410, mode selection input 1420, output stage comprising PMOS 1445 and NMOS 1450, and decoder 1465, respectively, illustrated in FIG. 15. Power source 1600 may be used with register files stage circuits 1110, 1110', and 1110".

Transistors used in coupling circuit 1108 and 1108' illustrated in FIGS. 12A and 13A may be exposed to higher voltages. During the erase operation, according to certain embodiments of the invention such as illustrated in FIG. 12A, NMOS 1220 turns ON prior to the application of erase voltage $V_{EPR}$ of 10 volts to node 1112, with an FET channel resistance typically at least 5x lower than the resistance of nonvolatile nanotube switch 1110 in the ON state. For an erase voltage of 10 volts, for example, the drain of NMOS 1220 is at approximately 2 volts. If nanotube switch 1110 is already erased (in the OFF state), NMOS 1220 drain voltage will be near zero.

During a program operation, according to certain embodiments of the invention, a program voltage $V_{EPR}$ of 5 volts is applied to node 1112 of nonvolatile nanotube switch 1110 illustrated in FIG. 12A. If nonvolatile nanotube switch 1110 turns ON, then a voltage approaching 5 volts may be applied to common node 1116. The drain NMOS 1220 which is OFF, the source of PMOS transistor 1240, and nodes of NMOS 1230 and 1225 may all approach 5 volts. Therefore, NMOS and PMOS devices that form coupling circuit 1108 may require process engineering to tolerate up to 5 volts between terminals.

The invention may be embodied in other specific forms without departing from the spirit or essential characteristics thereof. The present embodiments are therefore to be considered in respects as illustrative and not restrictive.

What is claimed is:

1. A non-volatile memory cell comprising:
   a volatile storage device that stores a corresponding logic state in response to electrical stimulus; and
   a shadow memory device coupled to the volatile storage device so as to receive and store the corresponding logic state in response to electrical stimulus, said shadow memory device including a non-volatile two-terminal nanotube switch, the two-terminal nanotube switch comprising first and second terminals and a nanotube article arranged in fixed positional relation to each of the first and second terminals and overlapping at least a portion of each of the first and second terminals, the two-terminal nanotube switch storing the corresponding logic state of the shadow memory device in response to electrical stimulus applied only to at least one of the first and second terminals.

2. The non-volatile memory cell of claim 1, further comprising a coupling circuit capable of transferring the corresponding logic state of the volatile storage device to the shadow memory device in response to electrical stimulus, and further capable of transferring a logic state of the shadow memory device to the volatile storage device in response to electrical stimulus.

3. The non-volatile memory cell of claim 1, further comprising a coupling circuit including:
   a program circuit providing an electrical pathway between the volatile storage device and the shadow memory device and responsive to a program signal to transfer a corresponding logic state of the volatile storage device to the shadow memory device; and
   a restore circuit providing an electrical pathway between the shadow memory device and the volatile storage device and responsive to a restore signal to transfer a logic state of the shadow memory device to the volatile storage device.

4. The non-volatile memory cell of claim 1, further comprising a coupling circuit including: an erase circuit in electrical communication with the shadow memory device and responsive to an erase signal to erase a logic state of the shadow memory device.

5. The non-volatile memory cell of claim 1, wherein the first terminal of the two-terminal nanotube switch is in electrical communication with an output node of the volatile storage device, and wherein the second terminal of the two-terminal nanotube switch is in electrical communication with a program/erase/read line.

6. The non-volatile memory cell of claim 1, further comprising a controller in electrical communication with the volatile storage device and capable of monitoring a level of power to the volatile storage device.

7. The non-volatile memory cell of claim 6, said controller capable of applying electrical stimulus to the shadow memory device in response to a loss of power to the volatile storage device, said electrical stimulus transferring the logic state of the volatile storage device to the shadow memory device.

8. The non-volatile memory cell of claim 6, said controller capable of applying electrical stimulus to the shadow memory device in response to an increase of power to the volatile storage device, said electrical stimulus transferring the logic state of the shadow memory device to the volatile storage device.

9. The non-volatile memory cell of claim 1, wherein the state stored by the non-volatile two-terminal nanotube switch is characterized by the resistance of an electrical pathway in the two-terminal nanotube switch.

10. The non-volatile memory cell of claim 1, further comprising a master latch stage capable of receiving a voltage and outputting said voltage to the volatile storage device, said voltage corresponding to a logic state.

11. The non-volatile memory cell of claim 10, wherein a random logic stage produces the voltage corresponding to the logic state.

12. The non-volatile memory cell of claim 10, wherein an onboard cache produces the voltage corresponding to the logic state.

13. A non-volatile memory cell comprising:
a volatile storage device that stores a corresponding logic state in response to electrical stimulus; and
a shadow memory device coupled to the volatile storage device so as to receive and store the corresponding logic state in response to electrical stimulus, said shadow memory device including a single non-volatile two-terminal nanotube switch, the single two-terminal nanotube switch comprising first and second terminals and a nanotube article arranged to overlap at least a portion of each of the first and second terminals, the single two-terminal nanotube switch storing the corresponding logic state of the shadow memory device in response to electrical stimulus applied only to at least one of the first and second terminals.

14. The non-volatile memory cell of claim 13, further comprising a coupling circuit capable of transferring the corresponding logic state of the volatile storage device to the shadow memory device in response to electrical stimulus, and further capable of transferring a logic state of the shadow memory device to the volatile storage device in response to electrical stimulus.

15. The non-volatile memory cell of claim 13, further comprising a coupling circuit including:
a program circuit providing an electrical pathway between the volatile storage device and the shadow memory device and responsive to a program signal to transfer a corresponding logic state of the volatile storage device to the shadow memory device; and
a restore circuit providing an electrical pathway between the shadow memory device and the volatile storage device and responsive to a restore signal to transfer a logic state of the shadow memory device to the volatile storage device.

16. The non-volatile memory cell of claim 13, further comprising a coupling circuit including an erase circuit in electrical communication with the shadow memory device and responsive to an erase signal to erase a logic state of the shadow memory device.

17. The non-volatile memory cell of claim 13, wherein the first terminal of the single two-terminal nanotube switch is in electrical communication with an output node of the volatile storage device, and wherein the second terminal of the single two-terminal nanotube switch is in electrical communication with a program/erase/read line.

18. The non-volatile memory cell of claim 13, further comprising a controller in electrical communication with the volatile storage device and capable of monitoring a level of power to the volatile storage device.

19. The non-volatile memory cell of claim 18, said controller capable of applying electrical stimulus to the shadow memory device in response to a loss of power to the volatile storage device, said electrical stimulus transferring the logic state of the volatile storage device to the shadow memory device.

20. The non-volatile memory cell of claim 18, said controller capable of applying electrical stimulus to the shadow memory device in response to an increase of power to the volatile storage device, said electrical stimulus transferring the logic state of the shadow memory device to the volatile storage device.

21. The non-volatile memory cell of claim 13, wherein the state stored by the single non-volatile two-terminal nanotube switch is characterized by the resistance of an electrical pathway in the single two-terminal nanotube switch.

22. The non-volatile memory cell of claim 13, further comprising a master latch stage capable of receiving a voltage and outputting said voltage to the volatile storage device, said voltage corresponding to a logic state.

23. The non-volatile memory cell of claim 22, wherein a random logic stage produces the voltage corresponding to the logic state.

24. The non-volatile memory cell of claim 22, wherein an onboard cache produces the voltage corresponding to the logic state.

* * * * *

UNITED STATES PATENT AND TRADEMARK OFFICE
CERTIFICATE OF CORRECTION

PATENT NO. : 7,394,687 B2
APPLICATION NO. : 11/280599
DATED : July 1, 2008
INVENTOR(S) : Claude L. Bertin et al.

It is certified that error appears in the above-identified patent and that said Letters Patent is hereby corrected as shown below:

On the Letters Patent Cover Sheet:

On Column 1, Item (75) - Inventors, the name of Inventor Thomas Ruckes should read as follows:

Thomas "Ruckes" -- Rueckes --

Signed and Sealed this

Seventh Day of October, 2008

JON W. DUDAS
*Director of the United States Patent and Trademark Office*